(12) United States Patent
Morikawa

(10) Patent No.: US 12,081,893 B2
(45) Date of Patent: Sep. 3, 2024

(54) IMAGE SENSOR HAVING MULTIPLE VERTICAL SIGNAL LINES PER COLUMN IN MULTIPLE LAMINATED WIRING LAYERS

(71) Applicant: C/O SONY SEMICONDUCTOR SOLUTIONS CORPORATION, Kanagawa (JP)

(72) Inventor: Takafumi Morikawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 759 days.

(21) Appl. No.: 17/250,240

(22) PCT Filed: May 14, 2019

(86) PCT No.: PCT/JP2019/019102
§ 371 (c)(1),
(2) Date: Dec. 21, 2020

(87) PCT Pub. No.: WO2020/003783
PCT Pub. Date: Jan. 2, 2020

(65) Prior Publication Data
US 2021/0127081 A1 Apr. 29, 2021

(30) Foreign Application Priority Data
Jun. 29, 2018 (JP) .................................. 2018-124044

(51) Int. Cl.
*H04N 25/78* (2023.01)
*H01L 27/146* (2006.01)
(52) U.S. Cl.
CPC ....... *H04N 25/78* (2023.01); *H01L 27/14636* (2013.01)

(58) Field of Classification Search
CPC ...... H04N 25/766; H04N 25/78; H04N 25/79; H01L 27/14603; H01L 27/14636; H01L 27/146
See application file for complete search history.

(56) References Cited

U.S. PATENT DOCUMENTS

2009/0034314 A1* 2/2009 Hirose ................ H10B 12/482
365/72
2013/0182163 A1* 7/2013 Kobayashi ........ H01L 27/14645
348/302
(Continued)

FOREIGN PATENT DOCUMENTS

JP 2006-313846 A 11/2006
JP 2008-028945 A 2/2008
(Continued)

OTHER PUBLICATIONS

Suzuki, et al., "A 1/1.7-inch 20Mpixel Back-illuminated stacked CMOS image sensor for new imaging applications", 2015 IEEE International Solid-State Circuits Conference—(ISSCC) Digest of Technical Papers, Mar. 19, 2015, 6 Pages.
(Continued)

*Primary Examiner* — Paul M Berardesca
(74) *Attorney, Agent, or Firm* — CHIP LAW GROUP

(57) ABSTRACT

An image sensor includes a pixel array unit in which pixels are arranged in a matrix, and multiple vertical signal lines provided in pixel column units. The multiple vertical signal lines provided in pixel column units are arranged in multiple wiring layers laminated on the pixel, and are arranged so that orthogonal projections of the vertical signal lines on the multiple wiring layers overlap. The wiring layer is provided with a connection portion for connecting the vertical signal line corresponding to the pixel to the pixel. A pixel signal is taken out from the vertical signal line through the connection portion.

10 Claims, 42 Drawing Sheets

(56) References Cited

U.S. PATENT DOCUMENTS

| 2014/0009651 A1* | 1/2014 | Totsuka | ............ H01L 27/14603 |
| | | | 348/294 |
| 2017/0125464 A1* | 5/2017 | Abe | .................. H01L 27/14634 |
| 2019/0165014 A1* | 5/2019 | Wada | .................... H04N 25/778 |
| 2019/0165022 A1* | 5/2019 | Wada | ................ H01L 27/14603 |

FOREIGN PATENT DOCUMENTS

| JP | 2010-245955 A | 10/2010 |
| JP | 2011-171749 A | 9/2011 |

OTHER PUBLICATIONS

International Search Report and Written Opinion of PCT Application No. PCT/JP2019/019102, dated Aug. 6, 2019, 06 pages of ISRWO.

* cited by examiner

FIG. 21

|  |  | \multicolumn{4}{c}{NUMBER OF WIRES THAT CAN BE ARRANGED AT MINIMUM PITCH} |
|---|---|---|---|---|---|
|  |  | 3 | 4 | 5 | 6 |
| NUMBER OF LAYERS OF RELAY LINE AND SIGNAL LINE | 1 | 2 | 2 | 2 | 2 |
|  | 2 | 4 | 4 | 4 | 4 |
|  | 3 | 6 | 6 | 6 | 6 |
|  | 4 | 7 | 7 | 7 | 7 |
|  | 5 | 8 | 8 | 8 | 8 |
|  | 6 | 9 | 9 | 9 | 9 |

FIG. 30

|  |  | NUMBER OF WIRES THAT CAN BE ARRANGED AT MINIMUM PITCH | | | |
|---|---|---|---|---|---|
|  |  | 3 | 4 | 5 | 6 |
| NUMBER OF LAYERS OF RELAY LINE AND SIGNAL LINE | 1 | — | — | — | — |
|  | 2 | 3 | 4 | 5 | 6 |
|  | 3 | 5 | 7 | 9 | 11 |
|  | 4 | 5 | 7 | 9 | 11 |
|  | 5 | 7 | 9 | 11 | 13 |
|  | 6 | 7 | 9 | 11 | 13 |

FIG. 35

|  |  | \multicolumn{4}{c}{NUMBER OF WIRES THAT CAN BE ARRANGED AT MINIMUM PITCH} |
|---|---|---|---|---|---|
|  |  | 3 | 4 | 5 | 6 |
| NUMBER OF LAYERS OF RELAY LINE AND SIGNAL LINE | 1 | – | – | – | – |
|  | 2 | – | – | – | – |
|  | 3 | – | 4 | 4 | 6 |
|  | 4 | – | 6 | 6 | 9 |
|  | 5 | – | 8 | 8 | 12 |
|  | 6 | – | 10 | 10 | 15 |

FIG. 38

|  | | NUMBER OF WIRES THAT CAN BE ARRANGED AT MINIMUM PITCH | | | |
|---|---|---|---|---|---|
|  |  | 3 | 4 | 5 | 6 |
| NUMBER OF LAYERS OF RELAY LINE AND SIGNAL LINE | 1 | — | — | — | — |
|  | 2 | — | — | — | 4 |
|  | 3 | — | — | — | 8 |
|  | 4 | — | — | — | 12 |
|  | 5 | — | — | — | 16 |
|  | 6 | — | — | — | 20 |

IMAGE SENSOR HAVING MULTIPLE VERTICAL SIGNAL LINES PER COLUMN IN MULTIPLE LAMINATED WIRING LAYERS

CROSS REFERENCE TO RELATED APPLICATIONS

This application is a U.S. National Phase of International Patent Application No. PCT/JP2019/019102 filed on May 14, 2019, which claims priority benefit of Japanese Patent Application No. JP 2018-124044 filed in the Japan Patent Office on Jun. 29, 2018. Each of the above-referenced applications is hereby incorporated herein by reference in its entirety.

TECHNICAL FIELD

The present disclosure relates to an image sensor, an imaging device, and an electronic device.

BACKGROUND ART

In an electronic device having an imaging function, an imaging device including an image sensor such as a complementary metal oxide semiconductor (CMOS) sensor is used. The image sensor has a pixel including a combination of a photoelectric conversion unit including a photodiode (PD) or the like, a floating diffusion region (FD) to which photoelectrically converted charges are transferred, and multiple transistors. Then, an image is created on the basis of signals output from multiple pixels arranged in a two-dimensional matrix. The signals output from the pixels are, for example, analog-to-digital (A/D) converted in parallel by multiple A/D converters arranged for each pixel column, and output as digital signals.

In recent years, for example, in high-end display devices, a frame rate of 120 fps has become common. Additionally, in order to achieve a super slow function, an image sensor is also required to be capable of imaging at a high frame rate such as 960 fps. Since so-called focal plane distortion is also reduced by imaging at a high frame rate, the demand for imaging at a high frame rate is increasing also in the imaging of sports scenes where it is required to image a fast-moving subject as a still image. For this reason, multiple vertical signal lines for reading out signals from pixels have been arranged for each pixel column, for example (see Patent Document 1 and Non-Patent Document 1, for example). Additionally, it has also been proposed to arrange vertical signal lines in each of multiple wiring layers laminated on a pixel in order to arrange a large number of vertical signal lines in each pixel column (see Non-Patent Document 1, for example).

CITATION LIST

Patent Document

Patent Document 1: Japanese Patent Application Laid-Open No. 2010-245955

Non-Patent Document

Non-Patent Document 1: A 1/1.7-inch 20 Mpixel Back-illuminated stacked CMOS image sensor for new imaging applications, 2015 IEEE International Solid-State Circuits Conference—(ISSCC) Digest of Technical Papers

SUMMARY OF THE INVENTION

Problems to be Solved by the Invention

In a configuration in which vertical signal lines are arranged in each of multiple wiring layers laminated on a pixel, the vertical signal line and the pixel are usually connected through a via provided in the wiring layer. In a case of arranging vertical signal lines and vias according to a design rule, it is necessary to connect the via to each vertical signal line. Hence, the vertical signal lines cannot be arranged so that their orthogonal projections overlap in multiple wiring layers. However, in order to increase the number of vertical signal lines and increase the frame rate, it is preferable to enable unhindered electrical connection between the vertical signal lines and pixels even if the vertical signal lines are arranged so that their orthogonal projections overlap in multiple wiring layers.

Against this background, the present disclosure aims to provide an image sensor, an imaging device including the image sensor, and an electronic device including the imaging device, the image sensor enabling unhindered electrical connection between a vertical signal line and a pixel even if the vertical signal lines are arranged so that their orthogonal projections overlap in multiple wiring layers.

Solutions to Problems

An image sensor according to the present disclosure for achieving the above object is an image sensor including:
a pixel array unit in which pixels are arranged in a matrix; and
multiple vertical signal lines provided in pixel column units, in which
the multiple vertical signal lines provided in pixel column units are arranged in multiple wiring layers laminated on the pixel, and are arranged so that orthogonal projections of the vertical signal lines on the multiple wiring layers overlap,
the wiring layer is provided with a connection portion for connecting the vertical signal line corresponding to the pixel to the pixel, and
a pixel signal is taken out from the vertical signal line through the connection portion.

An imaging device according to the present disclosure for achieving the above object is
an imaging device including
an image sensor including:
a pixel array unit in which pixels are arranged in a matrix; and
multiple vertical signal lines provided in pixel column units, in which
the multiple vertical signal lines provided in pixel column units are arranged in multiple wiring layers laminated on the pixel, and are arranged so that orthogonal projections of the vertical signal lines on the multiple wiring layers overlap,
the wiring layer is provided with a connection portion for connecting the vertical signal line corresponding to the pixel to the pixel, and
a pixel signal is taken out from the vertical signal line through the connection portion.

An electronic device according to the present disclosure for achieving the above object is
an electronic device including
an image sensor including:
a pixel array unit in which pixels are arranged in a matrix; and
multiple vertical signal lines provided in pixel column units, in which
the multiple vertical signal lines provided in pixel column units are arranged in multiple wiring layers laminated on the pixel, and are arranged so that orthogonal projections of the vertical signal lines on the multiple wiring layers overlap,
the wiring layer is provided with a connection portion for connecting the vertical signal line corresponding to the pixel to the pixel, and
a pixel signal is taken out from the vertical signal line through the connection portion.

BRIEF DESCRIPTION OF DRAWINGS

FIG. 21 is a table for describing the relationship between the number of layers in the wiring layers used in the image sensor according to the first embodiment and the number of wires that can be arranged.

FIG. 30 is a table for describing the relationship between the number of layers in the wiring layers used in the image sensor according to the second embodiment and the number of wires that can be arranged.

FIG. 35 is a table for describing the relationship between the number of layers in the wiring layers used in the image sensor according to the fourth embodiment and the number of wires that can be arranged.

FIG. 38 is a table for describing the relationship between the number of layers in the wiring layers used in the image sensor according to the fifth embodiment and the number of wires that can be arranged.

MODE FOR CARRYING OUT THE INVENTION

Figure 1:
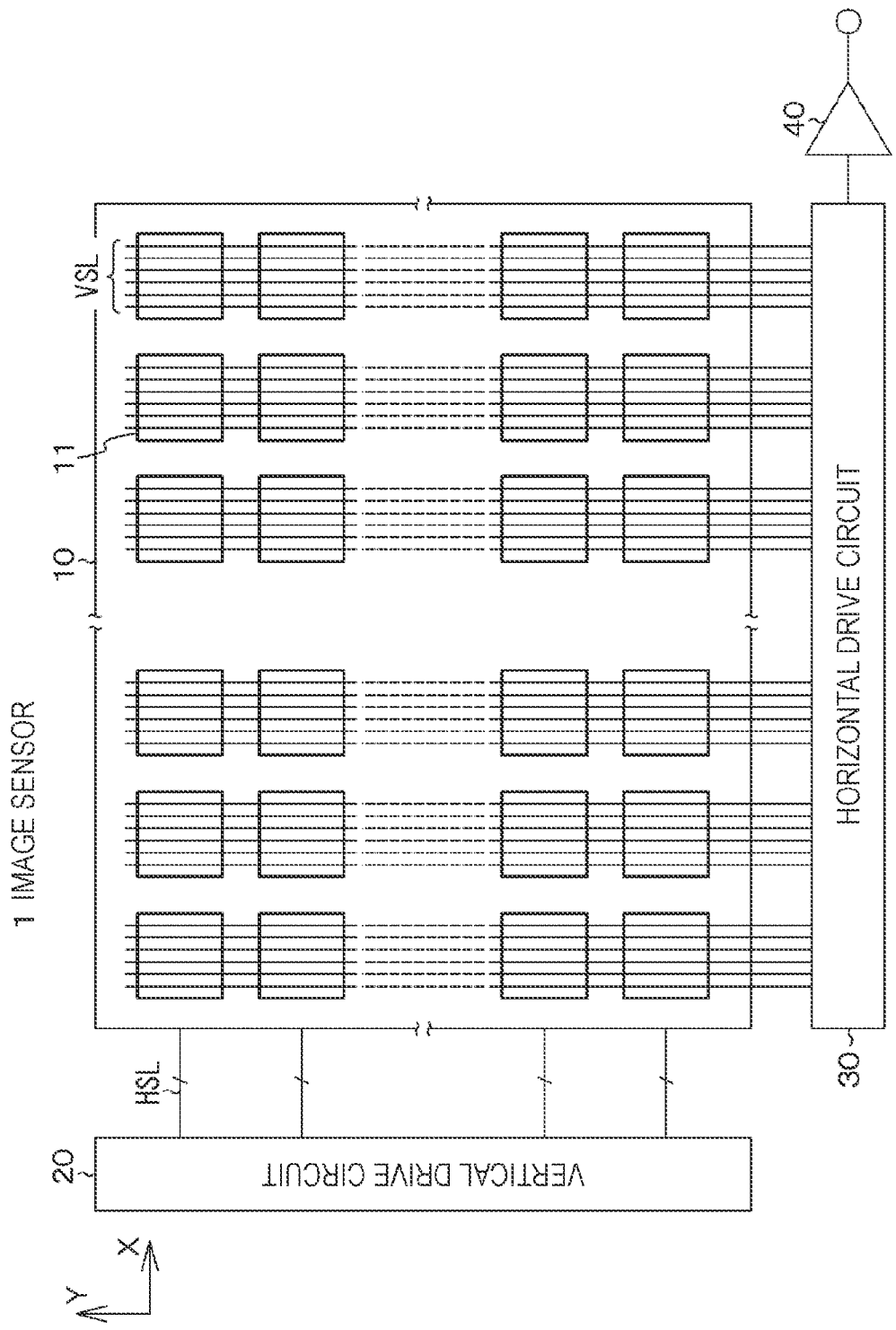
FIG. 1 is a schematic diagram for describing a configuration example of an image sensor.

Hereinafter, the present disclosure will be described on the basis of embodiments with reference to the drawings. The present disclosure is not limited to the embodiments, and various numerical values and materials in the embodiments are examples. In the following description, the same elements or elements having the same function will be denoted by the same reference signs, without redundant description. Note that the description will be given in the following order.

1. General description of image sensor, imaging device, and electronic device according to present disclosure
2. First Embodiment
3. Second Embodiment
4. Third Embodiment
5. Fourth Embodiment
6. Fifth Embodiment
7. Sixth Embodiment
8. Application example
9. Configuration of present disclosure

[General Description of Image Sensor, Imaging Device, and Electronic Device According to Present Disclosure]

In an image sensor according to the present disclosure, an image sensor used in an imaging device according to the present disclosure, and an image sensor used in an electronic device according to the present disclosure (hereinafter, these may be simply referred to as image sensor according to present disclosure),
a via that is connected to a vertical signal line may be provided in a wiring layer as a connection portion, and
a pixel signal may be taken out from the vertical signal line through the via.

In the image sensor according to the present disclosure having the above-mentioned preferable configuration,
in some of the wiring layers among the multiple laminated wiring layers, a relay line extending in a direction orthogonal to a direction in which the vertical signal line extends may be arranged, as the connection portion, for each pixel, and
the pixel signal may be taken out from the vertical signal line through the via and the relay line.

In this case,
in a wiring layer adjacent to the pixel among the multiple laminated wiring layers, the relay line extending in the direction orthogonal to the direction in which the vertical signal line extends may be arranged, as the connection portion, for each pixel while being connected to the pixel.

Here, in the wiring layer adjacent to the pixel among the multiple laminated wiring layers,
the relay line may be arranged so as to cross only the vertical signal line in a range that can be related to the connection. Moreover,
the configuration may further include
a shield wiring that is arranged so as to cross only the vertical signal line in a range that cannot be related to the connection, extends along the same line as the relay line, and is applied with a predetermined fixed voltage.

Alternatively, in the image sensor according to the present disclosure having the above-mentioned preferable configuration,
the wiring layer in which the relay line is arranged may be provided for connection with the vertical signal line in one of an upper wiring layer or a lower wiring layer which are laminated adjacent to the wiring layer in which the relay line is arranged.

Alternatively, in the image sensor according to the present disclosure having the above-mentioned preferable configuration,
the wiring layer in which the relay line is arranged may be provided for connection with the vertical signal lines in the upper wiring layer and the lower wiring layer which are laminated adjacent to the wiring layer in which the relay line is arranged.

In this case,
the vertical signal lines in the upper wiring layer and the lower wiring layer may be arranged so that the orthogonal projections of the vertical signal lines on the wiring layers do not overlap.

Alternatively, in the image sensor according to the present disclosure,
the vertical signal line may be arranged so as to detour around a via part that is not involved in the connection to the pixel.

In this case,
vertical signal lines in two adjacently laminated wiring layers may be arranged so that the orthogonal projections of the vertical signal lines on the wiring layers do not overlap.

Since a front-illuminated image sensor has a configuration where light is incident from the wiring layer side, there has been a problem that the arrangement of various wirings is restricted in order to secure an optical path. On the other hand, in a back-illuminated image sensor, there is no limitation such as securing an optical path. Accordingly, from the viewpoint of increasing the number of vertical signal lines, it is preferable to form a back-illuminated type image sensor.

For example, the wiring layer can be formed by forming an insulating material layer and then appropriately forming an opening or the like, and subsequently, forming a conductive material on the entire surface and then appropriately patterning the wiring layer. The insulating material layer can be formed by using a $SiO_x$-based material (material included in silicon-based oxide film), SiN, SiON, SiOC, SiOF, SiCN, or an organic SOG, for example. Additionally, as the conductive material, copper, a copper alloy, or aluminum can be used, for example. The wiring layer can be formed by using a known method such as various chemical vapor deposition methods and various physical vapor deposition methods, and a known method such as a combination of lithography technology and etching technology, a lift-off method, and a combination of a plating method and a damascene method.

The pixel array unit can be formed on a semiconductor substrate including silicon, for example. The pixel can include a photoelectric conversion unit and various circuits for driving the photoelectric conversion unit. The pixel configuration is not particularly limited, and may be a floating diffusion region storage type or a memory storage type, for example. Additionally, various circuits for driving the pixel array unit may be integrated with the pixel array unit or may be separate from the pixel array unit. For example, some of the various circuits may be configured as a separate body from the pixel array unit.

Additionally, as an imaging device including the image sensor according to the present disclosure, an imaging device such as a digital still camera or a digital video camera can be exemplified. Additionally, as an electronic device including the image sensor according to the present disclosure, various electronic devices such as a mobile phone having an imaging function or another device having an imaging function can be exemplified.

First Embodiment

A first embodiment relates to an image sensor, an imaging device, and an electronic device according to the present disclosure.

FIG. 1 is a schematic diagram for describing a configuration of a CMOS image sensor as an image sensor to which the present disclosure is applied.

As shown in FIG. 1, an image sensor 1 includes
a pixel array unit 10 in which pixels 11 are arranged in a matrix, multiple vertical signal lines VSL provided in pixel column units, and a vertical drive circuit 20, a horizontal drive circuit 30, and a signal processing unit 40 for driving the pixel array unit 10. The operations are controlled by a control circuit (not shown).

As will be described in detail later with reference to FIG. 6 and other drawings, the multiple vertical signal lines VSL provided in pixel column units are arranged in multiple wiring layers laminated on the pixel 11. In the following description, the first wiring layer closest to the pixel is represented by reference sign WLA1, and the second wiring layer is represented by reference sign WLA2. The same applies to the third and subsequent layers.

The pixel array unit 10 is formed by arranging the pixels 11 in a matrix, the pixel 11 having a photoelectric conversion unit and a floating diffusion region to which photoelectrically converted charges are transferred. Each pixel 11 is connected to the vertical drive circuit 20 through a control line HSL row by row. Additionally, each pixel 11 is connected to the horizontal drive circuit 30 through the vertical signal line VSL row by row.

Light from the imaging target is incident on the pixel array unit 10. The pixel 11 outputs a pixel signal at a level corresponding to the amount of light received. Pixel signals form an image of the subject.

The pixel 11 includes a photoelectric conversion unit including a photodiode or the like, a floating diffusion region to which charges from the photoelectric conversion unit are transferred, and a transistor for driving the pixel 11. For example, these components may be formed in a p-type well provided on an n-type semiconductor substrate.

Figure 2:
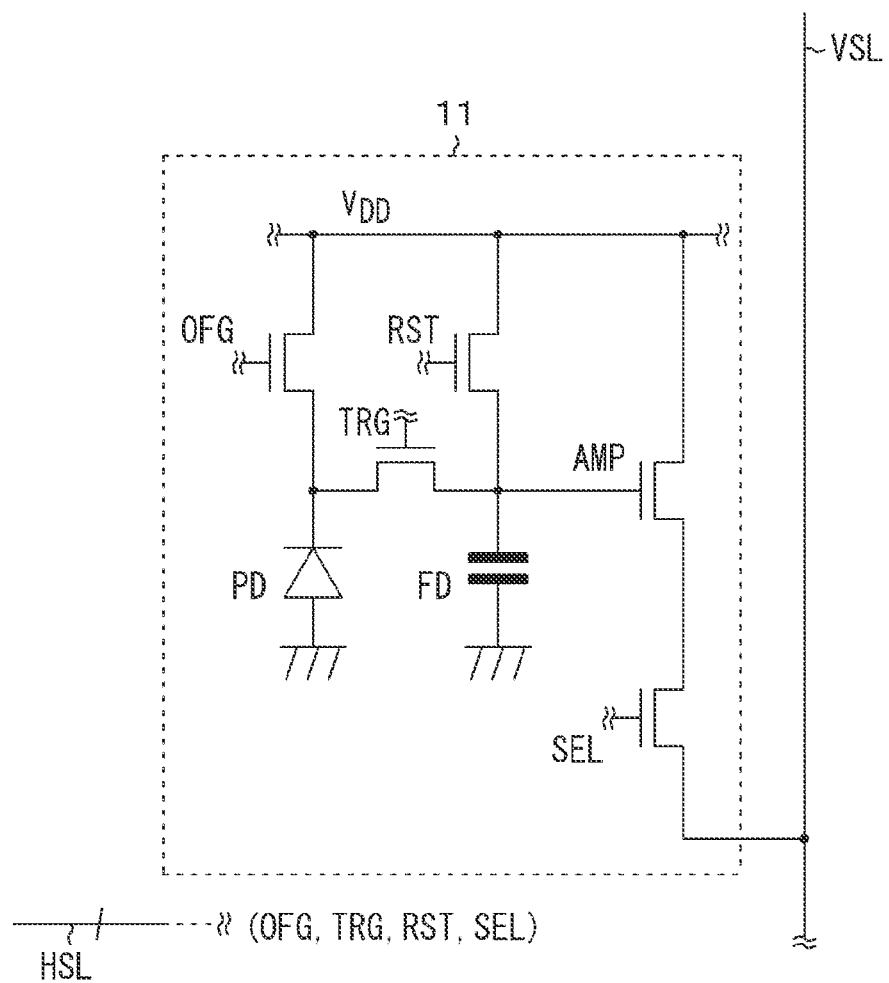
FIG. 2 is a schematic circuit diagram for describing a configuration example of a pixel of the image sensor.

The vertical drive circuit 20 supplies drive signals for sequentially driving the pixels 11 of the pixel array unit 10 row by row to the pixels 11 through the control line HSL. Note that for convenience of illustration, FIG. 1 shows one control line HSL for each pixel row. Actually, as shown in FIG. 2 described later, multiple types of control lines are arranged corresponding to one pixel row.

Additionally, the signal level and the reset level output from the pixel 11 are transmitted to the horizontal drive circuit 30 through the vertical signal line VSL. Each of the multiple vertical signal lines VSL is connected so that it corresponds to a group of pixels having a predetermined relationship with the vertical signal line VSL among the pixels 11 included in the pixel column.

The horizontal drive circuit 30 performs double data sampling (DDS) on the basis of the signal output from the pixel 11 and then performs A/D conversion. The horizontal drive circuit 30 can be configured to perform DDS processing in parallel for each vertical signal line VSL, for example. Then, the pixel signal is output from the horizontal drive circuit 30 to the signal processing unit 40.

For example, the signal processing unit 40 performs various signal processing on the pixel signal from the horizontal drive circuit 30 and generates an image output therefrom. The signal processing unit 40 may be integrally formed on the semiconductor substrate on which the pixel array unit 10 is formed, or may be provided on another substrate, for example. Moreover, the signal processing unit 40 may be processing by DSP or software.

The vertical drive circuit 20 includes logic circuits such as a shift register and an address decoder, and drives the pixels 11 of the pixel array unit 10 simultaneously or row by row. For example, resetting, exposure, and charge transfer of the pixels 11 can be performed simultaneously for all pixels, and the reading can be performed row by row.

FIG. 2 is a schematic circuit diagram for describing a configuration example of a pixel of the image sensor.

The pixel 11 includes:
five transistors which are
an initialization transistor for applying a predetermined voltage to the photoelectric conversion unit PD,
a transfer transistor for transferring photoelectrically converted charges to the floating diffusion region FD,
a reset transistor for applying a predetermined voltage to the floating diffusion region FD,
an amplification transistor in which the voltage of the floating diffusion region FD is applied to the gate electrode, and
a selective transistor for connecting the amplification transistor and the vertical signal line VSL
(represented by reference signs OFG, TRG, RST, AMP, and SEL, respectively);

the photoelectric conversion unit PD including a photodiode; and the floating diffusion region FD.

A constant voltage (e.g., ground voltage) is supplied to one end of the photoelectric conversion unit PD (anode side) and one end of the floating diffusion region FD. A power supply line to which a drive voltage is supplied and the other end (cathode side) of the photoelectric conversion unit PD are connected through the initialization transistor OFG. The power supply line to which the drive voltage is supplied and the other end of the floating diffusion region FD are connected through the reset transistor RST. The other end of the photoelectric conversion unit PD and the other end of the floating diffusion region FD are connected through the transfer transistor TRG.

One end of the amplification transistor AMP is connected to the power supply line to which the drive voltage is supplied. The other end of the amplification transistor AMP and the vertical signal line VSL are connected through the selective transistor SEL. The gate electrode of the amplification transistor AMP is connected to the other end of the floating diffusion region FD.

The basic operation of the pixel 11 will be described. Note that here, the control lines connected to the gate electrodes of the transistors OFG, TRG, RST, and SEL are denoted as a control line HSL (OFG), a control line HSL (TRG), a control line HSL (RST), and a control line HSL (SEL), respectively.

First, from a state where the control lines HSL (OFG) of all rows are set to high level (i.e., state where voltage $V_{DD}$ is applied through initialization transistor OFG and photoelectric conversion unit PD is reset), the control lines HSL (OFG) of all rows are collectively set to low level. As a result, exposure is started in all pixels.

Then, after passage of a predetermined exposure period, the control lines HSL (TRG) of all rows are set to high level for a predetermined period. As a result, the transfer transistor TRG becomes conductive, and photoelectrically converted charges are transferred to and held in the floating diffusion region FD.

Next, the pixel signal is read out. Specifically, the control line HSL (SEL) of the row to be read out is set to high level for a predetermined period. As a result, the amplification transistor AMP is connected to the vertical signal line VSL through the selective transistor SEL which is in the conductive state. Then, within that period, the control line HSL (RST) is set to high level for a certain period. With this operation, the signal level and the reset level are read out.

The signal level and reset level read out through the vertical signal line VSL are each controlled by the gate voltage of the amplification transistor AMP. The horizontal drive circuit 30 obtains the difference between the reset level and the signal level, and sets the difference as a video signal $V_{OUT}$.

The basic operation of the pixel 11 has been described above. Note that the pixel configuration described above is an example, and various configurations such as a configuration in which OFG is omitted and a configuration in which multiple transistors SEL are provided can be adopted.

Next, in order to help the understanding of the present disclosure, the structure of wiring layers of a reference example will be described with reference to FIGS. 3, 4, and 5.

Figure 3:
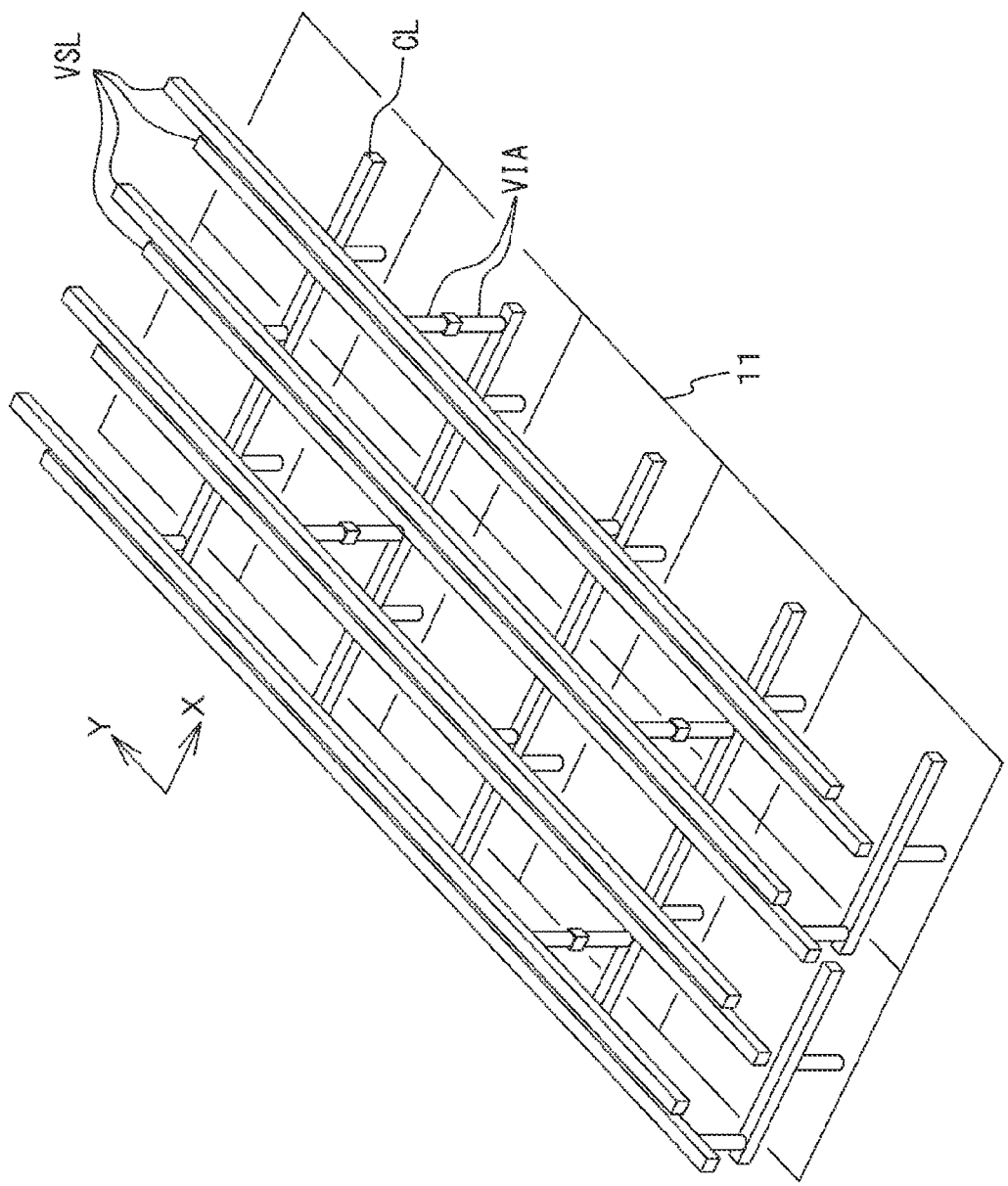
FIG. 3 is a schematic perspective view for describing the structure of various wirings in wiring layers of a reference example.
Figure 4:
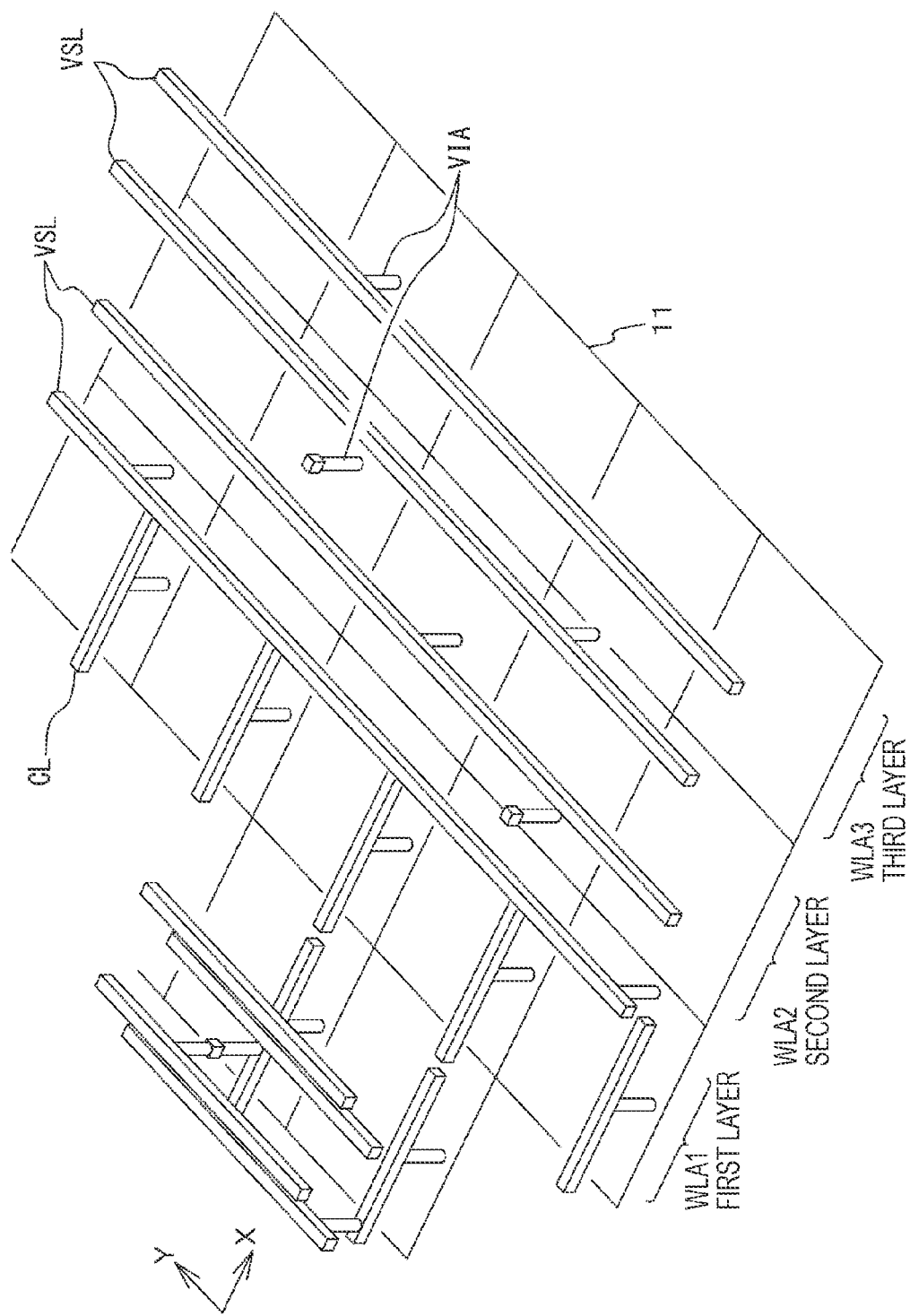
FIG. 4 is a schematic perspective view for describing the structure of each layer of the wiring layers of the reference example.

FIG. 3 is a schematic perspective view for describing the structure of various wirings of wiring layers of the reference example. FIG. 4 is a schematic perspective view for describing the structure of each layer of the wiring layers of the reference example. FIG. 5 is a schematic plan view for describing the relationship between the orthogonal projection in the laminated state of the wiring layers and the structure of each layer of the reference example. Note that in order to clarify the positional relationship among various wirings and the like, illustration of an insulating material included in the wiring layer is omitted in these drawings. The same applies to other drawings described later.

In the example shown in FIG. 3, four vertical signal lines VSL are arranged for one pixel column. As shown in FIG. 4, two of the four vertical signal lines VSL are arranged in the second wiring layer WLA2, and the remaining two are arranged in the third wiring layer WLA3. A relay line CL that is connected to the pixel 11 and is provided corresponding to each pixel 11 is arranged in the first wiring layer WLA1 closest to the pixel. Reference sign VIA indicates a connecting via provided in the wiring layer.

As shown in FIG. 3, the vertical signal line VSL and the relay line CL are connected by vias. In a case where another wiring layer is included between the vertical signal line VSL and the relay line CL, the vertical signal line VSL and the relay line CL are connected through a via provided in the another wiring layer as well.

Figure 5:
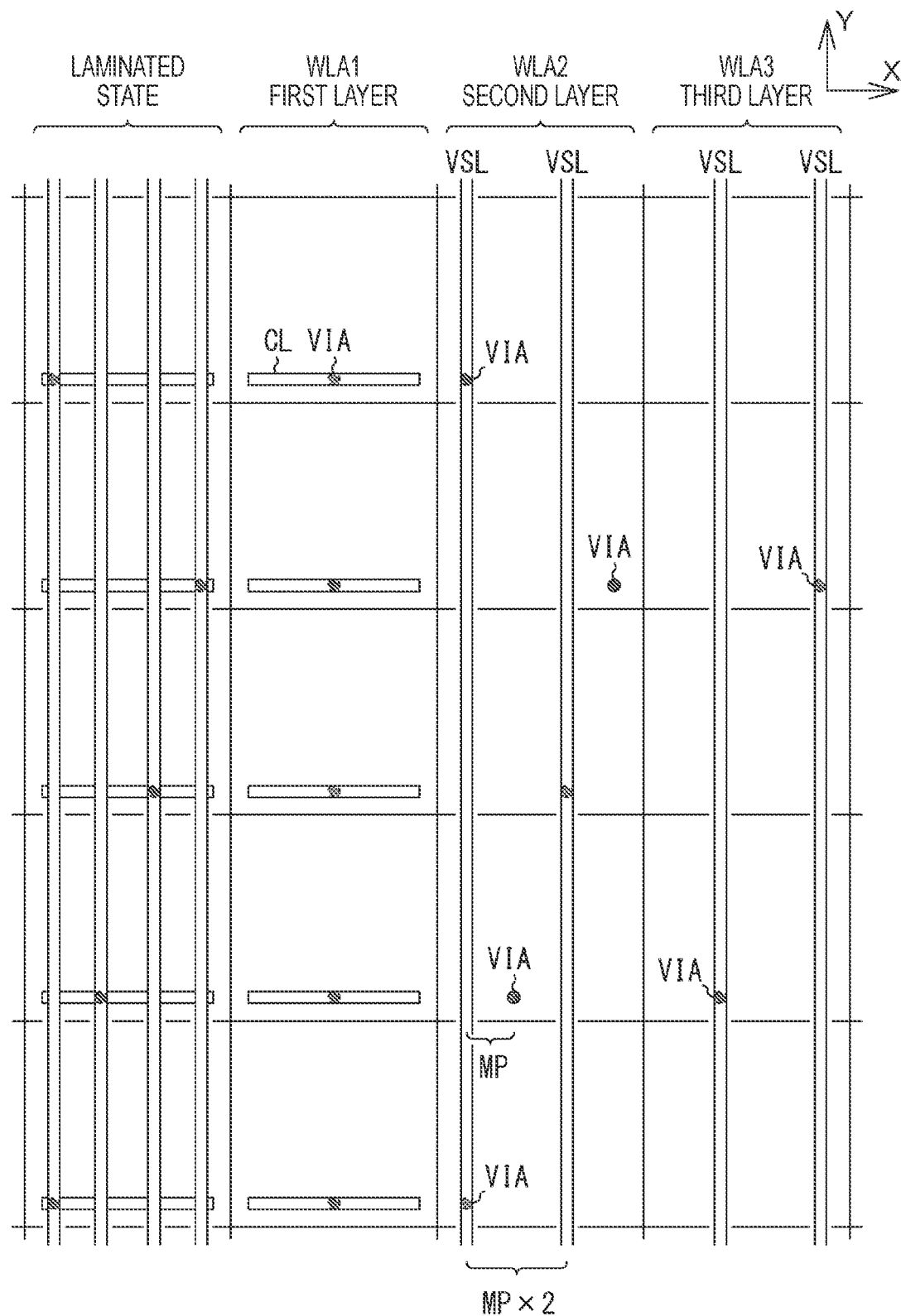
FIG. 5 is a schematic plan view for describing the relationship between the orthogonal projection in the laminated state of the wiring layers and the structure of each layer of the reference example.

As shown in FIG. 5, the vertical signal lines VSL of the second layer and the vertical signal lines VSL of the third layer are arranged so that the orthogonal projections do not overlap. In this case, if the number of vertical signal lines VSL is to be increased by further forming a fourth wiring layer, the vertical signal lines VSL cannot be arranged so as to make the orthogonal projections overlap. This is because while it is necessary to connect a via to the vertical signal line VSL of the fourth layer as well, the via cannot be arranged while being electrically independent from the vertical signal line VSL of the lower layer. Additionally, in manufacturing various wirings, it is necessary to secure the minimum line width and the minimum space required for manufacturing. In the example shown in FIG. 5, the vertical signal line VSL and via of the second layer are arranged so as to secure the minimum space (represented by reference sign MP). Accordingly, it is not possible to further arrange another vertical signal line VSL between the adjacent vertical signal lines VSL either.

The structure of the wiring layers of the reference example has been described above. Next, the structure of wiring layers used in the image sensor according to the first embodiment will be described with reference to the drawings.

Figure 6:
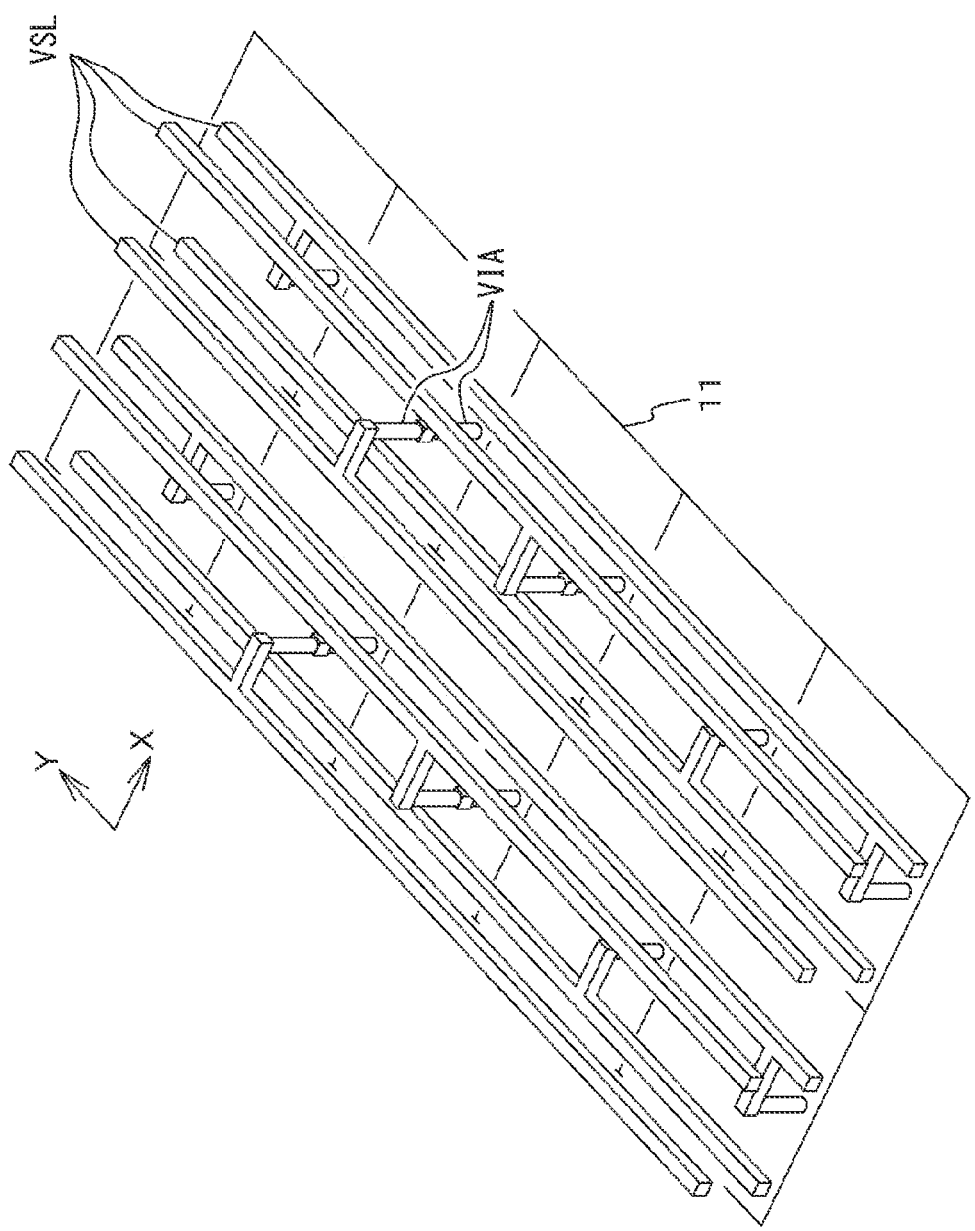
FIG. 6 is a schematic perspective view for describing the structure of various wirings in wiring layers used in the image sensor according to a first embodiment.
Figure 7:
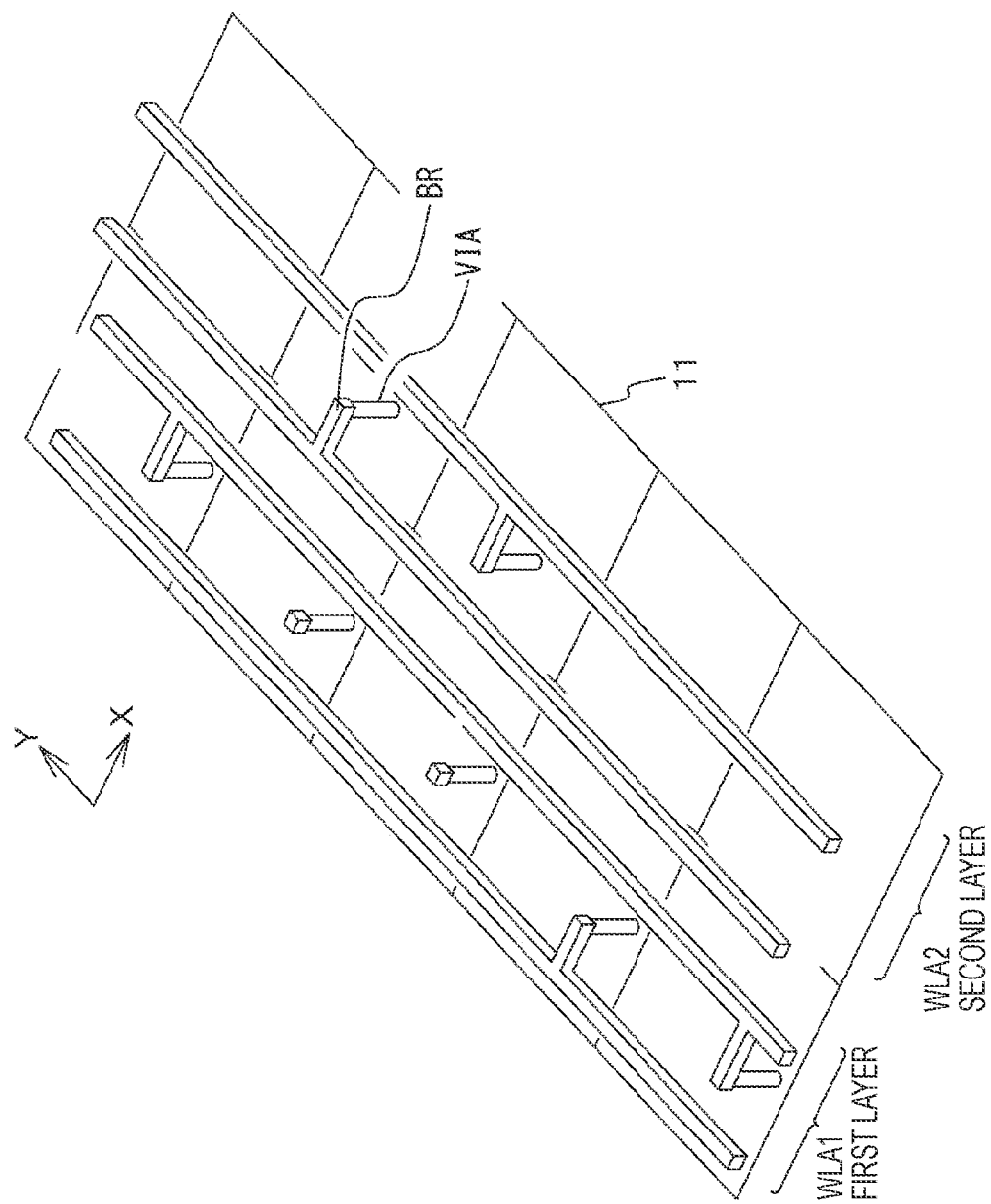
FIG. 7 is a schematic perspective view for describing the structure of each layer of the wiring layers used in the image sensor according to the first embodiment.
Figure 8:
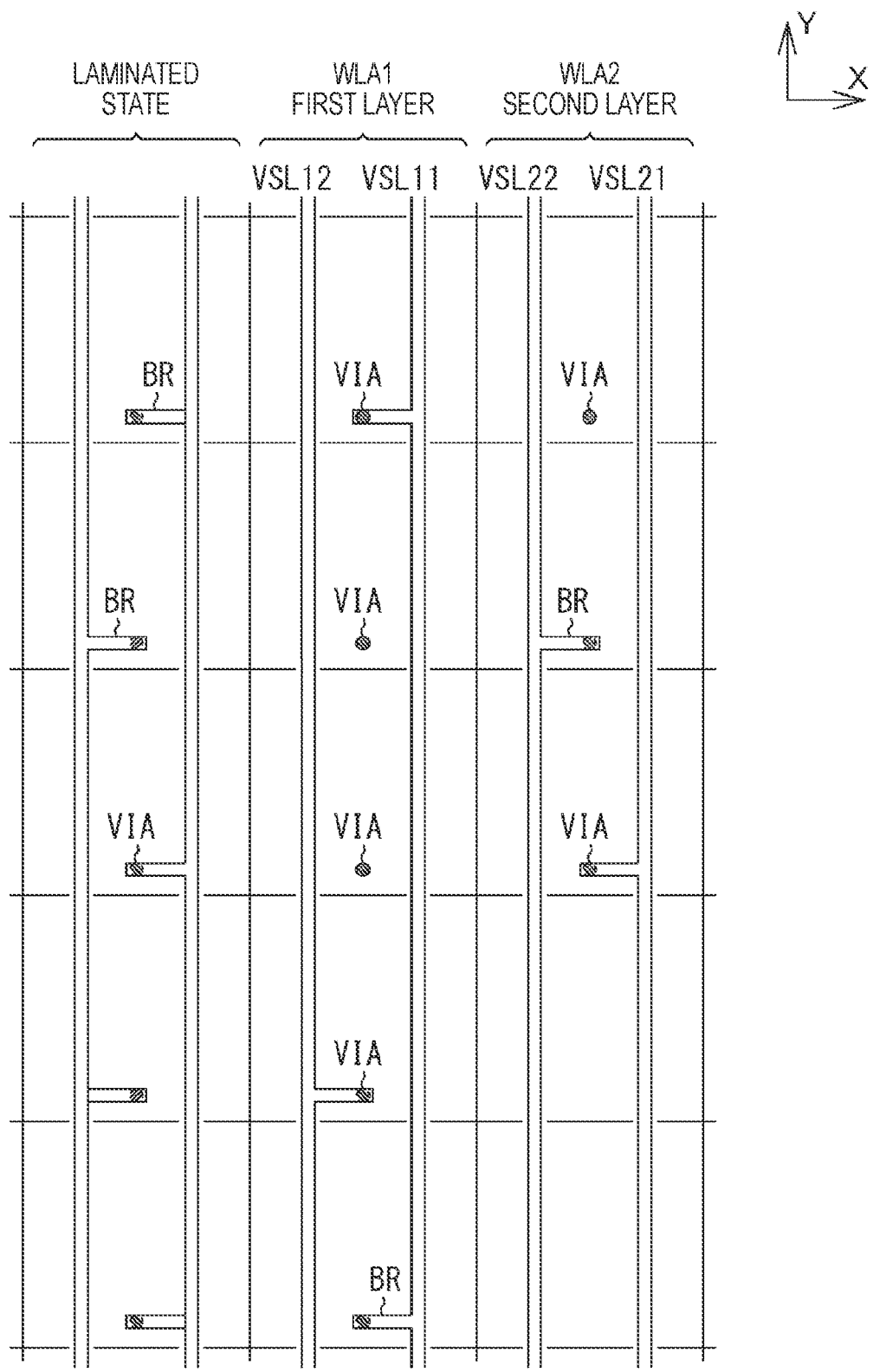
FIG. 8 is a schematic plan view for describing the relationship between the orthogonal projection in the laminated state of the wiring layers and the structure of each layer used in the image sensor according to the first embodiment.

FIG. 6 is a schematic perspective view for describing the structure of various wirings in wiring layers used in the image sensor according to a first embodiment. FIG. 7 is a schematic perspective view for describing the structure of each layer of the wiring layers. FIG. 8 is a schematic plan view for describing the relationship between the orthogonal projection in the laminated state of the wiring layers and the structure of each layer.

In the wiring layers used in the image sensor according to the first embodiment, multiple vertical signal lines VSL provided in pixel column units are arranged in multiple wiring layers laminated on the pixel 11. In the example shown in the drawings, the wiring layers have a two-layer configuration (WLA1, WLA2), and two vertical signal lines VSL are arranged in each layer.

A via connected to the vertical signal line VSL is provided as a connection portion in the wiring layer, and the signal of the pixel 11 is taken out from the vertical signal line VSL through the via. The vias forming the connection portion provided in the wiring layer are arranged between the two vertical signal lines VSL. The vertical signal line VSL and the via provided in the wiring layer are connected by a branch wiring BR extending in a direction orthogonal to the direction in which the vertical signal line VSL extends. Vias are also formed in the first wiring layer WLA1 corresponding to the vias connected to the vertical signal lines VSL of the second layer.

In the first embodiment, the vertical signal line VSL and the pixel 11 can be connected without providing a relay line in the first layer. Then, as shown in FIG. 8, the vertical signal lines VSL can be arranged so that their orthogonal projections on multiple wiring layers overlap.

The connection relationship between the vertical signal line VSL and the pixel 11 will be described with reference to FIGS. 9, 10A, 10B, 11A, and 11B.

Figure 9:
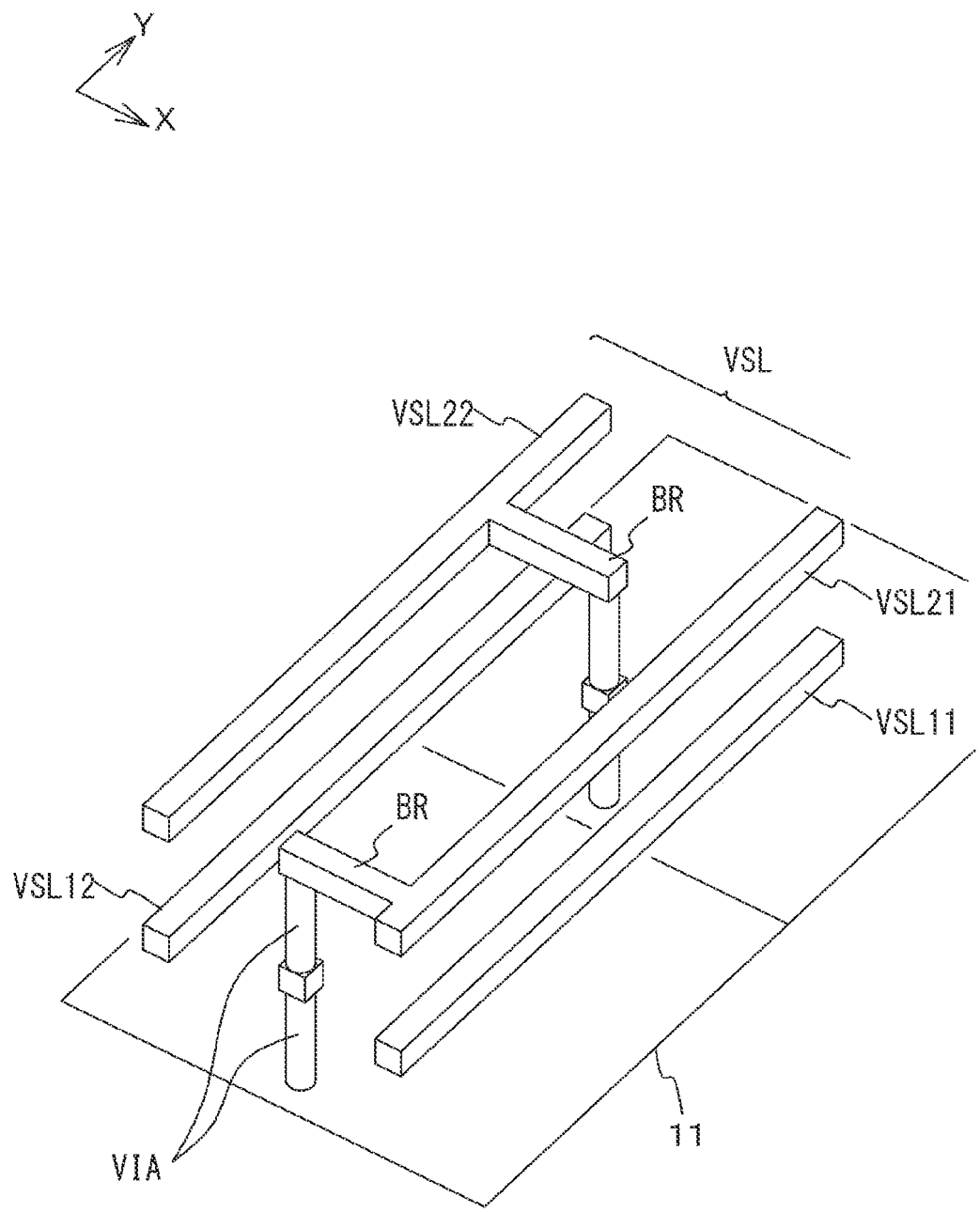
FIG. 9 is a schematic perspective view for describing the connection relationship between the vertical signal lines of the second layer and the pixels in the wiring layers used in the image sensor according to the first embodiment.
Figure 10A:
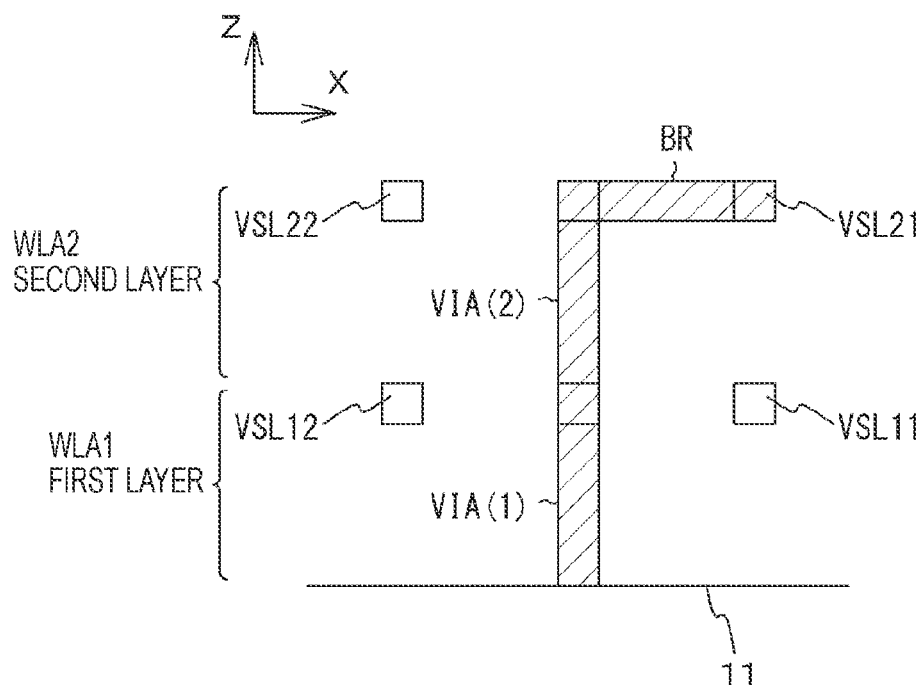
FIG. 10A is a schematic end view for describing the connection relationship between a vertical signal line VSL21 and the pixels.
Figure 10B:
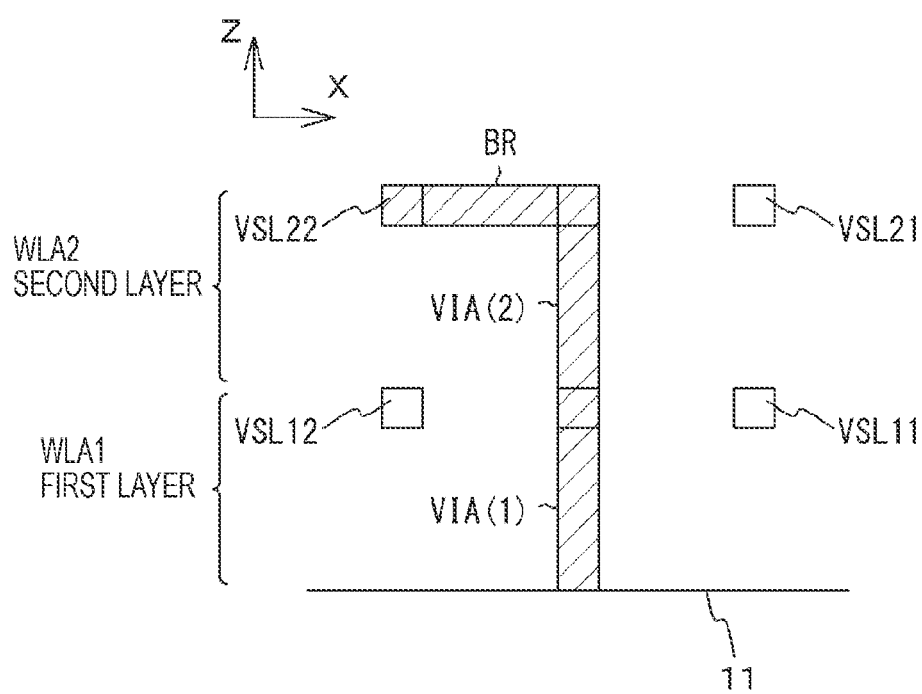
FIG. 10B is a schematic end view for describing the connection relationship between a vertical signal line VSL22 and the pixels.

FIG. 9 is a schematic perspective view for describing the connection relationship between the vertical signal lines of the second layer and the pixels. FIG. 10A is a schematic end view for describing the connection relationship between a vertical signal line VSL21 and the pixels. FIG. 10B is a schematic end view for describing the connection relationship between a vertical signal line VSL22 and the pixel. Note that in the drawings, the via of the first layer is indicated by reference sign VIA(1), and the via of the second layer is indicated by reference sign VIA(2).

As shown in FIGS. 9, 10A, and 10B, the vertical signal line VSL of the second layer is connected to the corresponding pixel 11 by the branch wiring BR of the second layer and the vias provided in the first layer and the second layer.

Figure 11A:
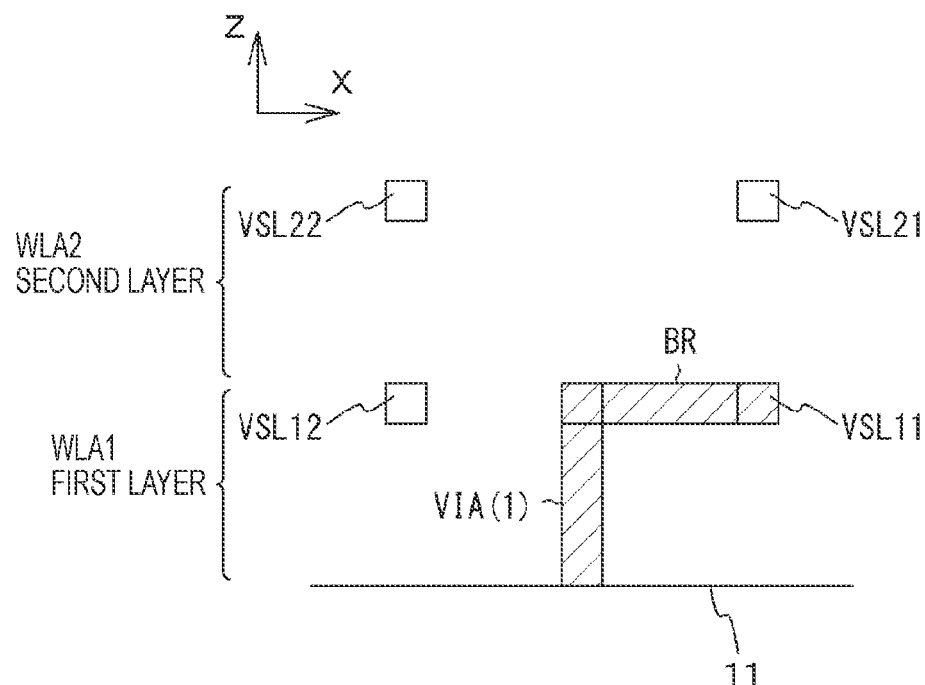
FIG. 11A is a schematic end view for describing the connection relationship between a vertical signal line VSL11 and the pixels.
Figure 11B:
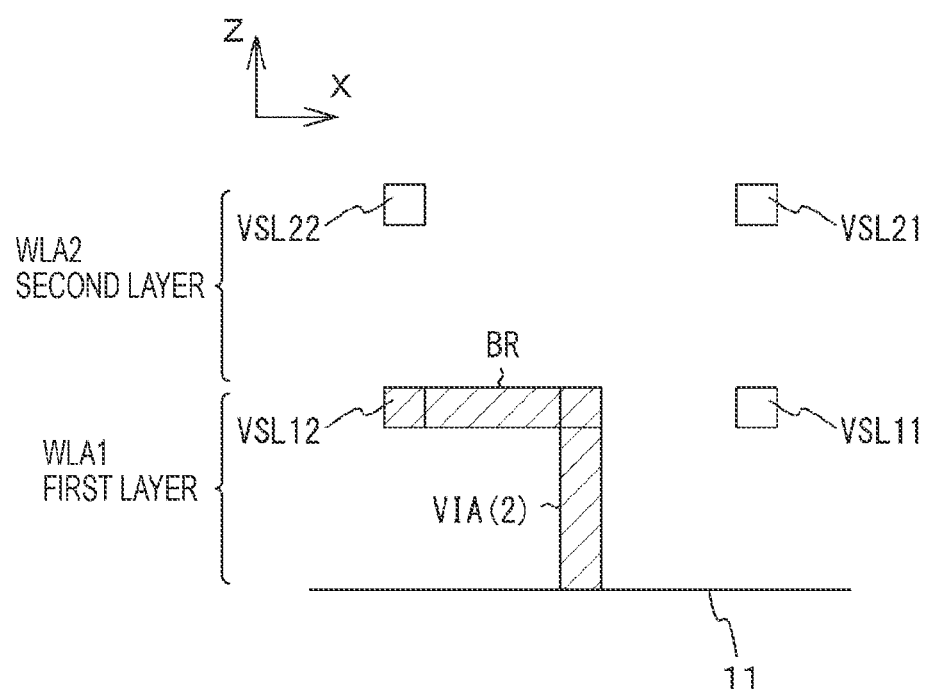
FIG. 11B is a schematic end view for describing the connection relationship between a vertical signal line VSL12 and the pixels.

FIG. 11A is a schematic end view for describing the connection relationship between a vertical signal line VSL11 and the pixels. FIG. 11B is a schematic end view for describing the connection relationship between a vertical signal line VSL12 and the pixel.

As shown in FIGS. 11A and 11B, the vertical signal line VSL of the first layer is connected to the corresponding pixel 11 by the branch wiring BR of the first layer and the via provided in the first layer.

As described above, in the first embodiment, the vertical signal lines VSL can be arranged so that their orthogonal projections on multiple wiring layers overlap. Moreover, the vertical signal line VSL and the pixel 11 can be connected without providing a relay line on the first layer.

Figure 12:
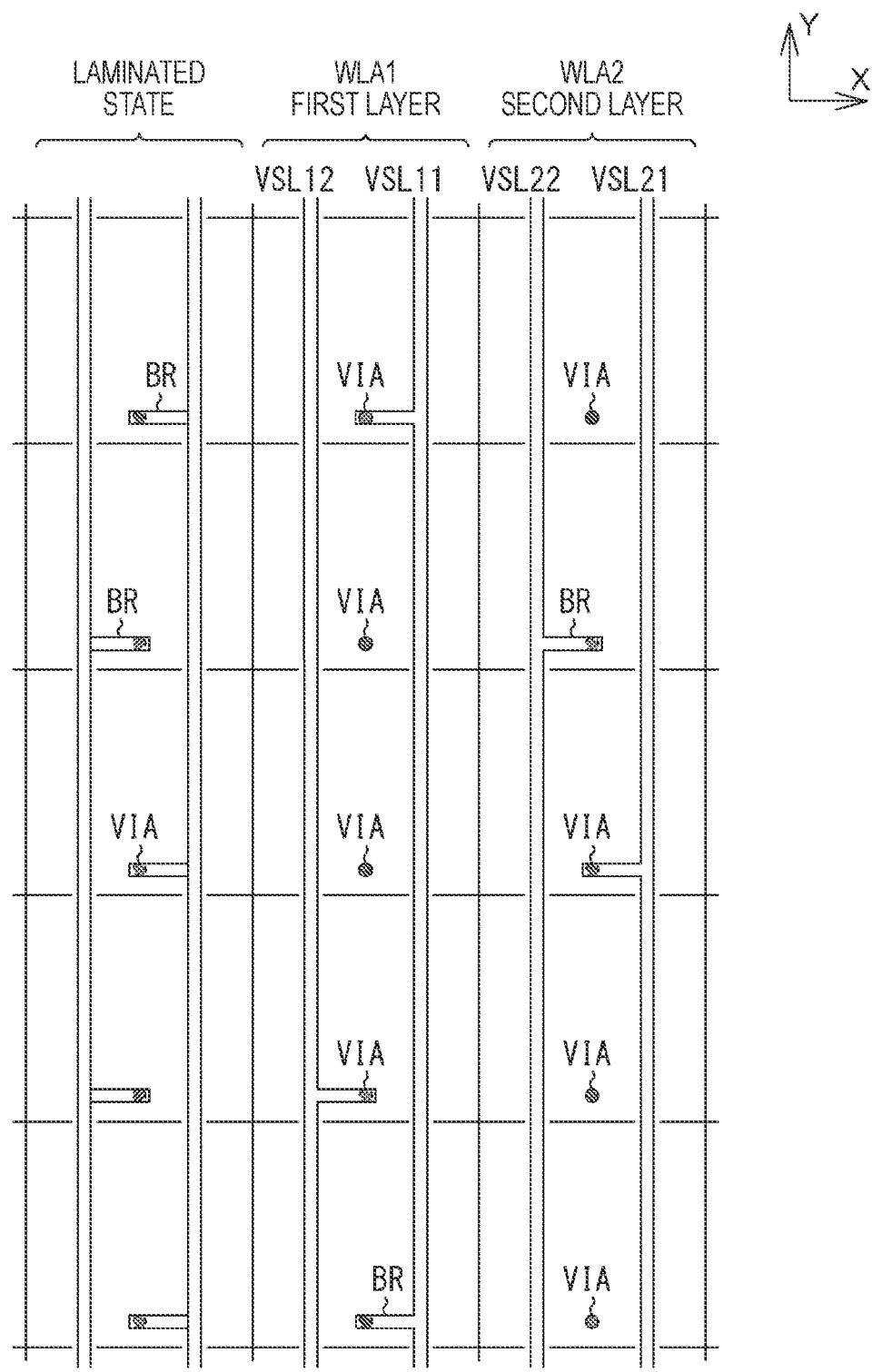
FIG. 12 is a schematic plan view for describing the relationship between the orthogonal projection in the laminated state of the wiring layers and the structure of each layer according to a first modification.
Figure 13A:
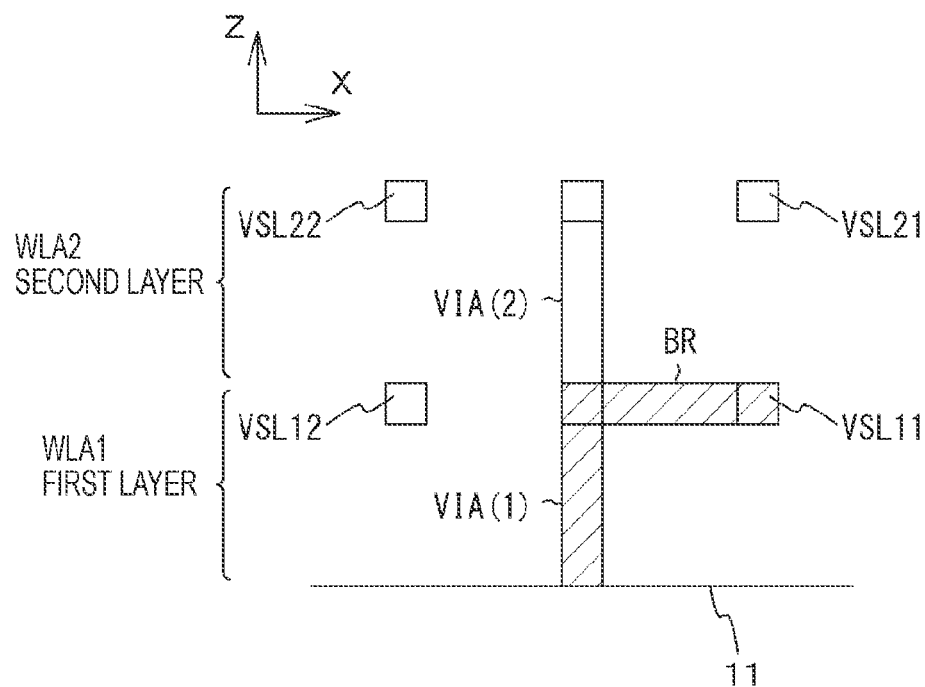
FIG. 13A is a schematic end view for describing the connection relationship between a vertical signal line VSL11 and the pixels.
Figure 13B:
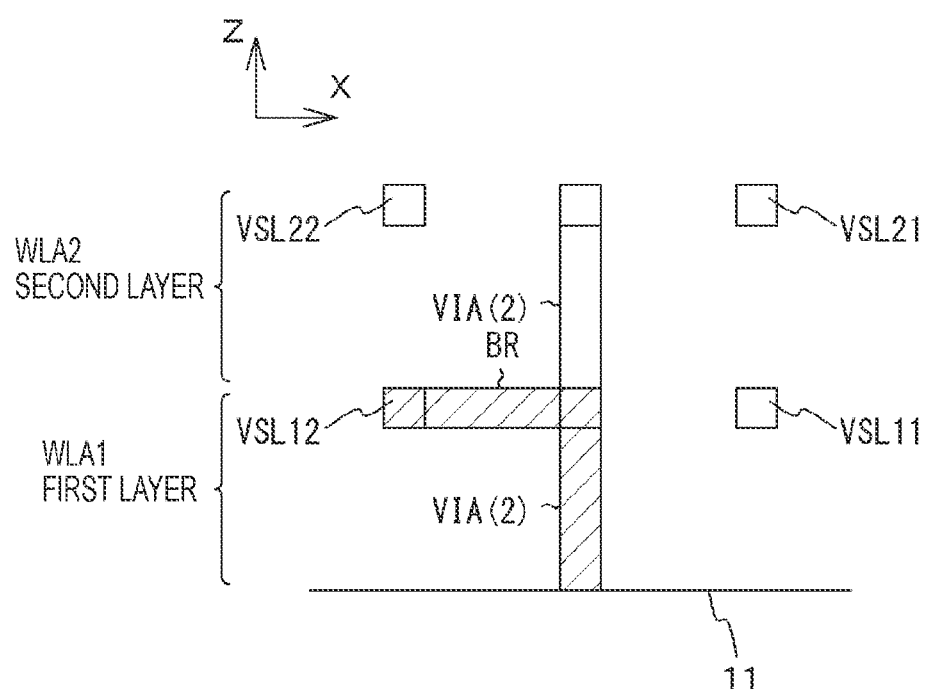
FIG. 13B is a schematic end view for describing the connection relationship between a vertical signal line VSL12 and the pixels.

Note that from the viewpoint of uniform arrangement of vias, another mode is conceivable in which vias are provided in the second layer corresponding to the vias provided in the first layer for connecting the vertical signal lines VSL of the first layer. FIG. 12 is a schematic plan view for describing the relationship between the orthogonal projection in the laminated state of the wiring layers and the structure of each layer according to such a first modification. FIG. 13A is a schematic end view for describing the connection relationship between a vertical signal line VSL11 and the pixels. FIG. 13B is a schematic end view for describing the connection relationship between a vertical signal line VSL12 and the pixels.

In the first embodiment, the number of vertical signal lines can be increased without limitation by increasing the number of wiring layers to be laminated. Hereinafter, a second modification in which the wiring layers have a three-layer configuration will be described.

Figure 14:
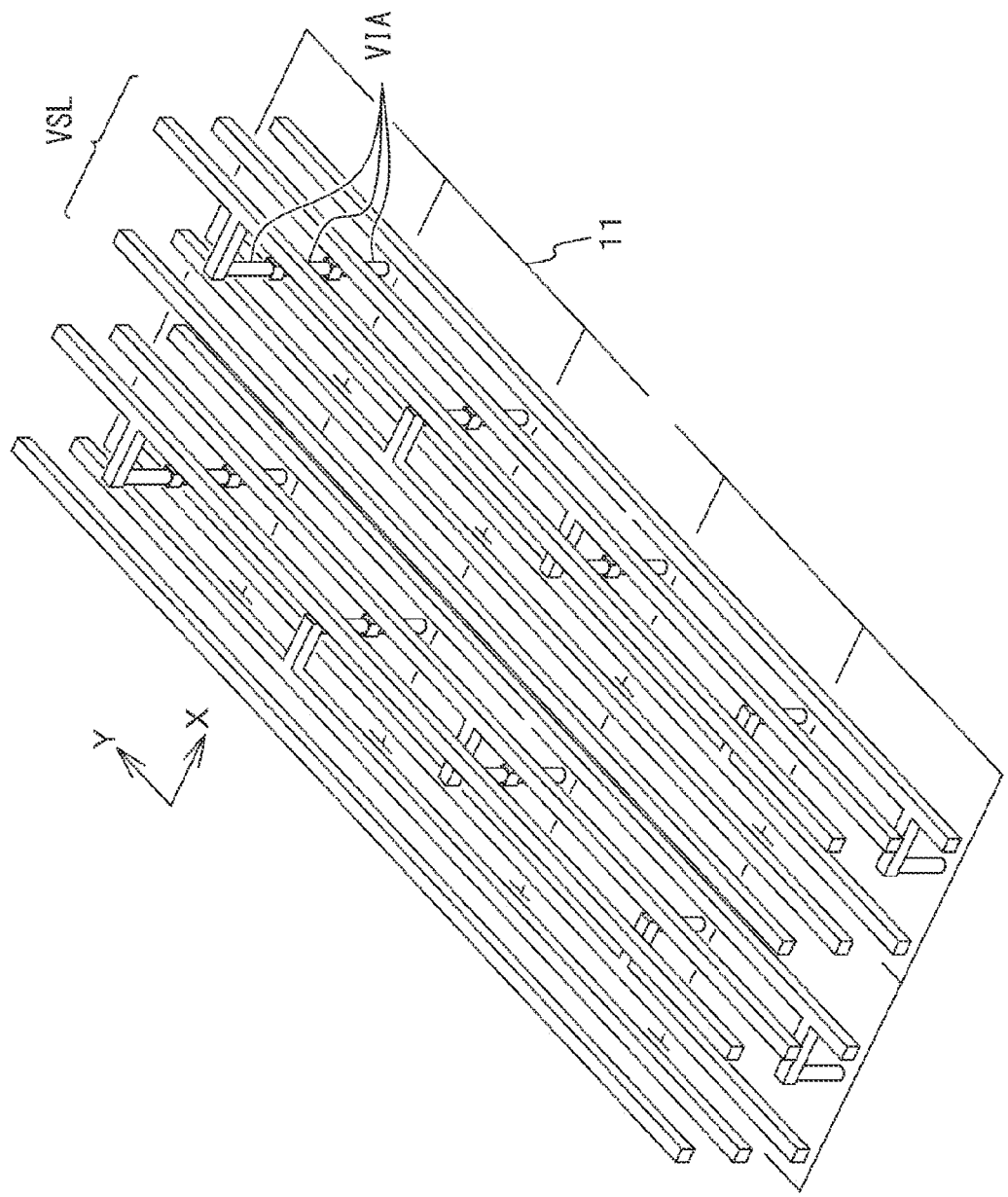
FIG. 14 is a schematic perspective view for describing the structure of each layer of wiring layers according to a second modification.
Figure 15:
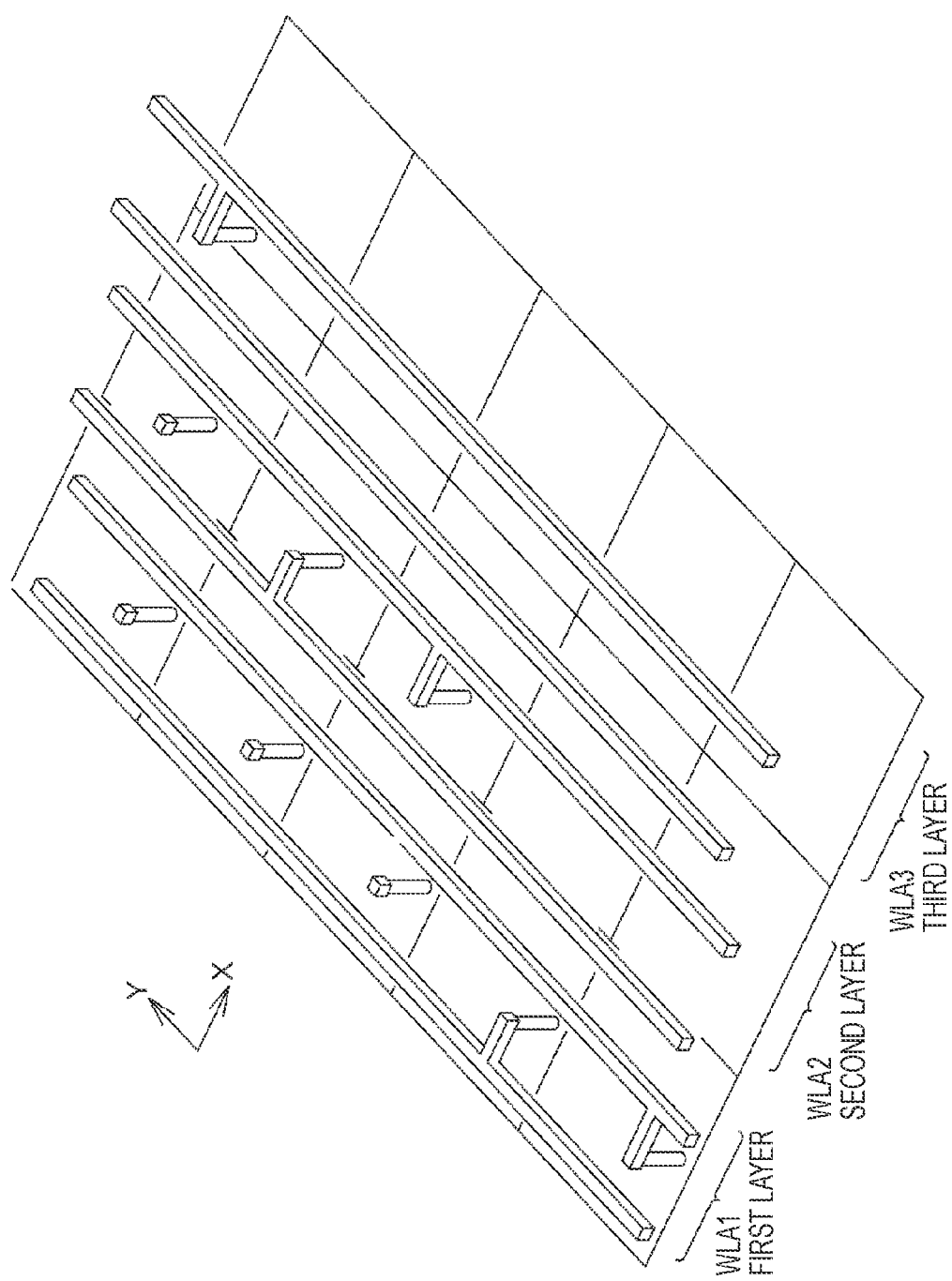
FIG. 15 is a schematic perspective view for describing the structure of each layer of the wiring layers according to the second modification.
Figure 16:
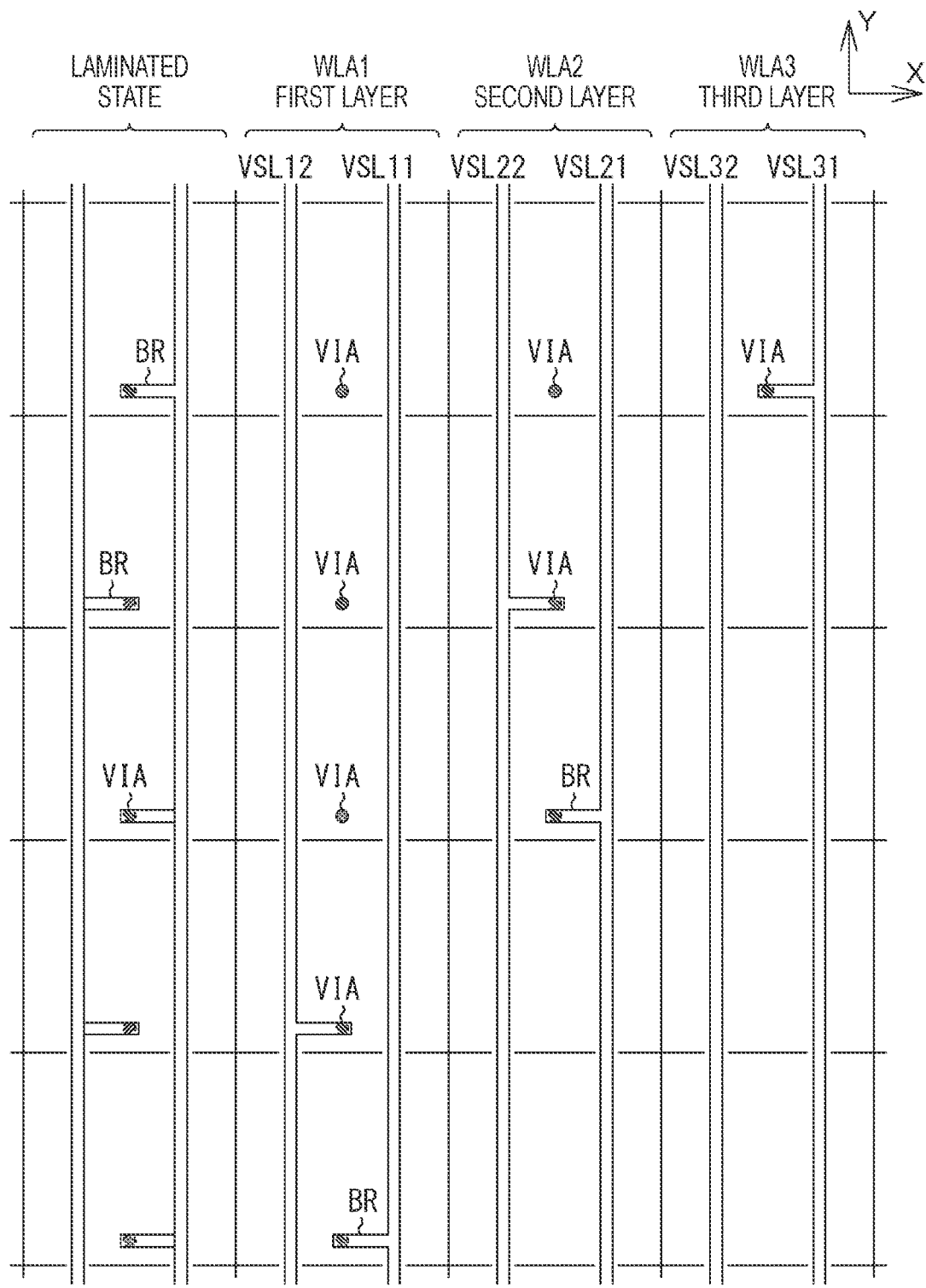
FIG. 16 is a schematic plan view for describing the relationship between the orthogonal projection in the laminated state of the wiring layers and the structure of each layer according to the second modification.

FIG. 14 is a schematic perspective view for describing the structure of each layer of wiring layers according to the second modification. FIG. 15 is a schematic perspective view for describing the structure of each layer of the wiring layers. FIG. 16 is a schematic plan view for describing the relationship between the orthogonal projection in the laminated state of the wiring layers and the structure of each layer.

The second modification is a configuration in which vertical signal lines VSL31, VSL32, and the like of a third layer are further added to the configuration described with reference to FIGS. 6 to 8.

Figure 17:
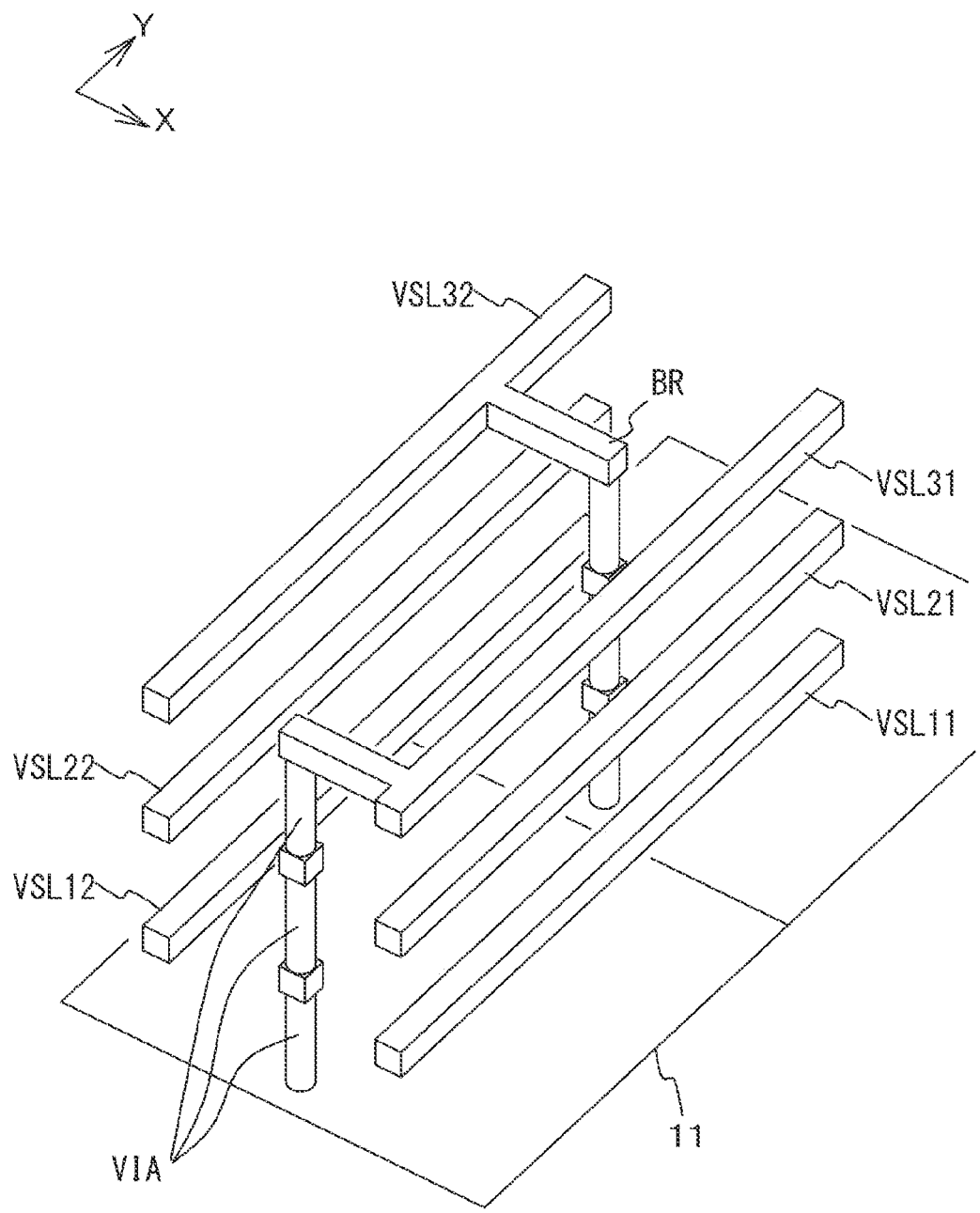
FIG. 17 is a schematic perspective view for describing the connection relationship between vertical signal lines in a third wiring layer and pixels according to the second modification.
Figure 18:
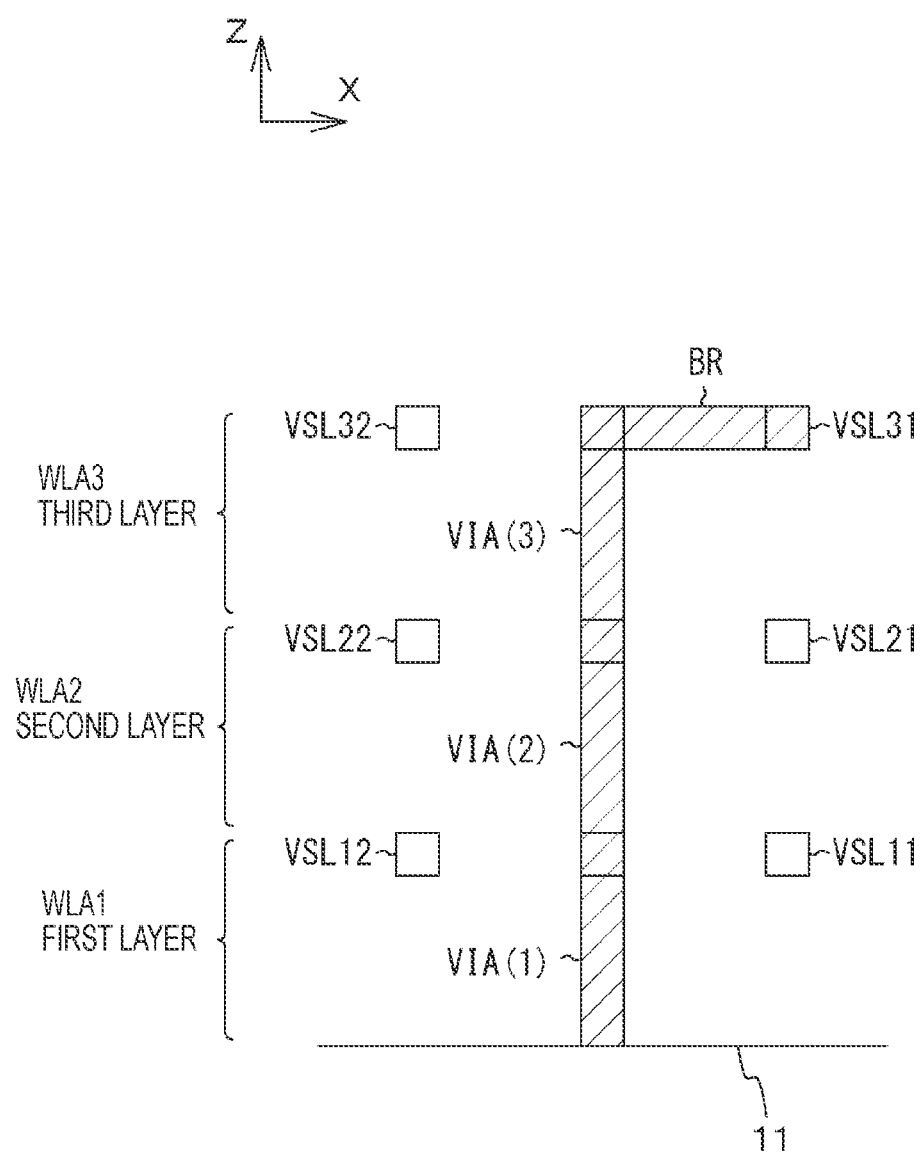
FIG. 18 is a schematic end view for describing the connection relationship between a vertical signal line VSL31 and the pixels.
Figure 19:
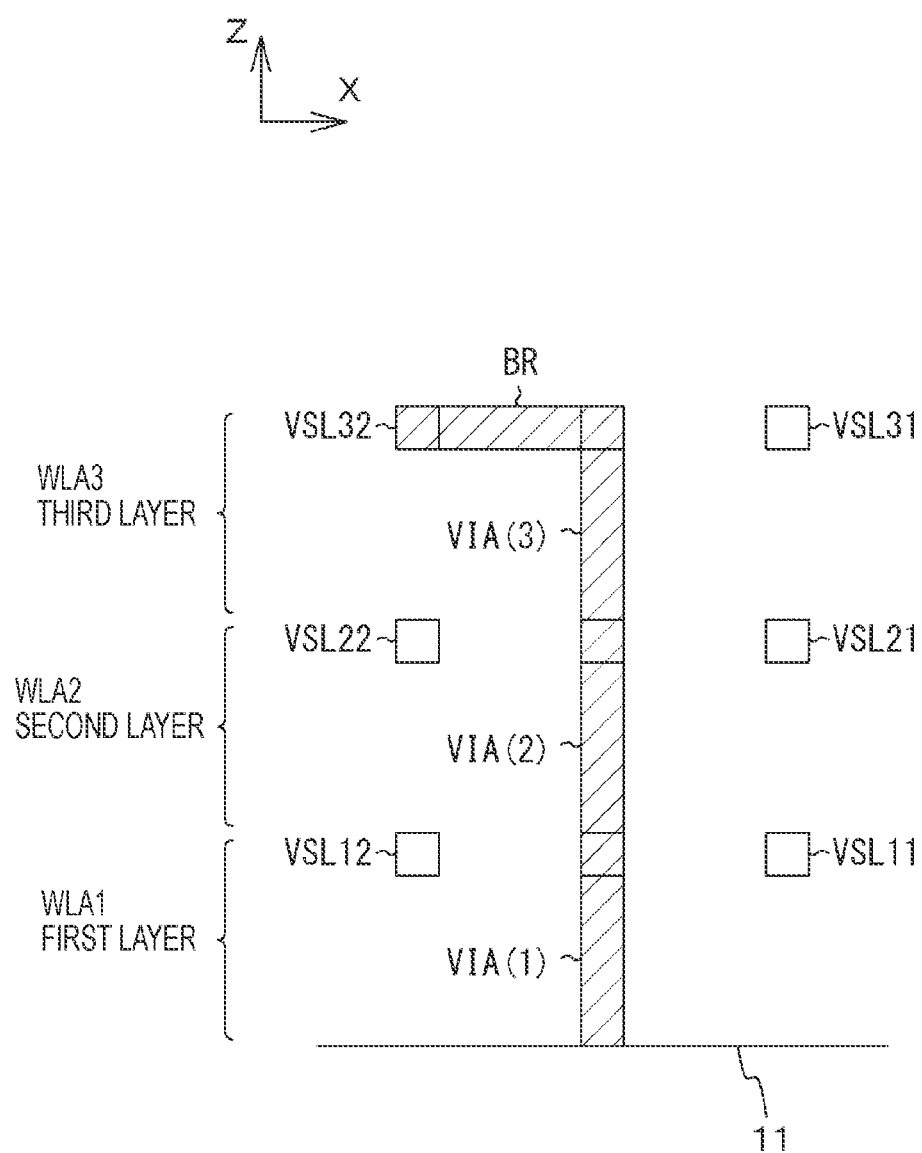
FIG. 19 is a schematic end view for describing the connection relationship between a vertical signal line VSL32 and the pixels.

FIG. 17 is a schematic perspective view for describing the connection relationship between vertical signal lines in the third wiring layer and pixels according to the second modification. FIG. 18 is a schematic end view for describing the connection relationship between the vertical signal line VSL31 and the pixels. FIG. 19 is a schematic end view for describing the connection relationship between the vertical signal line VSL32 and the pixels.

As shown in FIGS. 17 to 19, the vertical signal line VSL of the third layer is connected to a corresponding pixel 11 by a branch wiring BR of the third layer and vias provided in the first layer, the second layer, and the third layer. Since the connection relationship between the vertical signal line VSL of the second layer and the third layer and the pixel 11 is similar to the connection relationship described with reference to FIGS. 9, 10A, 10B, 11A, 11B, and 12, the description thereof will be omitted.

The second modification has been described above.

In the configurations shown in FIGS. 6, 7, 8, 9, 10A, 10B, 11A, 11B, 12, 13A, 13B, 14, 15, 16, 17, 18, and 19, the vias forming the connection portion provided in the wiring layers are arranged between two vertical signal lines VSL. Accordingly, the position where the via is connected to the pixel 11 is constant regardless of the pixel 11.

In a case where the configuration of the pixel circuit of each pixel 11 is constant, the position occupied by the selective transistor connected to the vertical signal line VSL in the pixel 11 is also constant. Accordingly, it is preferable that the position where the via is connected to the pixel 11 is constant regardless of the pixel 11. The configurations shown in FIGS. 6, 7, 8, 9, 10A, 10B, 11A, 11B, 12, 13A, 13B, 14, 15, 16, 17, 18, and 19 are suitable for such applications.

On the other hand, in some cases, one floating diffusion region FD may be shared by two pixels. In the case of such a shared pixel column configuration, the configuration of the pixel circuit changes alternately pixel by pixel. Therefore, it is preferable that the position where the via is connected to the pixel changes alternately pixel by pixel. A third modification suitable for such an application will be described.

Figure 20:
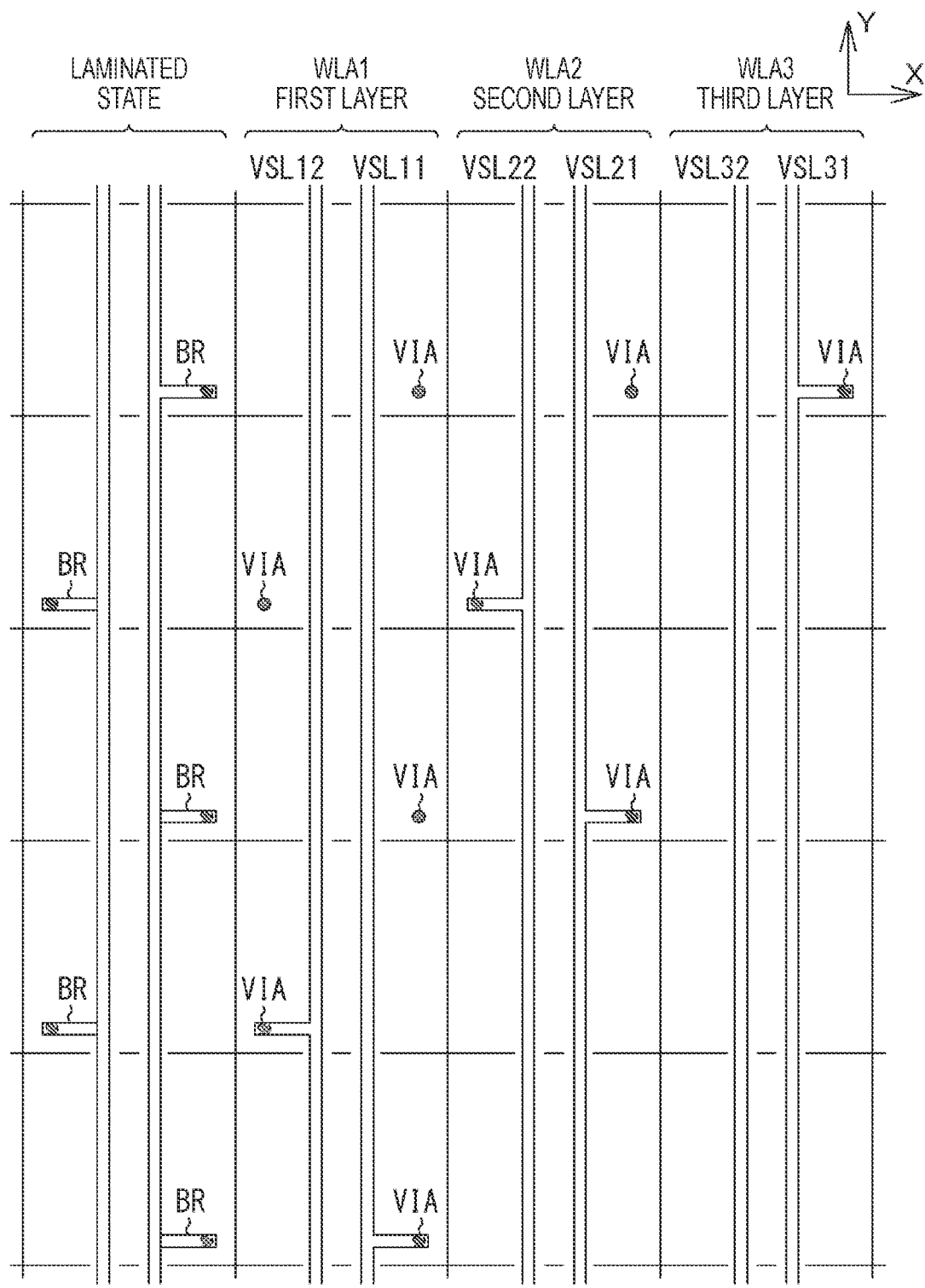
FIG. 20 is a schematic plan view for describing the relationship between the orthogonal projection in the laminated state of wiring layers and the structure of each layer according to a third modification.

FIG. 20 is a schematic plan view for describing the relationship between the orthogonal projection in the laminated state of wiring layers and the structure of each layer according to the third modification.

As shown in the drawing, in the third modification, the vias are arranged outside two vertical signal lines VSL. Additionally, the positions where the vias are connected to a pixel 11 are arranged alternately pixel 11 by pixel 11. The via and the vertical signal line VSL are connected by a branch wiring BR.

In the third modification, too, the vertical signal line VSL of the first layer is connected to the corresponding pixel 11 by the branch wiring BR of the first layer and the via provided in the first layer. The vertical signal line VSL of the second layer is connected to the corresponding pixel 11 by the branch wiring BR of the second layer and the vias provided in the first layer and the second layer. The vertical signal line VSL of the third layer is connected to the corresponding pixel 11 by the branch wiring BR of the third layer and the vias provided in the first layer, the second layer, and the third layer.

In the first embodiment including the various modifications described above, the number of vertical signal lines in each layer is basically limited to two. FIG. 21 shows the relationship between the total number of wiring layers and the total number of vertical signal lines with respect to the maximum number of wirings that can be arranged in each layer at the minimum pitch of the design rule.

Second Embodiment

A second embodiment also relates to an image sensor, an imaging device, and an electronic device according to the present disclosure.

In the first embodiment, the number of vertical signal lines arranged in a wiring layer is limited. In the second embodiment, three or more vertical signal lines can be arranged in a wiring layer.

Hereinafter, the structure of wiring layers used in an image sensor according to the second embodiment will be described with reference to the drawings. Since the configuration example of the image sensor according to the second embodiment is similar to the configuration example shown in FIG. 1, the description thereof will be omitted.

Figure 22:
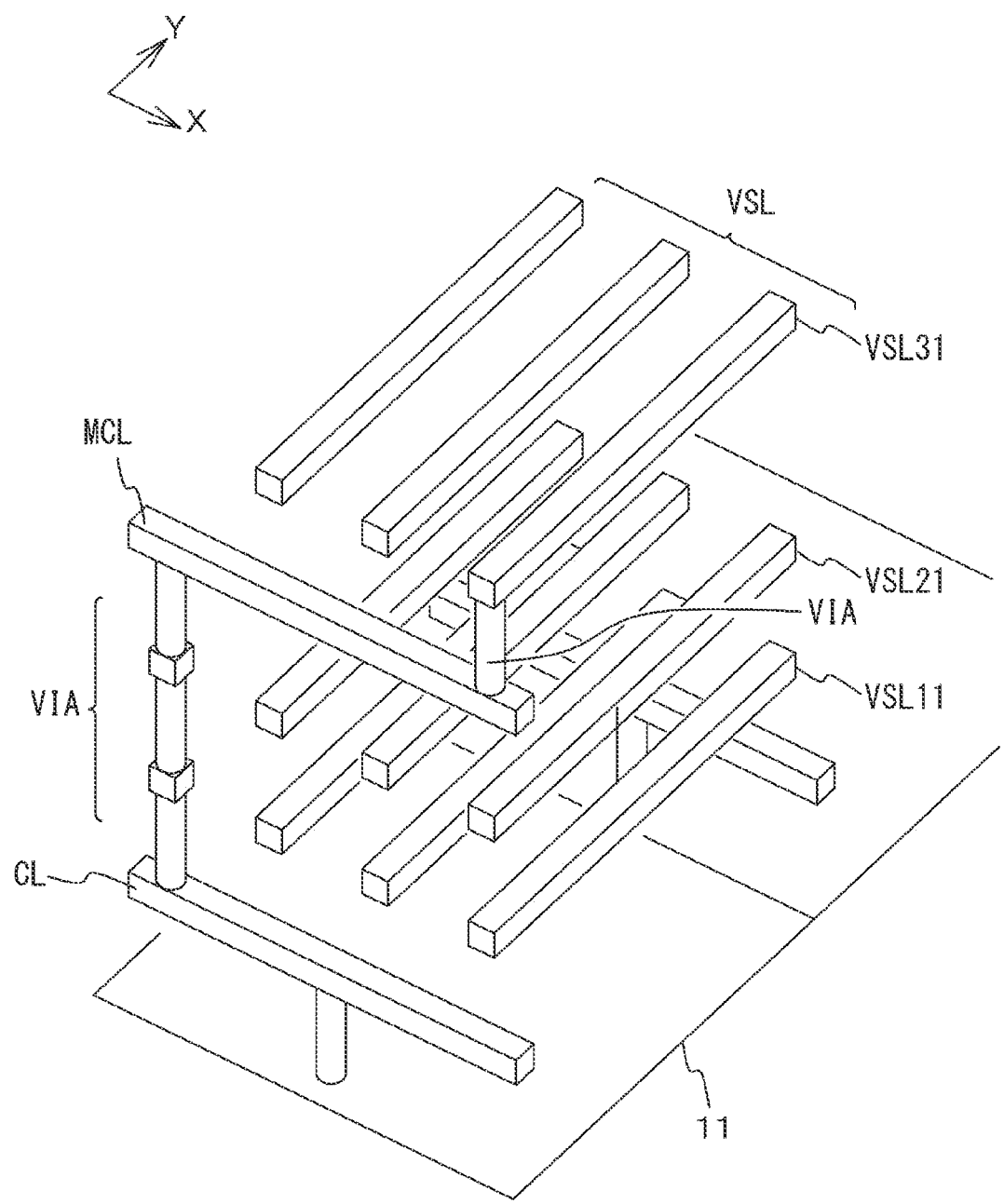
FIG. 22 is a schematic perspective view for describing the connection relationship between vertical signal lines in wiring layers and pixels used in an image sensor according to a second embodiment.
Figure 23:
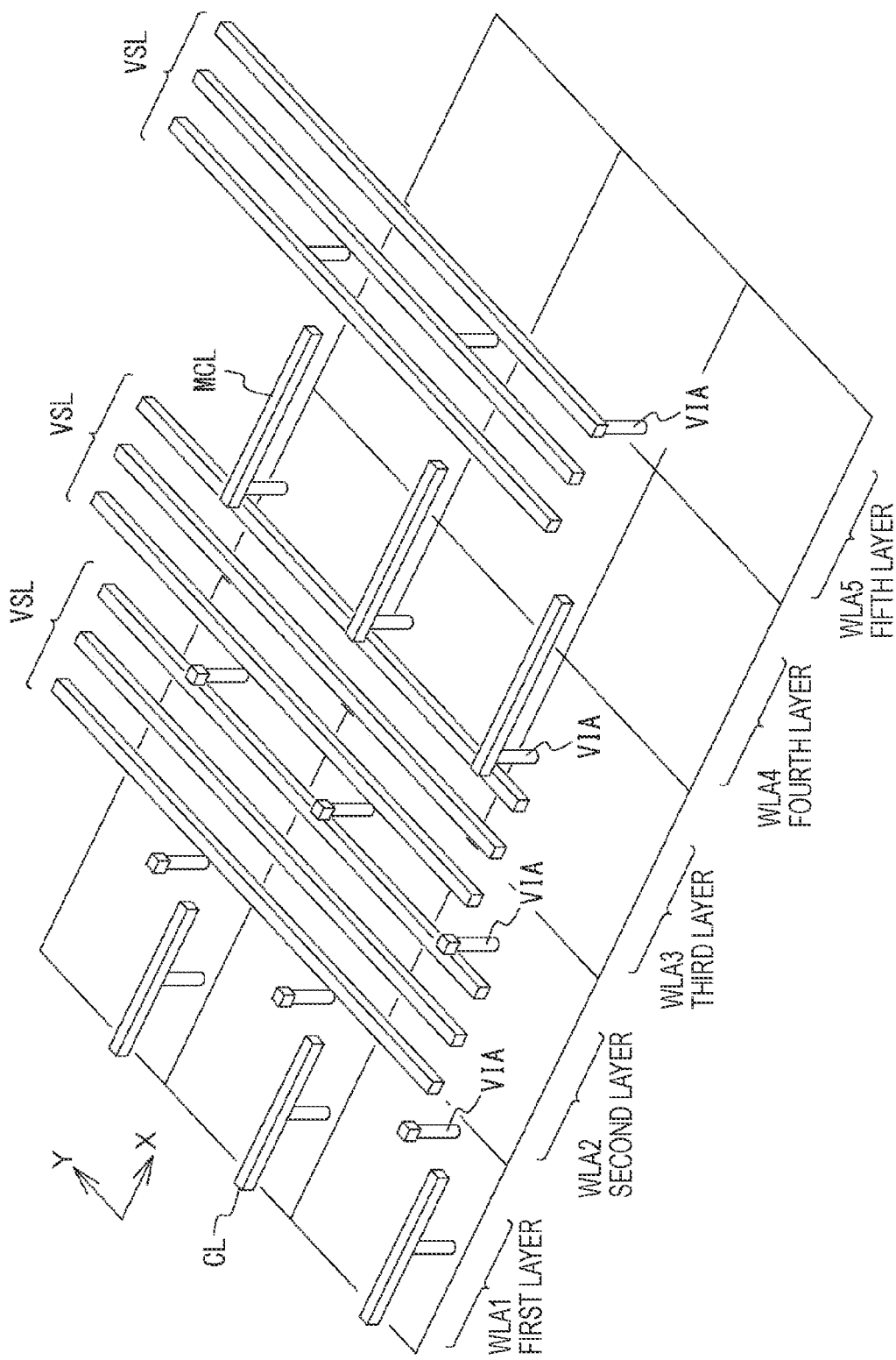
FIG. 23 is a schematic perspective view for describing the structure of each layer of the wiring layers used in the image sensor according to the second embodiment.
Figure 24:
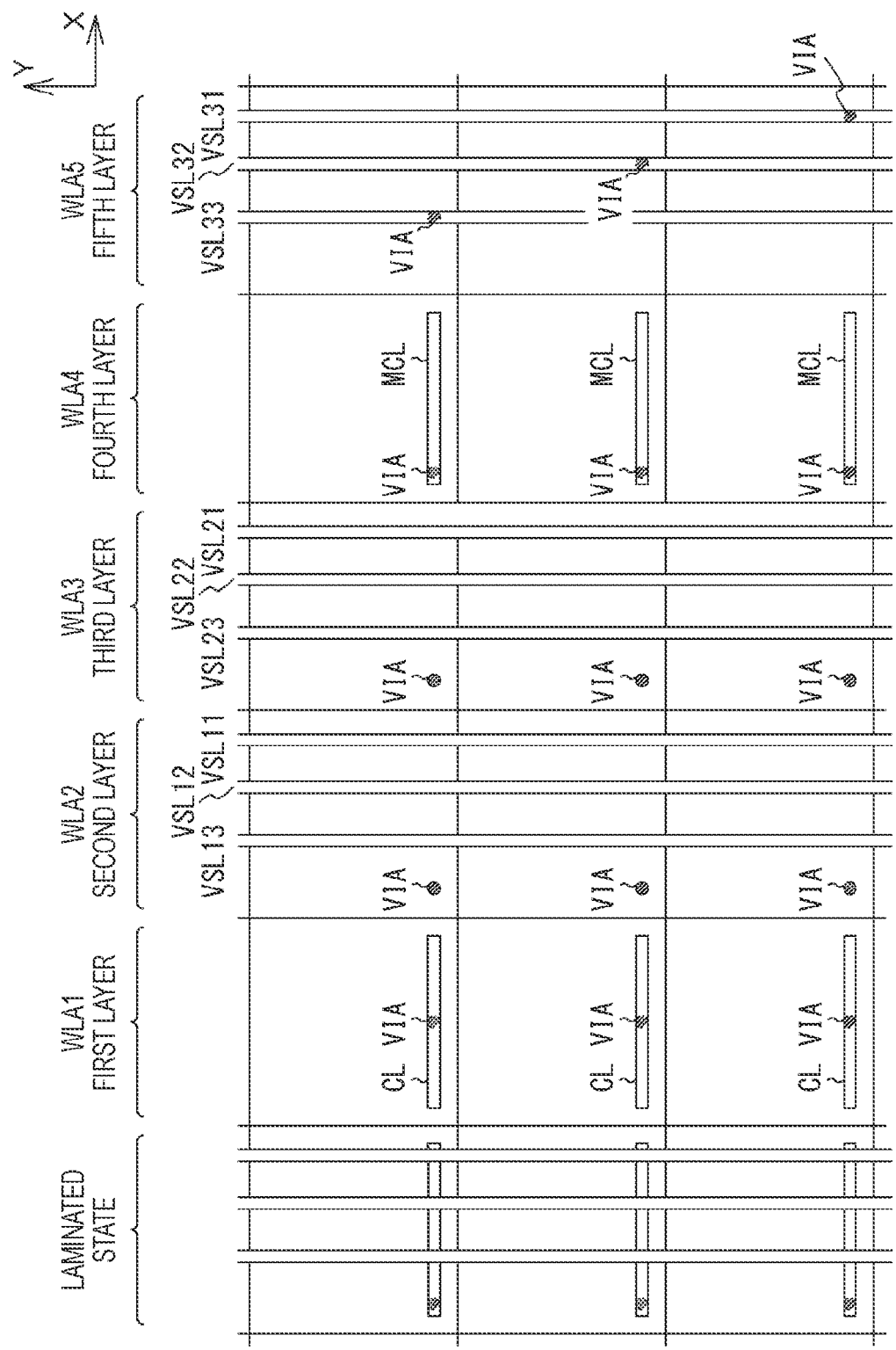
FIG. 24 is a schematic plan view for describing the relationship between the orthogonal projection in the laminated state of the wiring layers and the structure of each layer used in the image sensor according to the second embodiment.

FIG. 22 is a schematic perspective view for describing the connection relationship between vertical signal lines in wiring layers and pixels used in the image sensor according to the second embodiment. FIG. 23 is a schematic perspective view for describing the structure of each layer of the wiring layers. FIG. 24 is a schematic plan view for describing the relationship between the orthogonal projection in the laminated state of the wiring layers and the structure of each layer.

In the wiring layers used in the image sensor according to the second embodiment, too, multiple vertical signal lines VSL provided in pixel column units are arranged in multiple wiring layers laminated on a pixel 11. In the example shown in the drawings, the wiring layers have a five-layer configuration, and three vertical signal lines VSL are arranged in each of a second layer WLA2, a third layer WLA3, and a fifth layer WLA5. As shown in FIG. 24, the vertical signal lines VSL are arranged so that their orthogonal projections on multiple wiring layers all overlap.

A via connected to the vertical signal line VSL is provided as a connection portion in the wiring layer. In addition to this, in the second embodiment, in some wiring layers (fourth layer and first layer in example shown in drawings) among the multiple laminated wiring layers, a relay line extending in a direction orthogonal to the direction in which the vertical signal line VSL extends is arranged, as a connection portion, for each pixel 11. In particular, in a first wiring layer WLA1 adjacent to the pixel 11 among the multiple laminated wiring layers, a relay line extending in a direction orthogonal to the direction in which the vertical signal line VSL extends is arranged, as a connection portion, for each pixel 11 while being connected to the pixel 11.

For convenience of notation, the relay line provided in the first wiring layer WLA1 is represented by reference sign CL, and the relay line provided in other wiring layers is represented by reference sign MCL. The same applies to other embodiments described later.

Next, the connection relationship between the vertical signal line VSL and the pixel 11 will be described.

Figure 25:
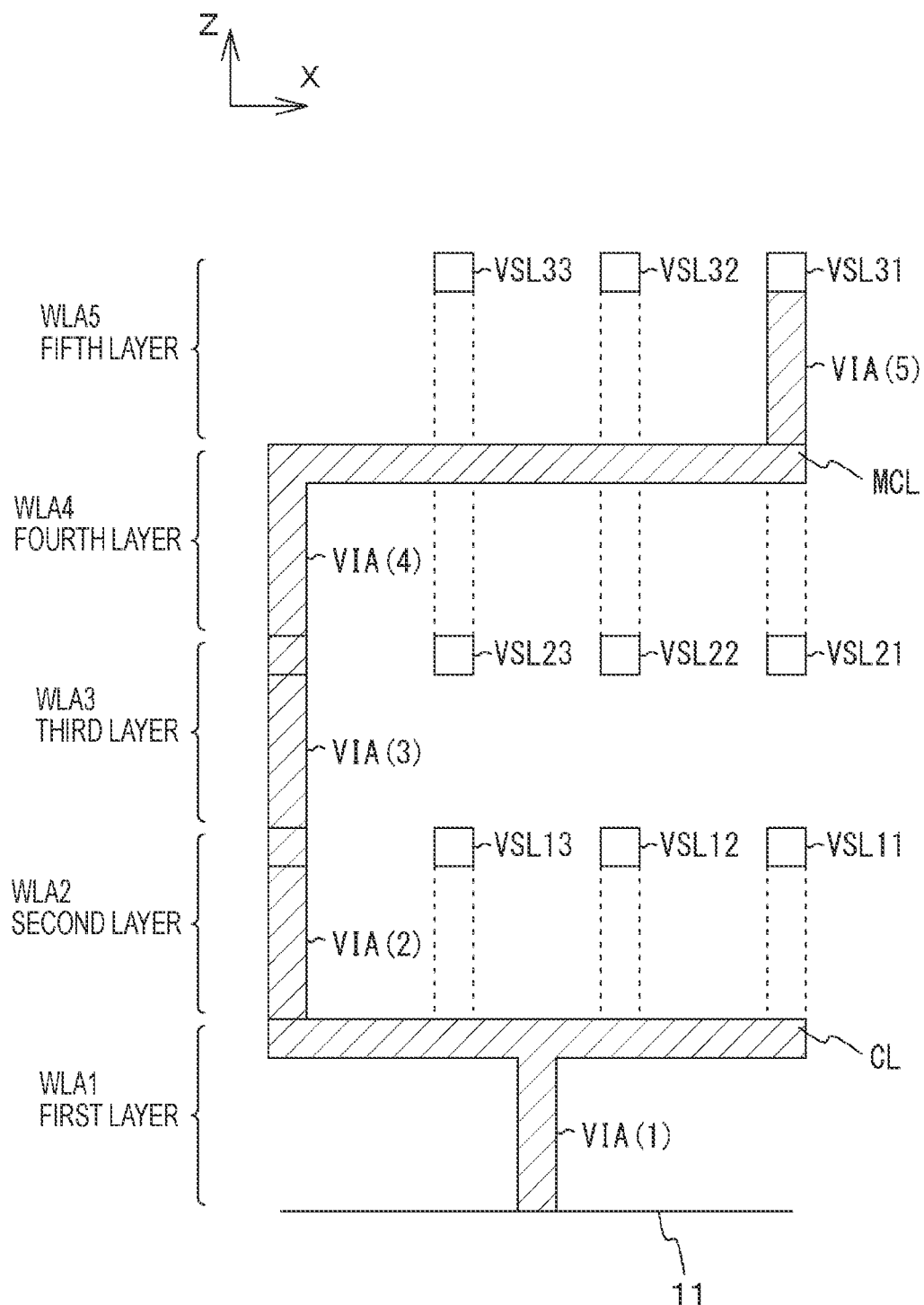
FIG. 25 is a schematic end view for describing the connection relationship between a vertical signal line VSL31 and the pixels shown in FIG. 22.

FIG. 25 is a schematic end view for describing the connection relationship between a vertical signal line VSL31 shown in FIG. 22 and the pixels.

As shown in the drawing, the vertical signal line VSL31 of the fifth layer is connected to one end of the relay line MCL provided in the fourth layer through a via provided in the fifth layer. Then, the other end of the relay line MCL is connected to the relay line CL of the first layer through vias provided in the fourth layer, the third layer, and the second layer. In this way, the vertical signal line VSL31 of the fifth layer is connected to the corresponding pixel 11 through the vias and the relay lines. The same applies to other vertical signal lines VSL32 and VSL33 of the fifth layer.

Figure 26:
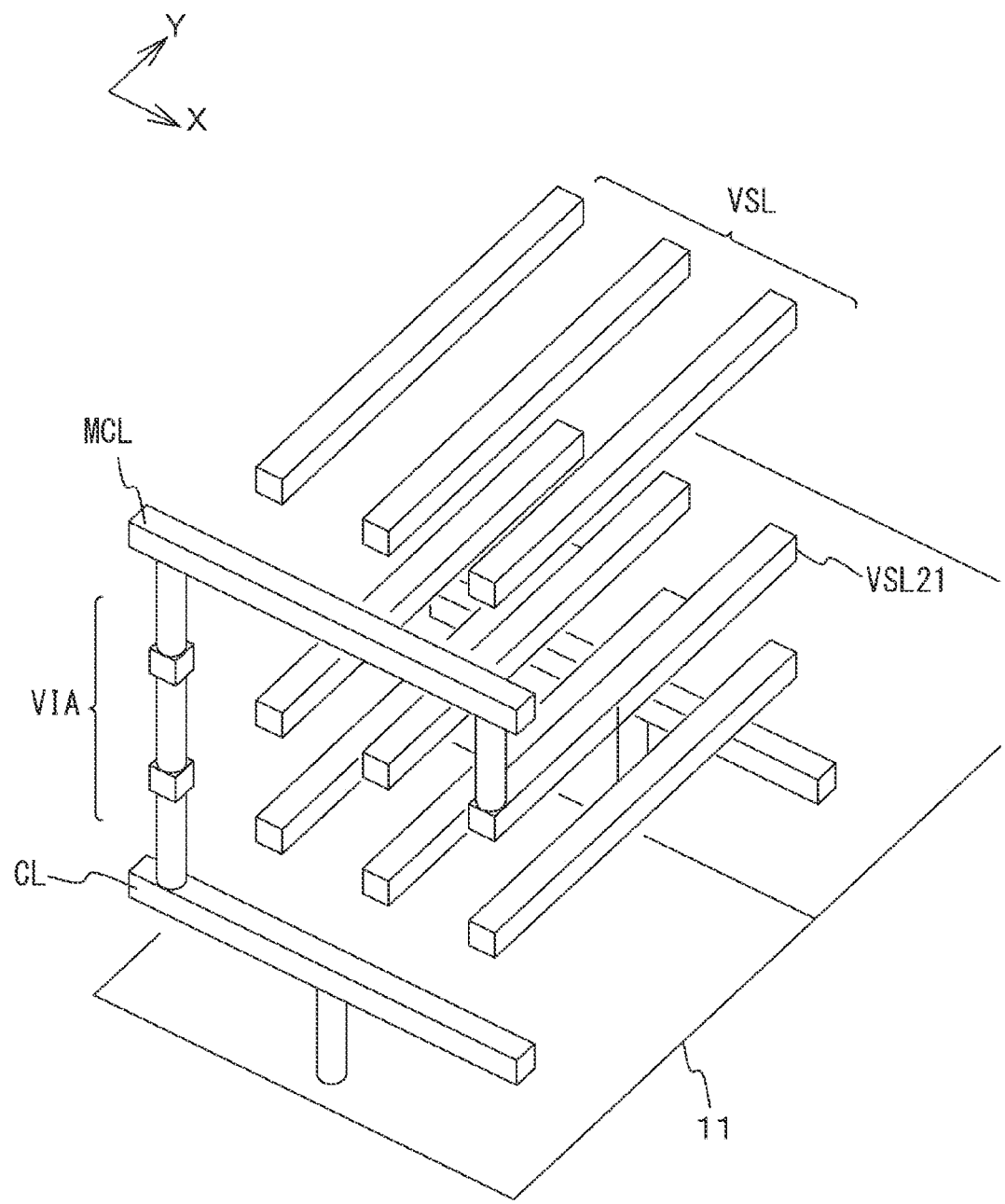
FIG. 26 is a schematic perspective view for describing the connection relationship between vertical signal lines in wiring layers and pixels.
Figure 27:
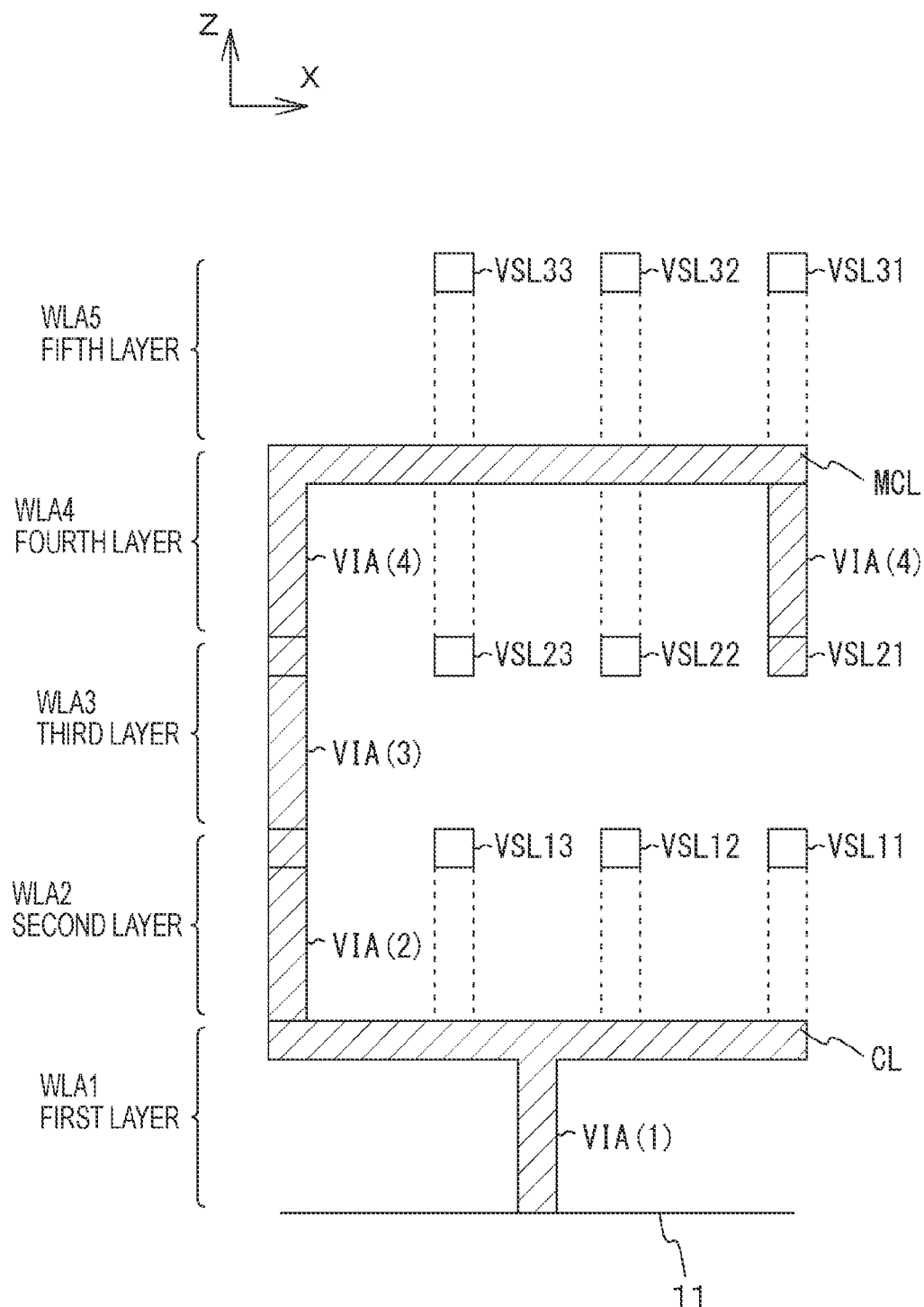
FIG. 27 is a schematic end view for describing the connection relationship between a vertical signal line VSL21 and the pixels shown in FIG. 26.

FIG. 26 is a schematic perspective view for describing the connection relationship between vertical signal lines in wiring layers and pixels. FIG. 27 is a schematic end view for describing the connection relationship between a vertical signal line VSL21 and the pixels shown in FIG. 26.

As shown in the drawings, the vertical signal line VSL21 of the third layer is connected to one end of the relay line MCL provided in the fourth layer through a via provided in the fourth layer. Then, the other end of the relay line MCL is connected to the relay line CL of the first layer through vias provided in the fourth layer, the third layer, and the second layer. In this way, the vertical signal line VSL21 of the third layer is connected to the corresponding pixel 11 through the vias and the relay lines. The same applies to other vertical signal lines VSL22 and VSL23 of the third layer.

As described above, the fourth wiring layer WLA4 in which the relay line MCL is arranged is provided for connection with the vertical signal lines in the upper (i.e., fifth) wiring layer WLA5 and the lower (i.e., third) wiring layer WLA3 which are laminated adjacent to the wiring layer in which the relay line MCL is arranged. Note that in some cases, the wiring layer in which the relay line is arranged can be provided for connection with the vertical signal lines in one of the upper wiring layer or the lower wiring layer which are laminated adjacent to the wiring layer in which the relay line is arranged.

Figure 28:
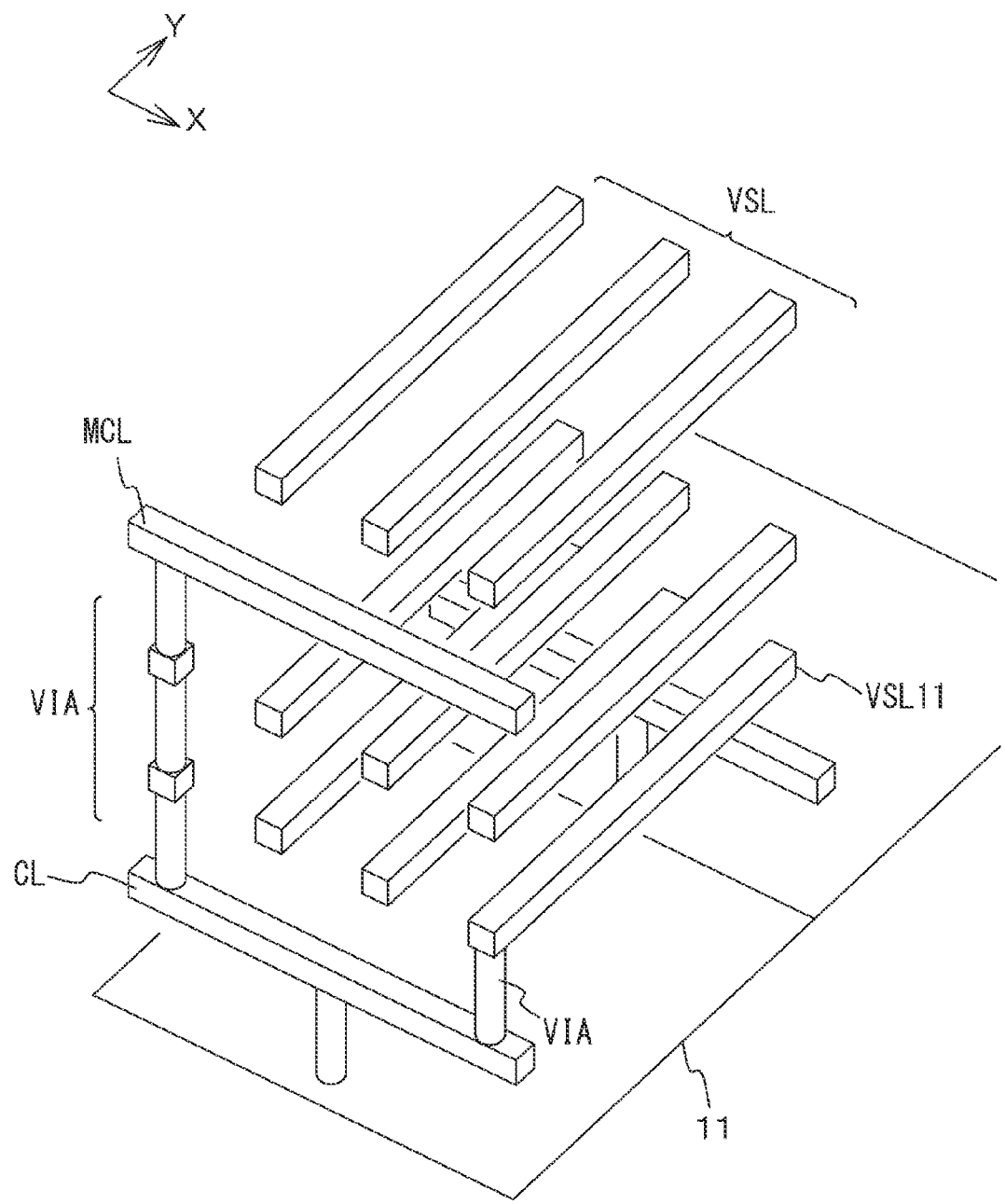
FIG. 28 is a schematic perspective view for describing the connection relationship between vertical signal lines in wiring layers and pixels.
Figure 29:
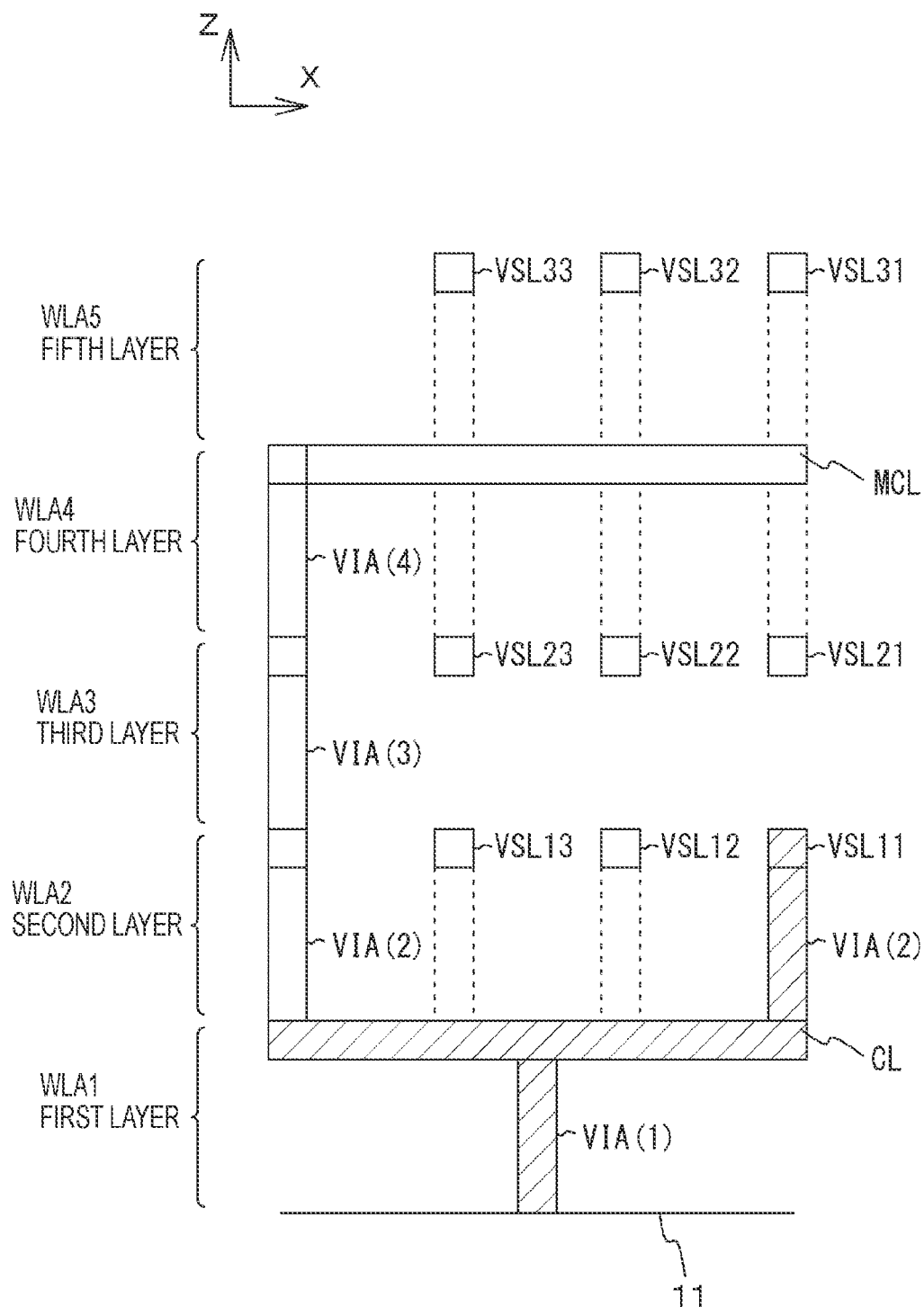
FIG. 29 is a schematic end view for describing the connection relationship between a vertical signal line VSL11 and the pixels shown in FIG. 28.

FIG. 28 is a schematic perspective view for describing the connection relationship between vertical signal lines in wiring layers and pixels. FIG. 29 is a schematic end view for describing the connection relationship between a vertical signal line VSL11 and the pixels shown in FIG. 28.

As shown in the drawings, the vertical signal line VSL11 of the second layer is connected to the relay line CL of the first layer through a via provided in the second layer. In this way, the vertical signal line VSL11 of the second layer is connected to the corresponding pixel 11 through the via and the relay line. The same applies to other vertical signal lines VSL12 and VSL13 of the third layer.

In the second embodiment, while a relay line needs to be provided in some of the wiring layers, two or more vertical signal lines can be arranged in one wiring layer. FIG. 30 shows the relationship between the total number of wiring layers and the total number of vertical signal lines with respect to the maximum number of wirings that can be arranged in each layer at the minimum pitch of the design rule.

Third Embodiment

A third embodiment also relates to an image sensor, an imaging device, and an electronic device according to the present disclosure.

In the example shown in FIGS. 22 to 24 in the second embodiment, the vertical signal lines are arranged so that their orthogonal projections overlap in all of the second layer, the third layer, and the fifth layer provided with the vertical signal lines.

However, in some cases, it is conceivable to reduce the capacitance generated between the wirings by arranging the vertical signal lines in the upper wiring layer and the lower wiring layer of the wiring layer provided with a relay line so that their orthogonal projections do not overlap.

Hereinafter, the structure of wiring layers used in an image sensor according to the third embodiment will be described with reference to the drawings. Note that since the configuration example of the image sensor according to the third embodiment is similar to the configuration example shown in FIG. 1, the description thereof will be omitted.

Figure 31:
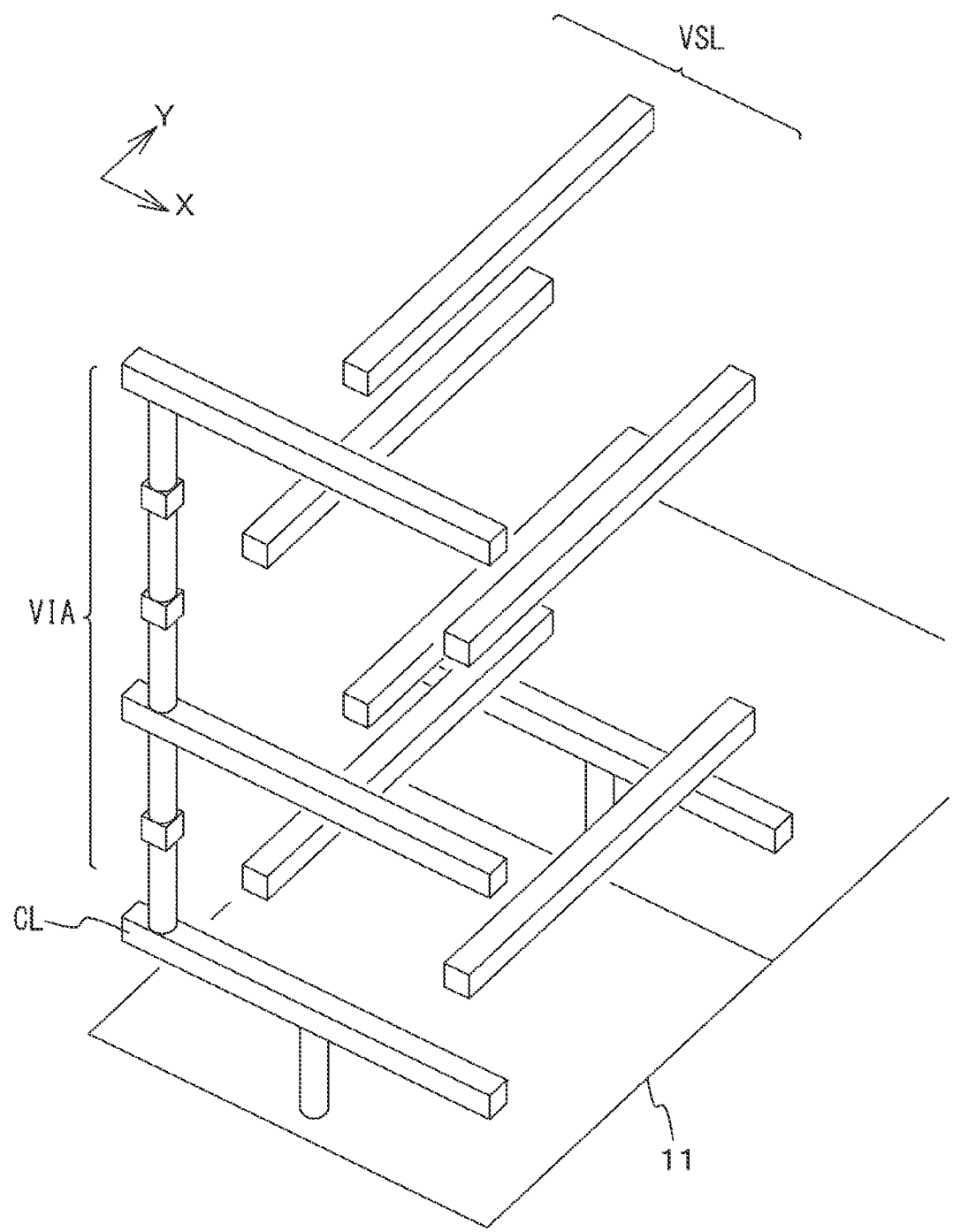
FIG. 31 is a schematic perspective view for describing the connection relationship between vertical signal lines in wiring layers and pixels used in an image sensor according to a third embodiment.
Figure 32:
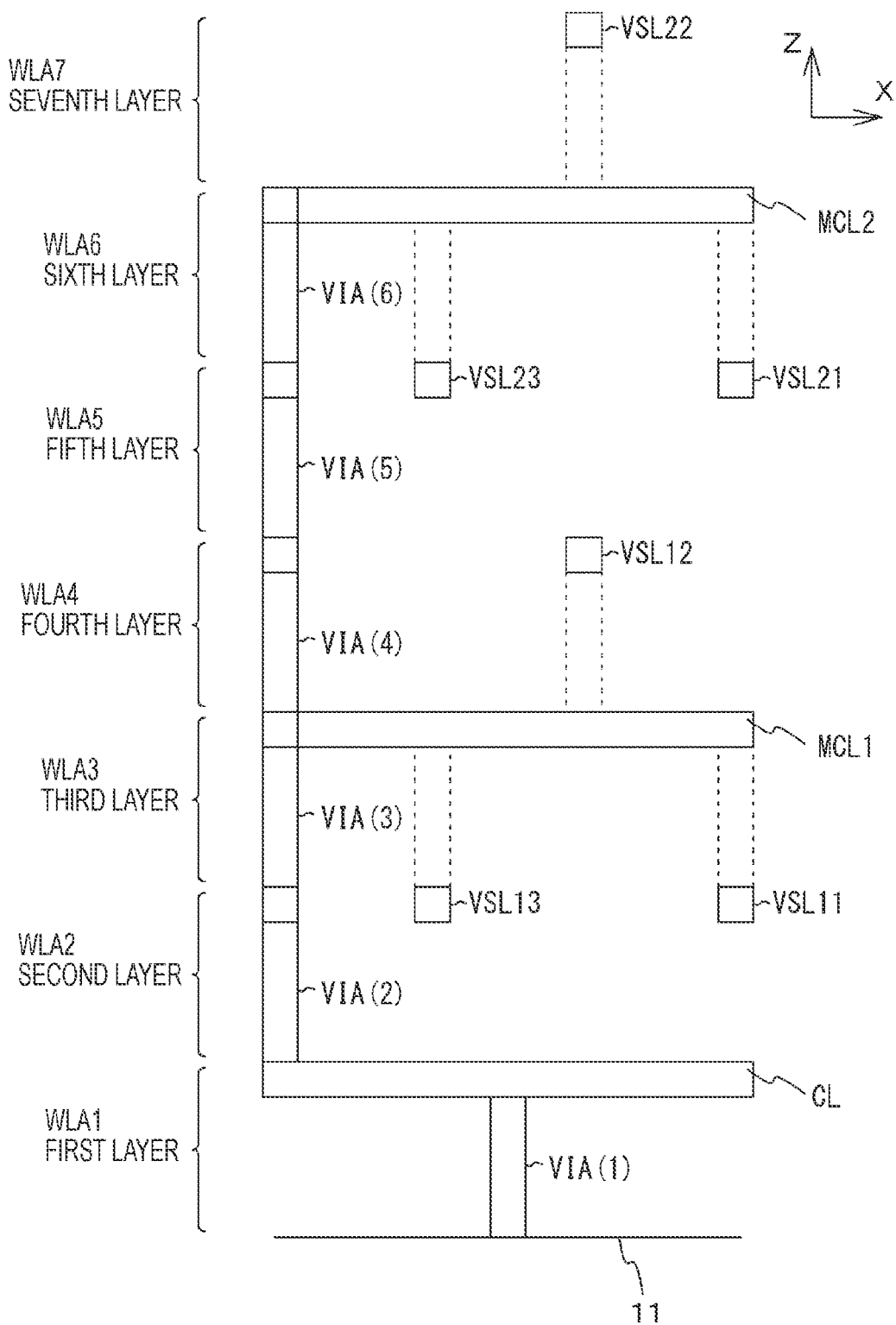
FIG. 32 is a schematic end view for describing the structure of each layer of the wiring layers used in the image sensor according to the third embodiment.

FIG. 31 is a schematic perspective view for describing the connection relationship between vertical signal lines in wiring layers and pixels used in the image sensor according to the third embodiment. FIG. 32 is a schematic end view for describing the structure of each layer of the wiring layers.

In the wiring layers used in the image sensor according to the third embodiment, too, multiple vertical signal lines VSL provided in pixel column units are arranged in multiple wiring layers laminated on a pixel 11. In the example shown in the drawings, the wiring layers have a seven-layer configuration, and vertical signal lines VSL are arranged in each of the second layer, the fourth layer, the fifth layer, and the seventh layer.

A via connected to the vertical signal line VSL is provided as a connection portion in the wiring layer. In addition to this, in the third embodiment, in some wiring layers (sixth layer WLA6, third layer WLA3, and first layer WLA1 in example shown in drawings) among the multiple laminated wiring layers, a relay line extending in a direction orthogonal to the direction in which the vertical signal line VSL extends is arranged, as a connection portion, for each pixel 11. In particular, in the first wiring layer adjacent to the pixel 11 among the multiple laminated wiring layers, a relay line extending in a direction orthogonal to the direction in which the vertical signal line VSL extends is arranged, as a connection portion, for each pixel 11 while being connected to the pixel 11.

The sixth and third wiring layers in which the relay line is arranged are provided for connection with the vertical signal lines VSL in the upper wiring layer and the lower wiring layer which are laminated adjacent to the wiring layer in which the relay line is arranged. Then, the vertical signal lines VSL in the upper wiring layer and the lower wiring layer are arranged so that the orthogonal projections of the vertical signal lines VSL on the wiring layers do not overlap.

Then, the vertical signal lines VSL provided on the second and fifth layers are arranged so that their orthogonal projections overlap. Additionally, the vertical signal lines VSL provided on the fourth and seventh layers are arranged so that their orthogonal projections overlap. As described above, in the third embodiment, the vertical signal lines of the wiring layers can be arranged so that their orthogonal projections overlap, and the capacitance generated between the wirings can be reduced as well.

Fourth Embodiment

A fourth embodiment also relates to an image sensor, an imaging device, and an electronic device according to the present disclosure.

In the second embodiment and the third embodiment, it is necessary to provide relay lines in multiple wiring layers. However, in a case where there is a margin between vertical signal lines arranged in a wiring layer, the number of wiring layers provided with a relay line can be reduced by arranging the wirings so as to detour around vias.

Figure 33:
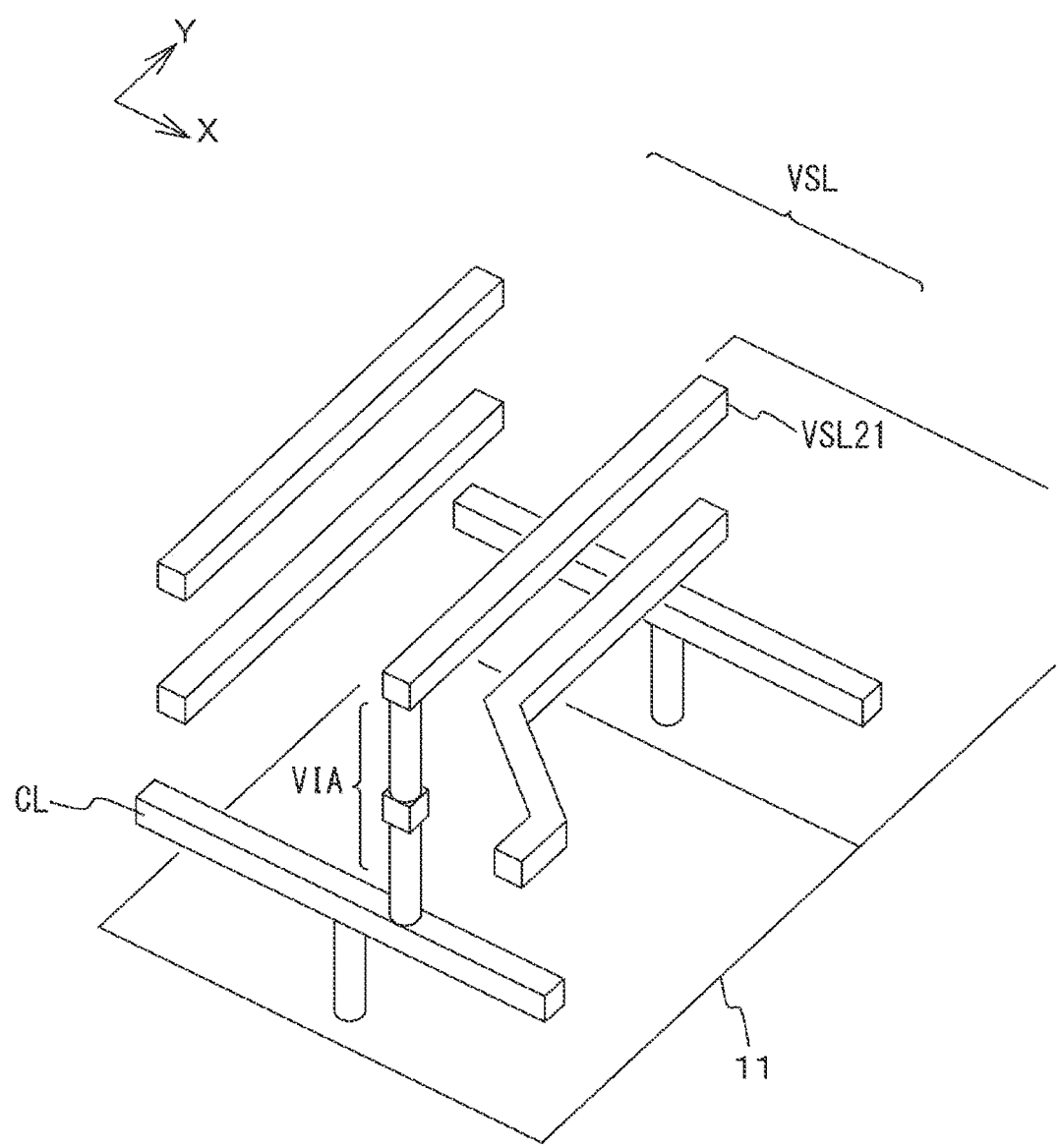
FIG. 33 is a schematic perspective view for describing the connection relationship between vertical signal lines in wiring layers and pixels used in an image sensor according to a fourth embodiment.
Figure 34:
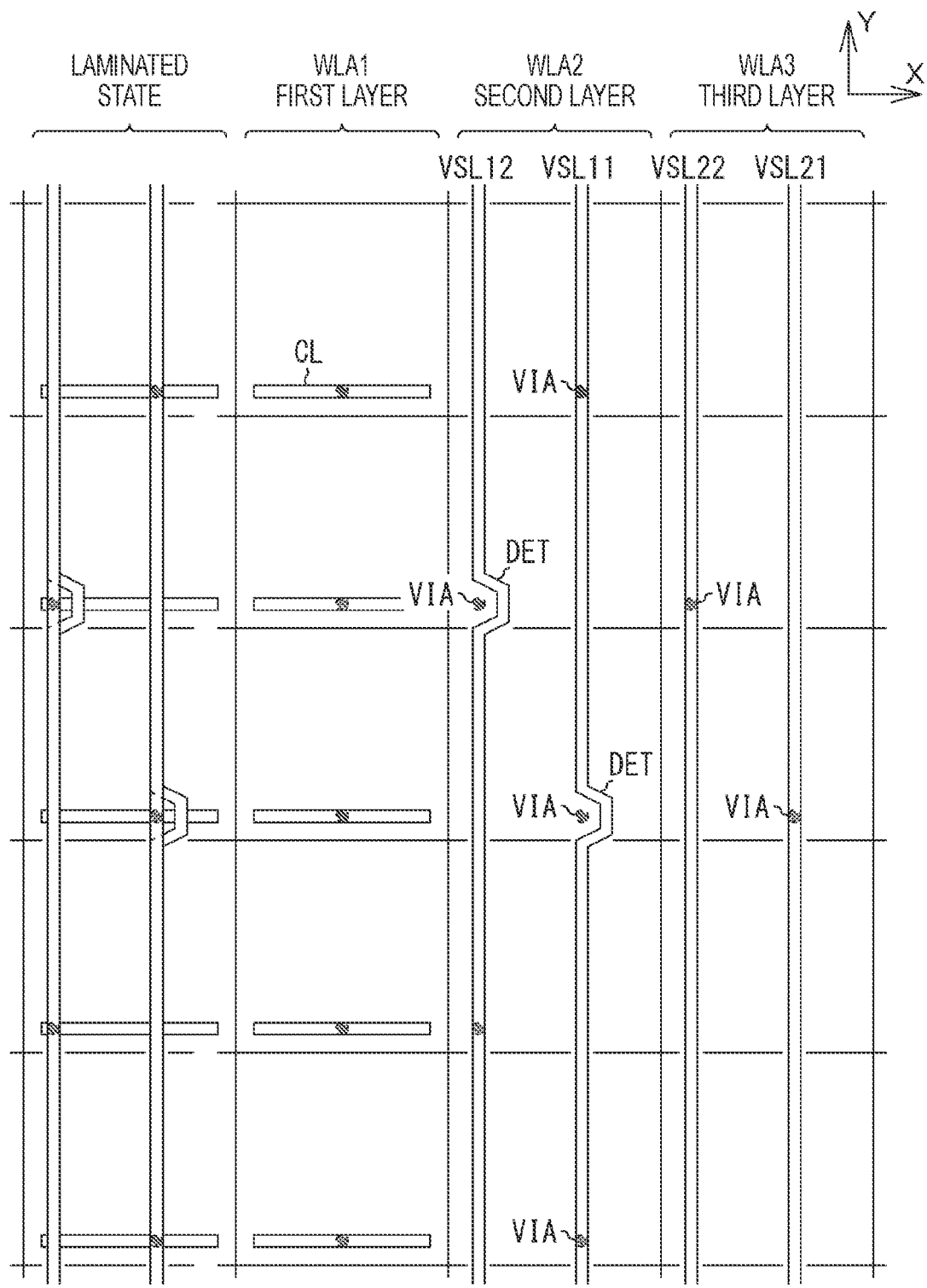
FIG. 34 is a schematic plan view for describing the relationship between the orthogonal projection in the laminated state of the wiring layers and the structure of each layer used in the image sensor according to the fourth embodiment.

FIG. 33 is a schematic perspective view for describing the connection relationship between the vertical signal lines in wiring layers and pixels used in the image sensor according to the fourth embodiment. FIG. 34 is a schematic plan view for describing the relationship between the orthogonal projection in the laminated state of the wiring layers and the structure of each layer.

In the wiring layers used in the image sensor according to the fourth embodiment, too, multiple vertical signal lines VSL provided in pixel column units are arranged in multiple wiring layers laminated on a pixel 11. In the example shown in the drawings, the wiring layers have a three-layer configuration, and the vertical signal lines VSL are arranged in each of a second layer WLA2 and a third layer WLA3. As shown in FIG. 34, the vertical signal lines VSL are arranged so that their orthogonal projections on multiple wiring layers overlap.

A via connected to the vertical signal line VSL is provided as a connection portion in the wiring layer. In addition to this, in the fourth embodiment, in the first wiring layer adjacent to the pixel 11 among the multiple laminated wiring layers, a relay line CL extending in a direction orthogonal to the direction in which the vertical signal line VSL extends is arranged, as a connection portion, for each pixel 11 while being connected to the pixel 11.

As shown in the drawings, a vertical signal line VSL21 of the third layer is connected to the relay line CL of the first layer through vias provided in the third layer and the fourth layer. In this way, the vertical signal line VSL21 of the third layer is connected to the corresponding pixel 11 through the vias and the relay lines. The same applies to the other vertical signal line VSL22 of the third layer.

The via of the second layer involved in the connection of the vertical signal line VSL21 of the third layer is not involved in the connection of a vertical signal line VSL11 of the second layer to the pixel 11. Similarly, a via in the second layer involved in the connection of the vertical signal line VSL22 of the third layer is not involved in the connection of a vertical signal line VSL12 of the second layer to the pixel 11. Accordingly, as shown in FIG. 5, the vertical signal lines VSL11 and VSL12 are arranged so as to detour around the via part that is not involved in the connection to the pixel 11. Reference sign DET indicates a detour portion of the vertical signal line VSL.

An example in which the wiring layers have a three-layer configuration has been described above. However, in the fourth embodiment, the number of vertical signal lines can be increased without limitation by increasing the number of wiring layers to be laminated. Additionally, in some cases, the capacitance can be reduced by avoiding overlap of orthogonal projections of vertical signal lines with adjacent wiring layers.

In the fourth embodiment, while a detour portion needs to be provided in the vertical signal line, the number of wiring layers provided with a relay line can be reduced. FIG. 35 shows the relationship between the total number of wiring layers and the total number of vertical signal lines with respect to the maximum number of wirings that can be arranged in each layer at the minimum pitch of the design rule.

Fifth Embodiment

A fifth embodiment also relates to an image sensor, an imaging device, and an electronic device according to the present disclosure.

It is also possible to appropriately combine the above-mentioned first to fourth embodiments. As the fifth embodiment, a mode in which the first embodiment and the second embodiment are combined will be described.

Figure 36:
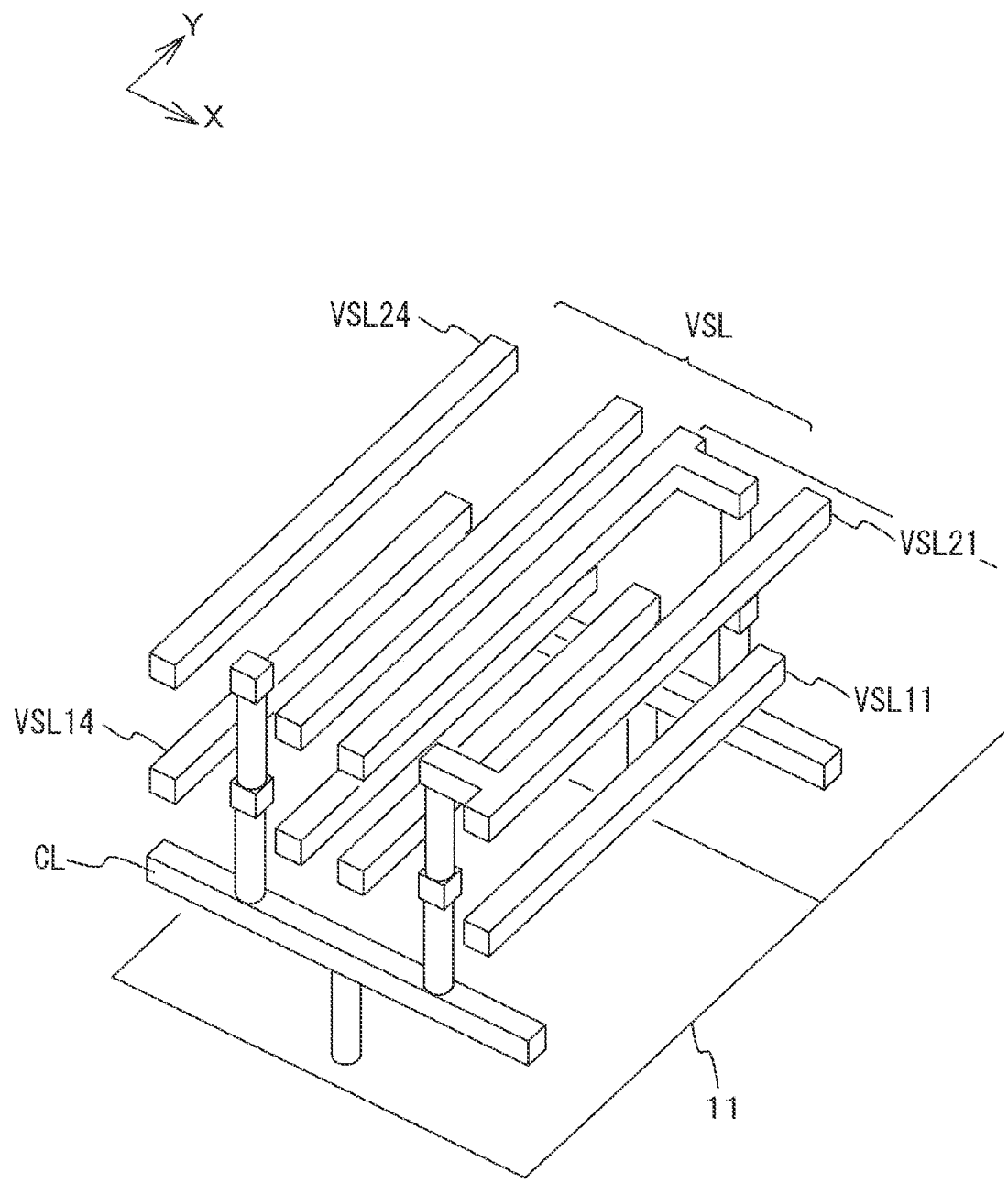
FIG. 36 is a schematic perspective view for describing the connection relationship between vertical signal lines in wiring layers and pixels used in an image sensor according to a fifth embodiment.
Figure 37:
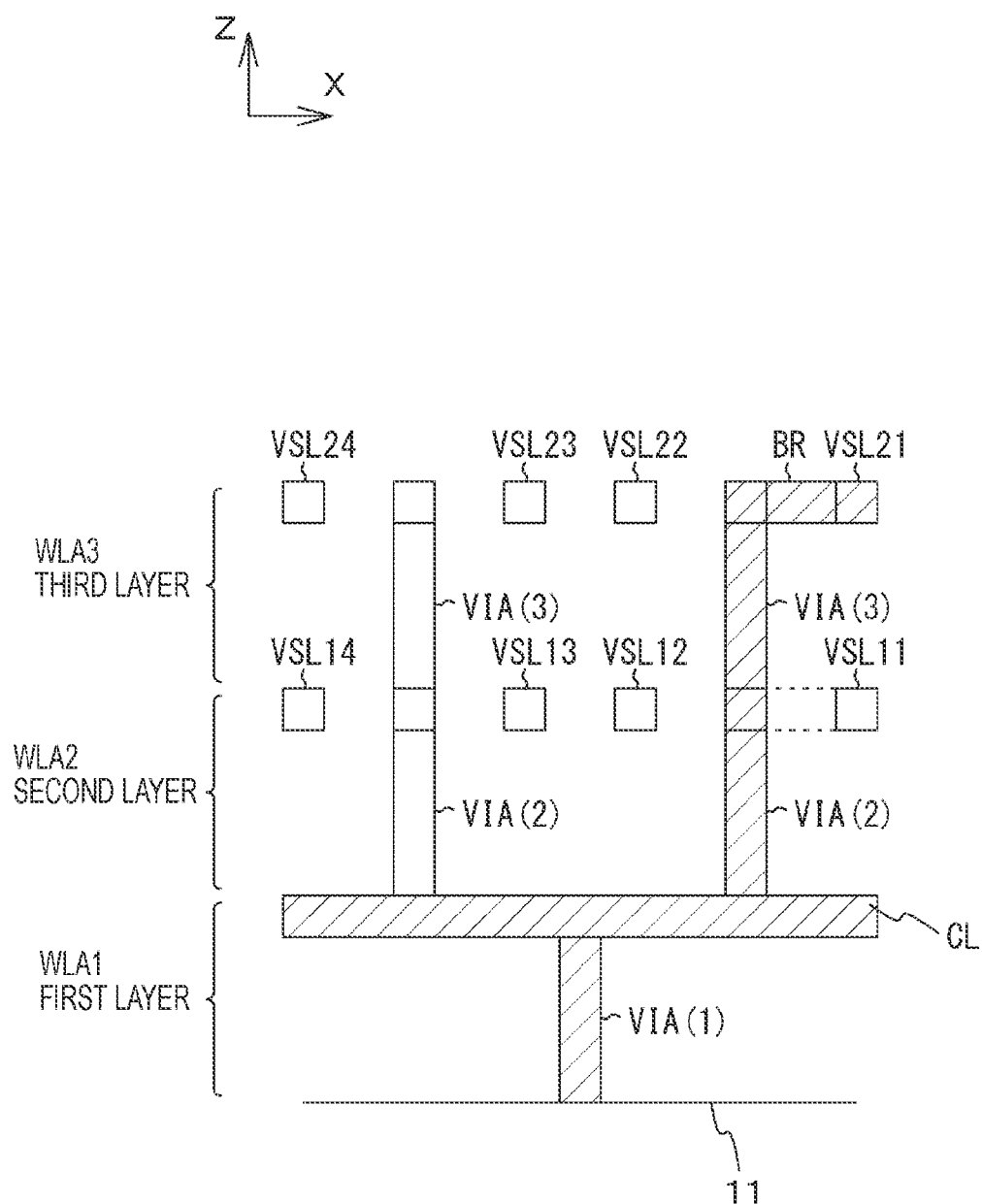
FIG. 37 is a schematic end view for describing the connection relationship between a vertical scanning line VSL21 and the pixels shown in FIG. 36.

FIG. 36 is a schematic perspective view for describing the connection relationship between vertical signal lines in wiring layers and pixels used in the image sensor according to the fifth embodiment. FIG. 37 is a schematic end view for describing the connection relationship between a vertical scanning line VSL21 and the pixels shown in FIG. 36.

In the wiring layers used in the image sensor according to the fifth embodiment, too, multiple vertical signal lines VSL provided in pixel column units are arranged in multiple wiring layers laminated on a pixel 11. In the example shown in the drawings, the wiring layers have a three-layer configuration, and the vertical signal lines VSL are arranged in each of a second layer WLA2 and a third layer WLA3. Additionally, the vertical signal lines VSL are arranged so that their orthogonal projections on the wiring layers overlap.

A via connected to the vertical signal line VSL is provided as a connection portion in the wiring layer. In addition to this, in the fifth embodiment, in the first wiring layer adjacent to the pixel 11 among the multiple laminated wiring layers, a relay line CL extending in a direction orthogonal to the direction in which the vertical signal line VSL extends is arranged, as a connection portion, for each pixel 11 while being connected to the pixel 11.

As shown in the drawings, a vertical signal line VSL21 of the third layer is connected to the relay line CL by a branch wiring BR of the third layer and vias provided in the second layer and the third layer. The same applies to other vertical signal lines VSL22, VSL23, and VSL24 of the third layer.

Note that although omitted from the drawings, vertical signal lines VSL11, VSL12, VSL13, and VSL14 of the second layer are connected to the relay line CL by branch wiring BR of the second layer and via provided in the second layer.

In the fifth embodiment, the number of vertical signal lines arranged in a wiring layer can be increased, and the number of wiring layers provided with a relay line can be reduced. FIG. 38 shows the relationship between the total number of wiring layers and the total number of vertical signal lines with respect to the maximum number of wirings that can be arranged in each layer at the minimum pitch of the design rule.

Sixth Embodiment

A sixth embodiment also relates to an image sensor, an imaging device, and an electronic device according to the present disclosure.

In the second embodiment to the fifth embodiment, in the first wiring layer adjacent to the pixel, a relay line CL extending in a direction orthogonal to the direction in which the vertical signal line extends is arranged for each pixel while being connected to the pixel.

In these examples, the relay line CL is arranged long enough to cross all multiple vertical signal lines. However, in this configuration, the parasitic capacitance between the relay line CL and a vertical signal line VSL becomes large, which can be a factor of lengthening the settling time of the pixel signal.

Hence, in the sixth embodiment, in the wiring layer adjacent to the pixel among the multiple laminated wiring layers, a relay line is arranged so as to cross only the vertical signal line VSL in a range that can be related to the connection. Moreover, the configuration further includes a shield wiring that is arranged so as to cross only the vertical signal line VSL in a range that cannot be related to the connection, extends along the same line as the relay line, and is applied with a predetermined fixed voltage. By providing the shield wiring, a noise reduction effect can be enhanced.

Here, the sixth embodiment will be described as a modification of the fifth embodiment.

Figure 39:
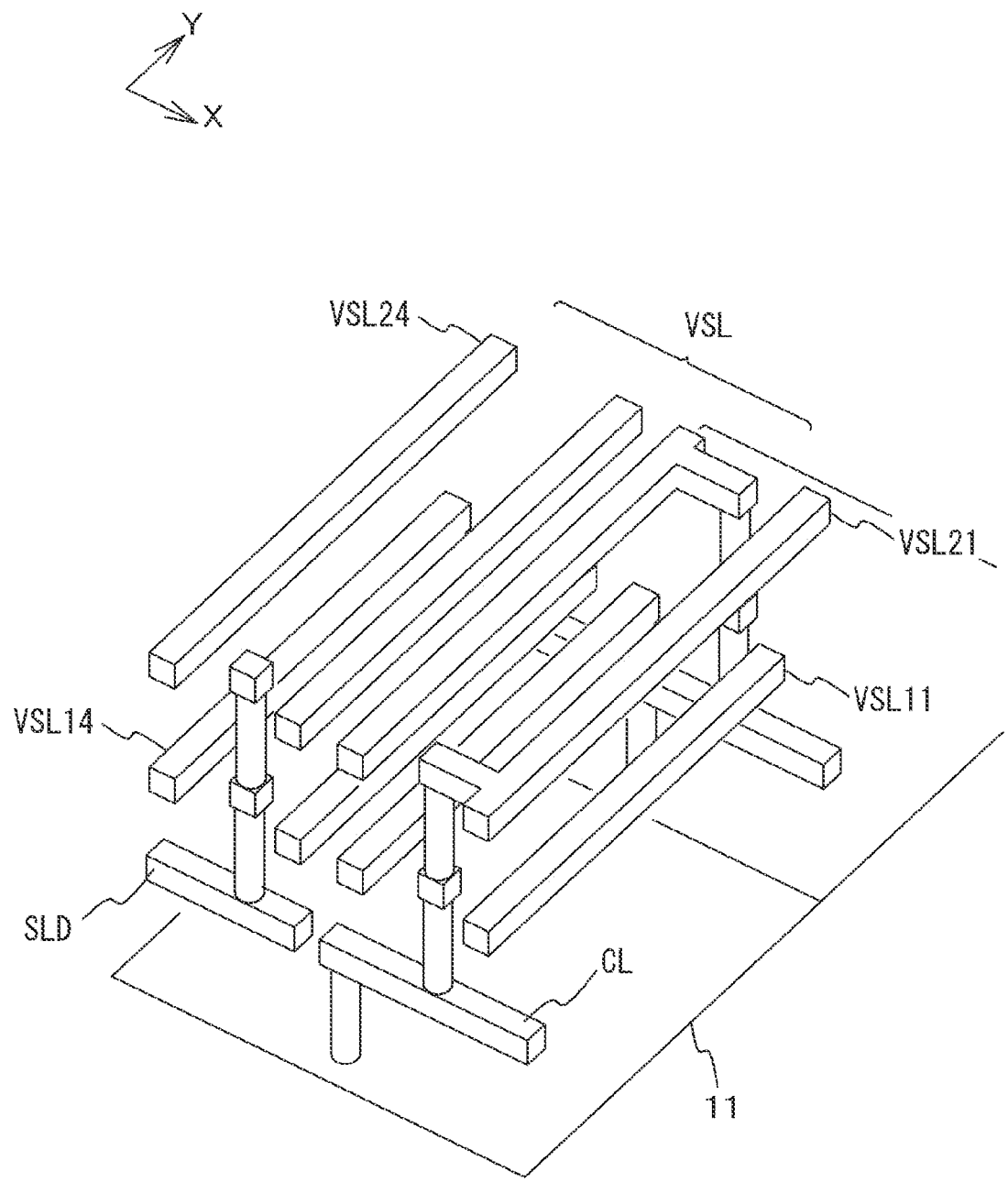
FIG. 39 is a schematic perspective view for describing the connection relationship between vertical signal lines in wiring layers and pixels used in an image sensor according to a sixth embodiment.
Figure 40:
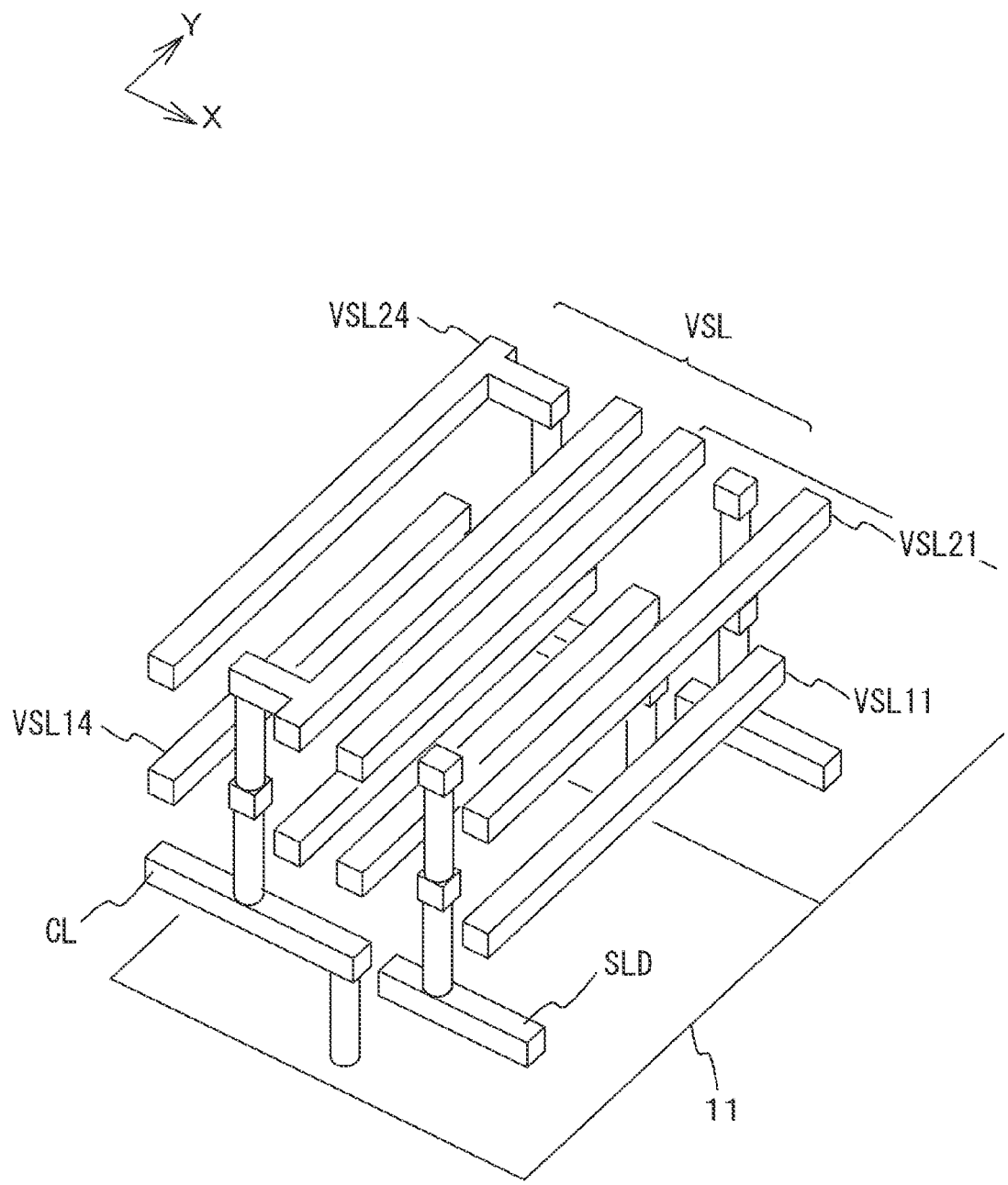
FIG. 40 is a schematic perspective view for describing the connection relationship between vertical signal lines in wiring layers and pixels used in an image sensor according to the sixth embodiment, similar to FIG. 39.

FIG. 39 is a schematic perspective view for describing the connection relationship between vertical signal lines in wiring layers and pixels used in the image sensor according to the sixth embodiment. FIG. 40 is a schematic perspective view for describing the connection relationship between vertical signal lines in wiring layers and pixels, similar to FIG. 39.

FIG. 39 shows the connection relationship in a range in which vertical signal lines VSL11, VSL12, VSL21, and VSL22 shown in FIG. 37 can be connected. A relay line CL is arranged so as to cross only the above-mentioned four vertical signal lines. Assuming that the four signal lines described above are sequentially connected to the pixel 11, the shape of the relay line CL is the same in four consecutive pixels 11. Reference sign SLD indicates a shield wiring extending along the same line as the relay line CL and applied with a predetermined fixed voltage.

Additionally, FIG. 40 shows the connection relationship in a range in which vertical signal lines VSL13, VSL14, VSL23, and VSL24 shown in FIG. 37 can be connected. A relay line CL is arranged so as to cross only the above-mentioned four vertical signal lines. Assuming that the four signal lines described above are sequentially connected to the pixel 11, the shape of the relay line CL is the same in four consecutive pixels 11. Reference sign SLD indicates a shield wiring extending along the same line as the relay line CL and applied with a predetermined fixed voltage.

Although the present disclosure has been described above on the basis of the preferred embodiments, the present disclosure is not limited to these embodiments. The configuration and structure of the image sensor described in each of the above embodiments are examples, and can be changed as appropriate.

The present disclosure enables unhindered electrical connection between a vertical signal line and a pixel even if the vertical signal lines are arranged so that their orthogonal projections overlap in multiple wiring layers. Accordingly, since the number of vertical signal lines can be increased efficiently, the frame rate of the image sensor can be increased.

Application Example

The technology according to the present disclosure can be applied to various products. For example, the technology according to the present disclosure may be implemented as a device mounted on any type of movable bodies including a car, an electric car, a hybrid electric car, a motorcycle, a bicycle, a personal mobility, an airplane, a drone, a ship, a robot, a construction machine, an agricultural machine (tractor), and the like.

Figure 41:
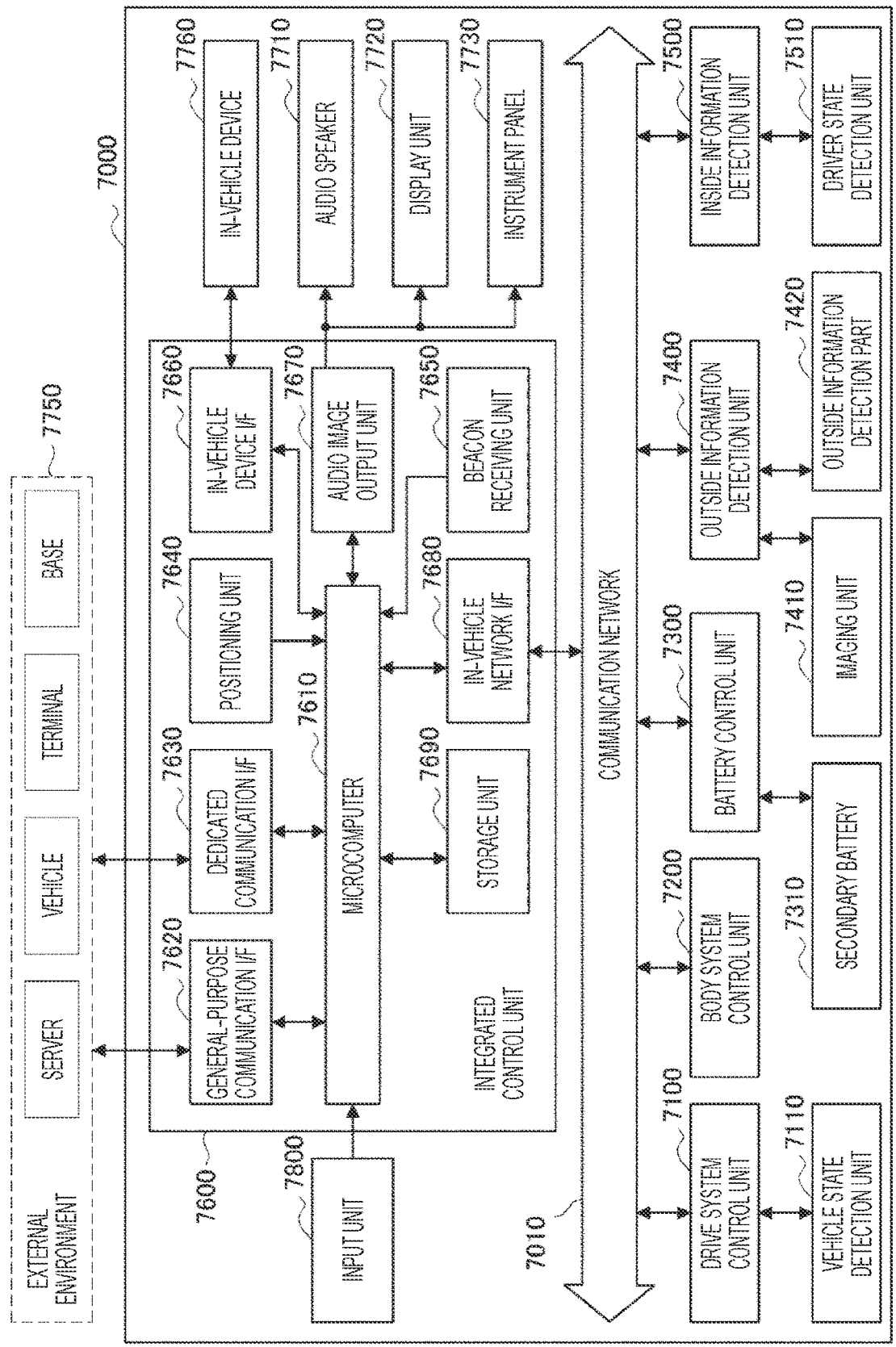
FIG. 41 is a block diagram showing an example of a schematic configuration of a vehicle control system.

FIG. 41 is a block diagram showing a schematic configuration example of a vehicle control system 7000 which is an example of a mobile control system to which the technology according to the present disclosure can be applied. The vehicle control system 7000 includes multiple electronic control units connected through a communication network 7010. In the example shown in FIG. 41, the vehicle control system 7000 includes a drive system control unit 7100, a body system control unit 7200, a battery control unit 7300, an outside information detection unit 7400, an inside information detection unit 7500, and an integrated control unit 7600. The communication network 7010 connecting the multiple control units may be an on-vehicle communication network compliant with an arbitrary standard such as controller area network (CAN), local interconnect network (LIN), local area network (LAN), and FlexRay (registered trademark), for example.

Each control unit includes a microcomputer that performs arithmetic processing according to various programs, a storage unit that stores a program executed by the microcomputer or parameters used for various arithmetic operations, and a drive circuit that drives various devices to be controlled. Each control unit includes a network I/F for communicating with other control units through the communication network 7010, and a communication I/F for communicating with devices, sensors, or the like inside or outside the vehicle by wired communication or wireless communication. In FIG. 41, as the functional configuration of the integrated control unit 7600, a microcomputer 7610, a general-purpose communication I/F 7620, a dedicated communication I/F 7630, a positioning unit 7640, a beacon receiving unit 7650, an in-vehicle device I/F 7660, an audio image output unit 7670, an in-vehicle network I/F 7680, and a storage unit 7690 are illustrated. The other control units similarly include a microcomputer, a communication I/F, a storage unit, and the like.

The drive system control unit 7100 controls the operation of devices related to the drive system of the vehicle according to various programs. For example, the drive system control unit 7100 functions as a controller of a drive force generation device for generating a drive force of a vehicle such as an internal combustion engine or a drive motor, a drive force transmission mechanism for transmitting the drive force to wheels, a steering mechanism that adjusts the steering angle of the vehicle, a braking device that generates a braking force of the vehicle, and the like. The drive system control unit 7100 may have a function as a controller such as an antilock brake system (ABS) or an electronic stability control (ESC).

A vehicle state detection unit 7110 is connected to the drive system control unit 7100. The vehicle state detection unit 7110 includes, for example, at least one of a gyro sensor that detects the angular velocity of the shaft rotational movement of the vehicle body, an acceleration sensor that detects the acceleration of the vehicle, or a sensor for detecting an accelerator pedal operation amount, a brake pedal operation amount, a steering wheel steering angle, an engine speed, a wheel rotation speed, or the like. The drive system control unit 7100 performs arithmetic processing using a signal input from the vehicle state detection unit 7110 to control an internal combustion engine, a drive motor, an electric power steering device, a brake device, or the like.

The body system control unit 7200 controls the operation of various devices equipped on the vehicle body according to various programs. For example, the body system control unit 7200 functions as a controller of a keyless entry system, a smart key system, a power window device, or various lamps such as a headlamp, a back lamp, a brake lamp, a blinker, or a fog lamp. In this case, the body system control unit 7200 may receive input of radio waves transmitted from a portable device substituting for a key or signals of various switches. The body system control unit 7200 receives input of these radio waves or signals, and controls a door lock device, a power window device, a lamp, and the like of the vehicle.

The battery control unit 7300 controls a secondary battery 7310 that is the power supply source of the drive motor according to various programs. For example, the battery control unit 7300 receives input of information such as the battery temperature, the battery output voltage, or the remaining capacity of the battery from a battery device including the secondary battery 7310. The battery control unit 7300 performs arithmetic processing using these signals to control the temperature adjustment of the secondary battery 7310 or control a cooling device or the like provided in the battery device.

The outside information detection unit 7400 detects information outside the vehicle equipped with the vehicle control system 7000. For example, at least one of an imaging unit 7410 or an outside information detection part 7420 is connected to the outside information detection unit 7400. The imaging unit 7410 includes at least one of a time of flight (ToF) camera, a stereo camera, a monocular camera, an infrared camera, or other cameras. The outside information detection part 7420 includes at least one of an environment sensor for detecting the current weather, or an ambient information detection sensor for detecting another vehicle, an obstacle, a pedestrian, or the like around the vehicle equipped with the vehicle control system 7000, for example.

The environment sensor may be at least one of a raindrop sensor that detects rainy weather, a fog sensor that detects fog, a sunshine sensor that detects the degree of sunshine, or a snow sensor that detects snowfall, for example. The ambient information detection sensor may be at least one of an ultrasonic sensor, a radar device, or a light detection and ranging or laser imaging detection and ranging (LIDAR) device. The imaging unit 7410 and the outside information detection part 7420 may be provided as independent sensors or devices, or may be provided as a device in which multiple sensors or devices are integrated.

Figure 42:
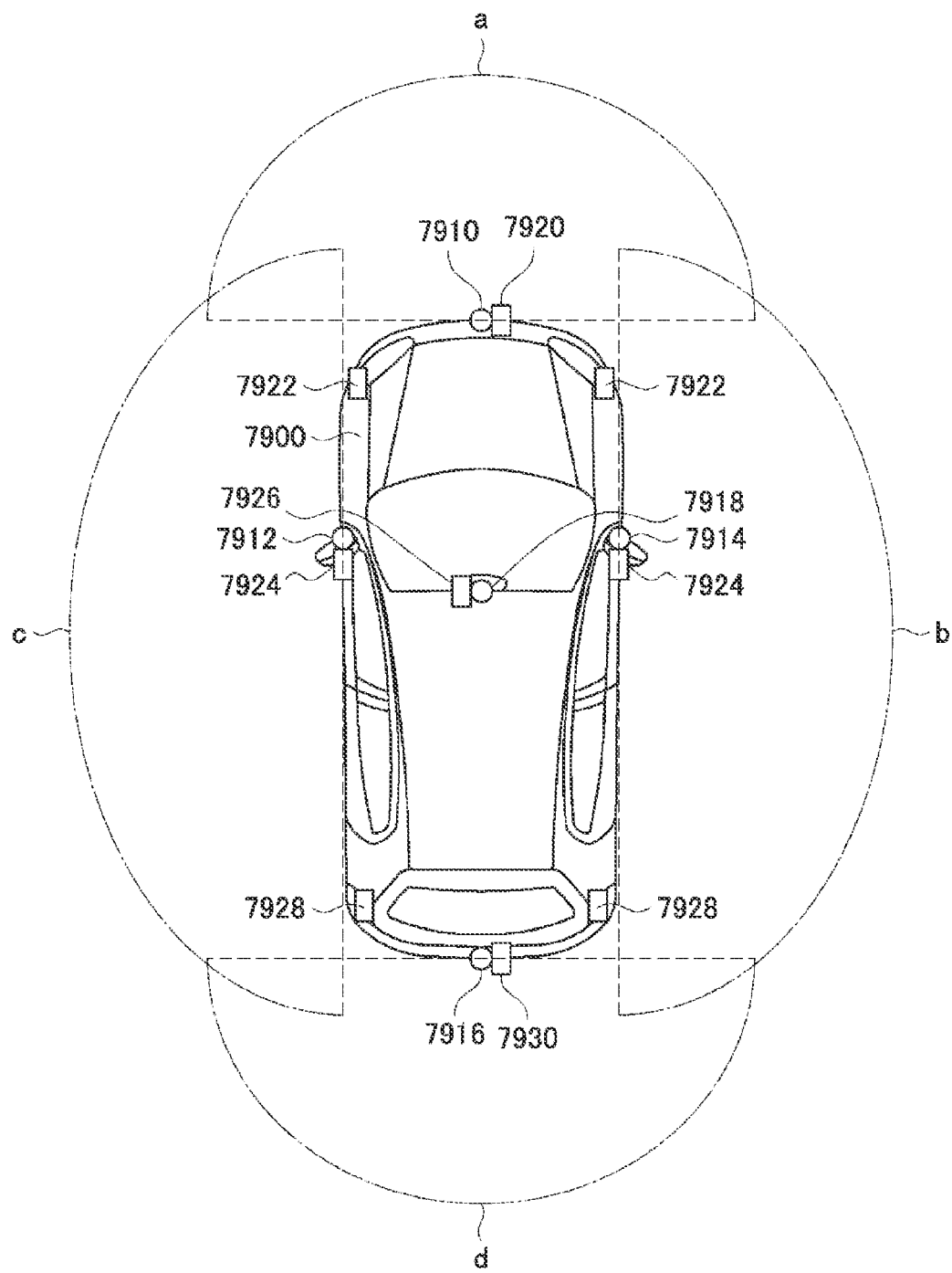
FIG. 42 is an explanatory diagram showing an example of installation positions of an outside information detection unit and an imaging unit.

Here, FIG. 42 shows an example of the installation positions of the imaging unit 7410 and the outside information detection part 7420. For example, imaging units 7910, 7912, 7914, 7916, and 7918 are provided in at least one of positions of a front nose, a side mirror, a rear bumper, a back door, or an upper portion of a windshield in the vehicle interior of a vehicle 7900. The imaging unit 7910 provided on the front nose and the imaging unit 7918 provided on the upper portion of the windshield in the vehicle interior mainly acquire images of the front of the vehicle 7900. The imaging units 7912 and 7914 provided on the side mirrors mainly acquire images of the sides of the vehicle 7900. The imaging unit 7916 provided on the rear bumper or the back door mainly acquires an image of the rear of the vehicle 7900. The imaging unit 7918 provided on the upper portion of the windshield in the vehicle interior is mainly used to detect a preceding vehicle, or a pedestrian, an obstacle, a traffic light, a traffic sign, a lane, or the like.

Note that FIG. 42 shows an example of the imaging ranges of the imaging units 7910, 7912, 7914, and 7916. An imaging range a indicates the imaging range of the imaging unit 7910 provided on the front nose, imaging ranges b and c indicate the imaging ranges of the imaging units 7912 and 7914 provided on the side mirrors, respectively, and an imaging range d indicates the imaging range of the imaging unit 7916 provided on the rear bumper or the back door. For example, by superimposing the pieces of image data captured by the imaging units 7910, 7912, 7914, and 7916, a bird's eye view image of the vehicle 7900 as viewed from above can be obtained.

Outside information detection parts 7920, 7922, 7924, 7926, 7928, and 7930 provided on the front, rear, sides, corners, and the upper portion of the windshield in the vehicle interior of the vehicle 7900 may be ultrasonic sensors or radar devices, for example. The outside information detection parts 7920, 7926, and 7930 provided on the front nose, the rear bumper, the back door, and the upper portion of the windshield in the vehicle interior of the vehicle 7900 may be LIDAR devices, for example. These outside information detection parts 7920 to 7930 are mainly used for detecting a preceding vehicle, a pedestrian, an obstacle, or the like.

Returning to FIG. 41, the description will be continued. The outside information detection unit 7400 causes the imaging unit 7410 to capture an image of the outside of the vehicle, and receives the captured image data. Additionally, the outside information detection unit 7400 also receives detection information from the outside information detection part 7420 connected thereto. In a case where the outside information detection part 7420 is an ultrasonic sensor, a radar device, or a LIDAR device, the outside information detection unit 7400 causes transmission of ultrasonic waves, electromagnetic waves, or the like, and receives information on the received reflected waves. The outside information detection unit 7400 may perform object detection processing or distance detection processing of a person, a vehicle, an obstacle, a sign, characters on a road surface, or the like on the basis of the received information. The outside information detection unit 7400 may perform environment recognition processing for recognizing rainfall, fog, road surface conditions, or the like on the basis of the received information. The outside information detection unit 7400 may calculate the distance to the object outside the vehicle on the basis of the received information.

Additionally, the outside information detection unit 7400 may perform image recognition processing of recognizing a person, a vehicle, an obstacle, a sign, characters on a road surface, or the like, or distance detection processing, on the basis of the received image data. The outside information detection unit 7400 may perform processing such as distortion correction or position adjustment on the received image data, combine image data captured by different imaging units 7410, and generate a bird's eye view image or a panoramic image. The outside information detection unit 7400 may perform viewpoint conversion processing using image data captured by different imaging units 7410.

The inside information detection unit 7500 detects information inside the vehicle. For example, a driver state detection unit 7510 that detects a state of a driver is connected to the inside information detection unit 7500. The driver state detection unit 7510 may include a camera that images the driver, a biometric sensor that detects biometric information of the driver, a microphone that collects voice in the vehicle interior, and the like. For example, the biometric sensor is provided on a seat surface, a steering wheel, or the like, and detects biometric information of an occupant sitting in a seat or a driver who grips the steering wheel. The inside information detection unit 7500 may calculate the degree of fatigue or concentration of the driver or determine whether or not the driver is asleep, on the basis of detection information input from the driver state detection unit 7510. The inside information detection unit 7500 may perform processing such as noise canceling processing on the collected audio signal.

The integrated control unit 7600 controls overall operations in the vehicle control system 7000 according to various programs. An input unit 7800 is connected to the integrated control unit 7600. The input unit 7800 is implemented by a device such as a touch panel, a button, a microphone, a switch, or a lever on which an occupant can perform input operation, for example. The integrated control unit 7600 may receive input of data obtained by voice recognition of voice input by a microphone. The input unit 7800 may be a remote control device using infrared rays or other radio waves, or an external connection device such as a mobile phone or a personal digital assistant (PDA) compatible with the operation of the vehicle control system 7000, for example. The input unit 7800 may be a camera, for example, in which case the occupant can input information by gesture. Alternatively, data obtained by detecting the movement of a wearable device worn by the occupant may be input. Moreover, the input unit 7800 may include an input control circuit or the like that generates an input signal on the basis of information input by the occupant or the like using the above input unit 7800, and outputs the input signal to the integrated control unit 7600, for example. By operating the input unit 7800, the occupant or the like inputs various data or gives an instruction on a processing operation to the vehicle control system 7000.

The storage unit 7690 may include a read only memory (ROM) that stores various programs executed by the microcomputer, and a random access memory (RAM) that stores various parameters, calculation results, sensor values, or the like. Additionally, the storage unit 7690 may be implemented by a magnetic storage device such as a hard disk drive (HDD), a semiconductor storage device, an optical storage device, a magneto-optical storage device, or the like.

The general-purpose communication I/F 7620 is a general-purpose communication I/F that mediates communication with various devices existing in an external environment 7750. The general-purpose communication I/F 7620 may implement a cellular communication protocol such as global system of mobile communications (GSM) (registered trademark), WiMAX, long term evolution (LTE), or LTE-advanced (LTE-A), or another wireless communication protocol such as wireless LAN (also referred to as Wi-Fi (registered trademark)) or Bluetooth (registered trademark). For example, the general-purpose communication I/F 7620 may connect to a device (e.g., application server or control server) existing in an external network (e.g., Internet, cloud network, or network unique to business operator) through a base station or an access point. Additionally, for example, the general-purpose communication I/F 7620 may connect with a terminal (e.g., terminal of driver, pedestrian, or store, or machine type communication (MTC) terminal) existing in the vicinity of the vehicle by using the peer to peer (P2P) technology.

The dedicated communication I/F 7630 is a communication I/F that supports a communication protocol designed for use in a vehicle. The dedicated communication I/F 7630 may implement wireless access in vehicle environment (WAVE), which is a combination of the lower layer IEEE802.11p and the upper layer IEEE1609, dedicated short range communications (DSRC), or a standard protocol such as a cellular communication protocol, for example. The dedicated communication I/F 7630 performs V2X communication, which is a concept that typically includes one or more of vehicle to vehicle communication, vehicle to infrastructure communication, vehicle to home communication, and vehicle to pedestrian communication.

For example, the positioning unit 7640 receives a global navigation satellite system (GNSS) signal from a GNSS satellite (e.g., global positioning system (GPS) signal from GPS satellite) to perform positioning and generate position information including the latitude, longitude, and altitude of the vehicle. Note that the positioning unit 7640 may specify the current position by exchanging signals with a wireless access point, or may acquire position information from a terminal such as a mobile phone, a PHS, or a smartphone having a positioning function.

The beacon receiving unit 7650 receives radio waves or electromagnetic waves transmitted from a radio station or the like installed on the road, and acquires information such as current location, traffic congestion, traffic restrictions, or required time, for example. Note that the function of the beacon receiving unit 7650 may be included in dedicated communication I/F 7630 described above.

The in-vehicle device I/F 7660 is a communication interface that mediates connection between the microcomputer 7610 and various in-vehicle devices 7760 existing in the vehicle. The in-vehicle device I/F 7660 may establish a wireless connection using a wireless communication protocol such as wireless LAN, Bluetooth (registered trademark), near field communication (NFC), or Wireless USB (WUSB). Additionally, the in-vehicle device I/F 7660 may establish a wired connection such as universal serial bus (USB), high-definition multimedia interface (HDMI) (registered trademark), mobile high-definition link (MHL), or the like through a connection terminal (and, if necessary, a cable) not shown. The in-vehicle device 7760 may include at least one of a mobile device or a wearable device that an occupant owns, or an information device that is carried in or attached to the vehicle, for example. Additionally, the in-vehicle device 7760 may include a navigation device that searches for a route to an arbitrary destination. The in-vehicle device I/F 7660 exchanges control signals or data signals with these in-vehicle devices 7760.

The in-vehicle network I/F 7680 is an interface that mediates communication between the microcomputer 7610 and the communication network 7010. The in-vehicle network I/F 7680 transmits and receives signals and the like according to a predetermined protocol supported by the communication network 7010.

The microcomputer 7610 of the integrated control unit 7600 controls the vehicle control system 7000 according to various programs, on the basis of information acquired through at least one of the general-purpose communication I/F 7620, the dedicated communication I/F 7630, the positioning unit 7640, the beacon receiving unit 7650, the in-vehicle device I/F 7660, or the in-vehicle network I/F 7680. For example, the microcomputer 7610 may calculate a control target value of the drive force generation device, the steering mechanism, or the braking device on the basis of acquired information on the inside and outside of the vehicle, and output a control command to the drive system control unit 7100. For example, the microcomputer 7610 can perform coordinated control aimed to achieve functions of an advanced driver assistance system (ADAS) including collision avoidance or shock mitigation of a vehicle, follow-up traveling based on an inter-vehicle distance, vehicle speed maintenance traveling, vehicle collision warning, vehicle lane departure warning, or the like. Additionally, the microcomputer 7610 may control the drive force generation device, the steering mechanism, the braking device, or the like on the basis of acquired information on the surrounding of the vehicle, to perform coordinated control aimed for automatic driving of traveling autonomously without depending on the driver's operation, for example.

The microcomputer 7610 may generate, on the basis of information acquired through at least one of the general-purpose communication I/F 7620, the dedicated communication I/F 7630, the positioning unit 7640, the beacon receiving unit 7650, the in-vehicle device I/F 7660, or the in-vehicle network I/F 7680, three-dimensional distance information between the vehicle and surrounding objects such as structures and persons, and create local map information including peripheral information of the current position of the vehicle. Additionally, the microcomputer 7610 may predict a risk of a vehicle collision, proximity of a pedestrian or the like, entry into a closed road, or the like on the basis of the acquired information, and generate a warning signal. The warning signal may be a signal for sounding a warning sound or lighting a warning lamp, for example.

The audio image output unit 7670 transmits an output signal of at least one of audio or an image to an output device capable of visually or aurally giving notification of information to an occupant or the outside of the vehicle. In the example of FIG. 41, an audio speaker 7710, a display unit 7720, and an instrument panel 7730 are shown as examples of the output device. The display unit 7720 may include at least one of an onboard display or a head-up display, for example. The display unit 7720 may have an augmented reality (AR) display function. The output device may be a device other than these devices, such as headphones, a wearable device such as a glasses-type display worn by an occupant, a projector, or a lamp. In a case where the output device is a display device, the display device visually displays results obtained by various processing performed by the microcomputer 7610 or information received from another control unit in various formats such as text, images, tables, and graphs. Additionally, in a case where the output device is a voice output device, the voice output device converts an audio signal including reproduced voice data, acoustic data, or the like into an analog signal and outputs the analog signal in an auditory manner.

Note that, in the example shown in FIG. 41, at least two control units connected through the communication network 7010 may be integrated as one control unit. Alternatively, each control unit may include multiple control units. Moreover, the vehicle control system 7000 may include another control unit not shown. Additionally, in the above description, some or all of the functions of any control unit may be given to another control unit. That is, as long as information is transmitted and received through the communication network 7010, the predetermined arithmetic processing may be performed by any control unit. Similarly, a sensor or device connected to one of the control units may be connected to another control unit, and multiple control units may transmit and receive detection information to and from each other through the communication network 7010.

Of the configurations described above, the technology according to the present disclosure is applicable to the imaging unit of the outside information detection unit, for example.

Note that the technology of the present disclosure can also be configured in the following manner.

[A1]

An image sensor including:

a pixel array unit in which pixels are arranged in a matrix; and multiple vertical signal lines provided in pixel column units, in which the multiple vertical signal lines provided in pixel column units are arranged in multiple wiring layers laminated on the pixel, and are arranged so that orthogonal projections of the vertical signal lines on the multiple wiring layers overlap, the wiring layer is provided with a connection portion for connecting the vertical signal line corresponding to the pixel to the pixel, and a pixel signal is taken out from the vertical signal line through the connection portion.

[A2]

The image sensor according to the above [A1], in which a via connected to the vertical signal line is provided as the connection portion in the wiring layer, and the pixel signal is taken out from the vertical signal line through the via.

[A3]

The image sensor according to the above [A2], in which in some of the wiring layers among the multiple laminated wiring layers, a relay line extending in a direction orthogonal to a direction in which the vertical signal line extends is arranged, as the connection portion, for each pixel, and the pixel signal is taken out from the vertical signal line through the via and the relay line.

[A4]

The image sensor according to the above [A3], in which in a wiring layer adjacent to the pixel among the multiple laminated wiring layers, the relay line extending in the direction orthogonal to the direction in which the vertical signal line extends is arranged, as the connection portion, for each pixel while being connected to the pixel.

[A5]

The image sensor according to the above [A4], in which in the wiring layer adjacent to the pixel among the multiple laminated wiring layers, the relay line is arranged so as to cross only the vertical signal line in a range that can be related to the connection.

[A6]

The image sensor according to the above [A5] further including, in the wiring layer adjacent to the pixel among the multiple laminated wiring layers, a shield wiring that is arranged so as to cross only the vertical signal line in a range that cannot be related to the connection, extends along the same line as the relay line, and is applied with a predetermined fixed voltage.

[A7]

The image sensor according to any one of the above [A3] to [A6], in which the wiring layer in which the relay line is arranged is provided for connection with the vertical signal line in one of an upper wiring layer and a lower wiring layer which are laminated adjacent to the wiring layer in which the relay line is arranged.

[A8]

The image sensor according to any one of the above [A3] to [A6], in which the wiring layer in which the relay line is arranged is provided for connection with the vertical signal lines in an upper wiring layer and a lower wiring layer which are laminated adjacent to the wiring layer in which the relay line is arranged.

[A9]

The image sensor according to the above [A8], in which the vertical signal lines in the upper wiring layer and the lower wiring layer are arranged so that the orthogonal projections of the vertical signal lines on the wiring layers do not overlap.

[B1]

An imaging device including an image sensor including:

a pixel array unit in which pixels are arranged in a matrix; and multiple vertical signal lines provided in pixel column units, in which the multiple vertical signal lines provided in pixel column units are arranged in multiple wiring layers laminated on the pixel, and are arranged so that orthogonal projections of the vertical signal lines on the multiple wiring layers overlap, the wiring layer is provided with a connection portion for connecting the vertical signal line corresponding to the pixel to the pixel, and a pixel signal is taken out from the vertical signal line through the connection portion.

[B2]

The imaging device according to the above [B1], in which a via connected to the vertical signal line is provided as the connection portion in the wiring layer, and the pixel signal is taken out from the vertical signal line through the via.

[B3]

The imaging device according to the above [B2], in which in some of the wiring layers among the multiple laminated wiring layers, a relay line extending in a direction orthogonal to a direction in which the vertical signal line extends is arranged, as the connection portion, for each pixel, and the pixel signal is taken out from the vertical signal line through the via and the relay line.

[B4]

The imaging device according to the above [B3], in which in a wiring layer adjacent to the pixel among the multiple laminated wiring layers, the relay line extending in the direction orthogonal to the direction in which the vertical signal line extends is arranged, as the connection portion, for each pixel while being connected to the pixel.

[B5]

The imaging device according to the above [B4], in which in the wiring layer adjacent to the pixel among the multiple laminated wiring layers, the relay line is arranged so as to cross only the vertical signal line in a range that can be related to the connection.

[B6]

The imaging device according to the above [B5] further including, in the wiring layer adjacent to the pixel among the multiple laminated wiring layers, a shield wiring that is arranged so as to cross only the vertical signal line in a range that cannot be related to the connection, extends along the same line as the relay line, and is applied with a predetermined fixed voltage.

[B7]

The imaging device according to any one of the above [B3] to [B6], in which the wiring layer in which the relay line is arranged is provided for connection with the vertical signal line in one of an upper wiring layer and a lower wiring layer which are laminated adjacent to the wiring layer in which the relay line is arranged.

[B8]
The imaging device according to any one of the above [B3] to [B6], in which
the wiring layer in which the relay line is arranged is provided for connection with the vertical signal lines in an upper wiring layer and a lower wiring layer which are laminated adjacent to the wiring layer in which the relay line is arranged.

[B9]
The imaging device according to the above [B8], in which
the vertical signal lines in the upper wiring layer and the lower wiring layer are arranged so that the orthogonal projections of the vertical signal lines on the wiring layers do not overlap.

[C1]
An electronic device including
an image sensor including:
a pixel array unit in which pixels are arranged in a matrix; and
multiple vertical signal lines provided in pixel column units, in which
the multiple vertical signal lines provided in pixel column units are arranged in multiple wiring layers laminated on the pixel, and are arranged so that orthogonal projections of the vertical signal lines on the multiple wiring layers overlap,
the wiring layer is provided with a connection portion for connecting the vertical signal line corresponding to the pixel to the pixel, and
a pixel signal is taken out from the vertical signal line through the connection portion.

[C2]
The electronic device according to the above [C1], in which
a via connected to the vertical signal line is provided as the connection portion in the wiring layer, and
the pixel signal is taken out from the vertical signal line through the via.

[C3]
The electronic device according to the above [C2], in which
in some of the wiring layers among the multiple laminated wiring layers, a relay line extending in a direction orthogonal to a direction in which the vertical signal line extends is arranged, as the connection portion, for each pixel, and
the pixel signal is taken out from the vertical signal line through the via and the relay line.

[C4]
The electronic device according to the above [C3], in which
in a wiring layer adjacent to the pixel among the multiple laminated wiring layers, the relay line extending in the direction orthogonal to the direction in which the vertical signal line extends is arranged, as the connection portion, for each pixel while being connected to the pixel.

[C5]
The electronic device according to the above [C4], in which
in the wiring layer adjacent to the pixel among the multiple laminated wiring layers, the relay line is arranged so as to cross only the vertical signal line in a range that can be related to the connection.

[C6]
The electronic device according to the above [C5] further including,
in the wiring layer adjacent to the pixel among the multiple laminated wiring layers, a shield wiring that is arranged so as to cross only the vertical signal line in a range that cannot be related to the connection, extends along the same line as the relay line, and is applied with a predetermined fixed voltage.

[C7]
The electronic device according to any one of the above [C3] to [C6], in which
the wiring layer in which the relay line is arranged is provided for connection with the vertical signal line in one of an upper wiring layer and a lower wiring layer which are laminated adjacent to the wiring layer in which the relay line is arranged.

[C8]
The electronic device according to any one of the above [C3] to [C6], in which
the wiring layer in which the relay line is arranged is provided for connection with the vertical signal lines in an upper wiring layer and a lower wiring layer which are laminated adjacent to the wiring layer in which the relay line is arranged.

[C9]
The electronic device according to the above [C8], in which
the vertical signal lines in the upper wiring layer and the lower wiring layer are arranged so that the orthogonal projections of the vertical signal lines on the wiring layers do not overlap.

REFERENCE SIGNS LIST

1 Image sensor
10 Pixel array unit
11 Pixel
20 Vertical drive circuit
30 Horizontal drive circuit
40 Signal processing unit
HSL Control line
VSL Vertical signal line
WLA Wiring layer
VIA Via
BR Branch wiring
CL Relay line (first layer)
MCL Relay line (second and subsequent layers)
DET Detour portion of vertical signal line

The invention claimed is:
1. An image sensor, comprising:
a pixel array unit that includes a plurality of pixels in a matrix;
multiple vertical signal lines in a plurality of pixel column units; and
multiple wiring layers on a pixel of the plurality of pixels, wherein
specific wiring layers of the multiple wiring layers include a respective vertical signal line of the multiple vertical signal lines,
orthogonal projections of at least two vertical signal lines of the multiple vertical signal lines on the multiple wiring layers overlap,
a first wiring layer of the multiple wiring layers includes a connection portion to connect a first vertical signal line of the multiple vertical signal lines and the pixel, the first vertical signal line is in a second wiring layer of the multiple wiring layers, the connection portion includes a via and a relay line, the relay line extends in a direction orthogonal to a direction in which the first vertical signal line extends, the first wiring layer is configured to establish connection with the first vertical signal line in the second wiring layer, the second wiring layer is one of upper or lower to the first wiring layer, the second wiring layer is adjacent to the first wiring layer, and the first vertical signal line is configured to output a pixel signal through the via and the relay line.

2. The image sensor according to claim 1, wherein
the first wiring layer is adjacent to the pixel, and
the relay line is connected to the pixel.

3. The image sensor according to claim 2, wherein
the relay line crosses only the first vertical signal line in a first range that is related to a specific connection.

4. The image sensor according to claim 3, further comprising a shield wiring, wherein
the shield wiring crosses only a second vertical signal line of the multiple vertical signal lines in a second range,
the second range is other than the first range related to the specific connection,
the shield wiring extends along the same line as the relay line, and
the shield wiring is applied with a specific fixed voltage.

5. The image sensor according to claim 1, wherein
the first wiring layer is further configured to establish connection with a second vertical signal line of the multiple vertical signal lines,
the second vertical signal line is in a third wiring layer of the multiple wiring layers,
the third wiring layer is other one of the upper or the lower to the first wiring layer, and
the third wiring layer is adjacent to the first wiring layer.

6. The image sensor according to claim 5, wherein
an orthogonal projection of the second vertical signal line is non-overlapping to an orthogonal projection of a third vertical signal line of the multiple vertical signal lines.

7. The image sensor according to claim 1, wherein
a position of the first vertical signal line detours around a via part, and
the via part is disconnected from the pixel.

8. The image sensor according to claim 7, wherein
a set of vertical signal lines of the multiple vertical signal lines in two adjacently laminated wiring layers of the multiple wiring layers have orthogonal projections that are non-overlapping.

9. An image device, comprising:
an image sensor including:
a pixel array unit that includes a plurality of pixels in a matrix;
multiple vertical signal lines in a plurality of pixel column units; and
multiple wiring layers on a pixel of the plurality of pixels, wherein
specific wiring layers of the multiple wiring layers include a respective vertical signal line of the multiple vertical signal lines,
orthogonal projections of at least two vertical signal lines of the multiple vertical signal lines on the multiple wiring layers overlap,
a first wiring layer of the multiple wiring layers includes a connection portion to connect a first vertical signal line of the multiple vertical signal lines and the pixel,
the first vertical signal line is in a second wiring layer of the multiple wiring layers,
the connection portion includes a via and a relay line,
the relay line extends in a direction orthogonal to a direction in which the first vertical signal line extends,
the first wiring layer is configured to establish connection with the first vertical signal line in the second wiring layer,
the second wiring layer is one of upper or lower to the first wiring layer,
the second wiring layer is adjacent to the first wiring layer, and
the first vertical signal line is configured to output a pixel signal through the via and the relay line.

10. An electronic device, comprising:
an image sensor including:
a pixel array unit that includes a plurality of pixels in a matrix;
multiple vertical signal lines in a plurality of pixel column units; and
multiple wiring layers on a pixel of the plurality of pixels, wherein
specific wiring layers of the multiple wiring layers include a respective vertical signal line of the multiple vertical signal lines,
orthogonal projections of at least two vertical signal lines of the multiple vertical signal lines on the multiple wiring layers overlap,
a first wiring layer of the multiple wiring layers includes a connection portion to connect a first vertical signal line of the multiple vertical signal lines and the pixel,
the first vertical signal line is in a second wiring layer of the multiple wiring layers,
the connection portion includes a via and a relay line,
the relay line extends in a direction orthogonal to a direction in which the first vertical signal line extends,
the first wiring layer is configured to establish connection with the first vertical signal line in the second wiring layer,
the second wiring layer is one of upper or lower to the first wiring layer,
the second wiring layer is adjacent to the first wiring layer, and
the first vertical signal line is configured to output a pixel signal through the via and the relay line.

* * * * *